US005689358A

United States Patent [19]
Nakao et al.

[11] Patent Number: 5,689,358
[45] Date of Patent: Nov. 18, 1997

[54] OPTICAL FUNCTIONAL DEVICES AND INTEGRATED OPTICAL DEVICES HAVING A RIDGED MULTI-QUANTUM WELL STRUCTURE

[75] Inventors: Masashi Nakao, Atsugi; Yasuhiro Suzuki, Yokohama; Osamu Mitomi; Kazuo Kasaya, both of Isehara; Junichi Nakano, Atsugi; Kiyoyuki Yokoyama, Isehara, all of Japan

[73] Assignee: Nippon Telegraph and Telephone Corporation, Tokyo, Japan

[21] Appl. No.: 722,802

[22] Filed: Sep. 27, 1996

Related U.S. Application Data

[62] Division of Ser. No. 216,610, Mar. 23, 1994, Pat. No. 5,585,957.

[30] Foreign Application Priority Data

| Mar. 25, 1993 | [JP] | Japan | 5-66525 |
| Mar. 25, 1993 | [JP] | Japan | 5-66527 |
| Mar. 25, 1993 | [JP] | Japan | 5-66844 |
| Mar. 25, 1993 | [JP] | Japan | 5-67032 |

[51] Int. Cl.$^6$ ........................... H01L 27/14
[52] U.S. Cl. ............. 359/248; 359/250; 257/13; 257/14
[58] Field of Search ................ 359/248, 250; 257/13, 14; 385/28, 37, 129, 131

[56] References Cited

U.S. PATENT DOCUMENTS

| 4,647,339 | 3/1987 | Houghton | 359/248 |
| 5,001,521 | 3/1991 | Okuda et al. | 357/4 |
| 5,119,228 | 6/1992 | Fang | 359/245 |
| 5,274,246 | 12/1993 | Hopkins et al. | 359/248 |
| 5,345,092 | 9/1994 | Kurihara | 257/14 |

FOREIGN PATENT DOCUMENTS

| 62-158379 | 7/1987 | Japan. |
| 1-42888 A | 2/1989 | Japan. |
| 2-62090 A | 3/1990 | Japan. |
| 2-196417A | 8/1990 | Japan. |
| 4-43690 A | 2/1992 | Japan. |
| 4-206982 A | 7/1992 | Japan. |
| 4-209583A | 7/1992 | Japan. |
| 4-305991A | 10/1992 | Japan. |
| 4-364084A | 12/1992 | Japan. |
| 5-102607 | 4/1993 | Japan. |

OTHER PUBLICATIONS

Excerpt of "The Institute of Electronics, Information and Communication Engineers," No. OQE 91-93 (1991), with translation.

(List continued on next page.)

*Primary Examiner*—David C. Nelms
*Assistant Examiner*—Vu A. Le
*Attorney, Agent, or Firm*—Finnegan, Henderson, Farabow, Garrett & Dunner, L.L.P.

[57] ABSTRACT

An optical functional device includes a semiconductor substrate, an optical functional layer provided on said semiconductor substrate and selected from the group consisting of a light emitting layer, a light absorbing layer, and an optical waveguide layer. The optical functional layer has a multi-quantum well layer. Preferably, the semiconductor substrate is a nonplanar semiconductor substrate having a ridge and two grooves adjacent said ridge, said ridge having a ridge width of from 1 to 10 μm, a ridge height of from 1 μm to 5 μm, and a gap distance of from 1 μm to 10 μm. Such an optical functional device can be fabricated by growing, on a nonplanar semiconductor substrate having a specified dimension of the ridge, a strained multi-quantum well layer by metalorganic vapor phase epitaxy. Integrated optical device or circuit preferably includes an optical functional device on the nonplanar semiconductor substrate of a specified range of ridge shape factors. An integrated optical device can be fabricated by combination of a plurality of optical functional devices having slightly different compositions and including a part of a strained multi-quantum well layer monolithically grown on a nonplanar semiconductor substrate.

18 Claims, 43 Drawing Sheets

OTHER PUBLICATIONS

Excerpt from Extended Abstracts, The Spring Meeting, 1992, "The Japan Society of Applied Physics," Report No. 30a–Q–2, with translation.

Study Report of Sectional Meeting on Applied Electronic Physical Properties,"The Japan Society of Applied Physics," Oct. 9, 1992, p. 12.

Study Report of Sectional Meeting on Applied Electronic Physical Properties,"The Japan Society of Applied Physics," Oct. 9, 1992, p. 5.

Extended Abstracts (The 40th Spring Meeting, 1993), "The Japan Society of Applied Physics and Related Societies," Mar. 29, 1993 (30a–ZR–10).

Extended Abstracts (The 40th Spring Meeting, 1993), "The Japan Society of Applied Physics and Related Societies," Mar. 29, 1993 (29p–C–16).

Yasuo Nannichi et al., "A Model to Explain the Effective Passivation of the GaAs Surface by $(NH_4)_2S_x$ Treatment," Japanese Journal of Applied Physics, vol. 27, No. 12, Dec., 1988, pp. L2367–L2369.

Takashi Suqino et al., "Defect Passivation of GaAs Surface By Phosphidization," Elsevier Science Publishers, B.V. (1990) pp. 849–853.

Jia–Fa Fan et al., "Marked Reduction of the Surface/Interface States of GaAs by $(NH_4)_2S_x$ Treatment," Japanese Journal of Applied Physics, vol. 28, No. 12, Dec., 1989, pp. L2255–L2257.

C.J. Sindt et al., "Sulfur passivation of GaAs surfaces: A model for reduced surface recombination without band flattening,"Appl. Phys. Lett. 55(16), Oct., 1989, pp. 1653–1655.

J.I. Pankove et al., "Passivation of GaAs Surfaces," Journal of Electronic Materials, vol. 12, No. 2, (1983), pp. 359–370.

Hideki Hasegawa et al., "Unified disorder induced gap state model for insulator–semiconductor and metal–semiconductor interference," J. Vac. Sci. Technol. B4(4), Jul./Aug. 1986 pp. 1130–1138.

Hiromitsu Asai et al., "Energy band–gap shift with elastic strain in $Ga_xIn_{1-x}P$ epitaxial layers on (001) GaAs substrates," J. Appl. Phys. 54(4), Apr. 1983, pp. 2052–2056.

D.J. Olego et al., "Passivation of the GaAs surface by an amorphous phosphorus overlayer," Appl. Phys. Lett 45(10), Nov. 15, 1984, pp. 1127–1129.

Takahisa Ohno et al., "First–principles study of sulfur passivation of GaAs(001) surfaces," The American Physical Society, 1990, pp. 11194–11197.

Takahisa Ohno, "Sulfur passivation of GaAs surfaces," The American Physical Society, 1991, pp. 6306–6311.

Yoshinori Wada et al., "A New Surface Passivation of GaAs Using CVD—Atomic Layer Passivation," The Japan Society of Applied Physics, Aug. 1991, pp. 683–685.

Takahisa Ohno, "Passivation of GaAs(001) surfaces by chalcogen atoms (S, Se and Te)", Surface Science 225, (1991), pp. 229–236.

Takahisa Ohno et al., "AB Initio Calculations on Effect of Ga–S Bonds on Passivation of GaAs Surface—A Proposal for New Surface Treatment," Materials Science Forum, vol. 83–87 (1992), pp. 1403–1408.

Hirohiko Sugahara et al., "Photoemission Analysis of $H_2S$–Treated GaAs Surfaces," PF Activity Report, 1991.

R. Zengerle et al., "Low–Lowss Fibre–Chip Coupling By Buried Laterally Tapered InP/InGaAsP Waveguide Structure," Electronic Letters, Mar. 26, 1992, vol. 28, No. 7, pp. 631–632.

F. Koyama et al., "GaInAs/GaInAsP strained quantum well monolithic electroabsorption modulator/amplifier by lateral bandgap control with nonplanar substrates," Electronics Letters, Nov. 25, 1993, vol. 29, No. 24, pp. 2104–2106.

P. Viktorovitch et al., "Improved electronic properties of GaAs surfaces stabilized with phosphorous," Appl. Phys. Lett. 58(21), May 27, 1991, pp. 2387–2389.

M. Gendry et al., "Improved Electronic Properties of As–Based III–V Compound Semiconductor Surface Stabilized with Phosphorus," IEEE Catalog No. 91CH2950–4, (Apr. 1991), pp. 567–570.

The Institute of Electronics, Information and Communication Engineers, transactions, C–1, vol. J73–J–, No. 5, pp. 360–367, May 1990, with partial translation.

Excerpt from Extended Abstracts, The Autumn Meeting, 1990, of "The Japan Society of Applied Physics," Report No. 26a–SQ–20, with translation.

Excerpt from Extended Abstracts, The Autumn Meeting, 1990, of "The Japan Society of Applied Physics, " Report No. 26a–SA–20, with translation.

Excerpt from Extended Abstracts, The Autumn Sectional, of 1990, Joint Symposium on "Structural Stability, State of Electron, dynamics—For Development of New Techniques," The Japan Society of Physics, with translation.

Excerpt from Extended Abstracts, The Autumn Meeting, 1990, "Applied Physics," Report No. 26 a–SQ–14, with translation.

Excerpt from Extended Abstracts, The 38th Spring Meeting, "The Japan Society of Applied Physics and Related Societies," Report No. 30p–N–14, with translation.

Excerpt from Extended Abstracts, The 38th Spring Meeting, "The Japan Society of Applied Physics and Related Societies," Report No. 30p–N–17, with translation.

Excerpt from Extended Abstracts, The 52nd Autumn Meeting, 1991, "The Japan Society of Applied Physics," Report No. 10p–F–5, with translation.

Excerpt from Text of Training Course on "New Surface Material and Epitaxy," held on Jul. 26, 1991 by The Japan Society of Physics, No. 14, GaAs Surface and Adsorption Layer, with translation.

OPTICAL FUNCTIONAL DEVICES AND INTEGRATED OPTICAL DEVICES HAVING A RIDGED MULTI-QUANTUM WELL STRUCTURE

This is a division of application Ser. No. 08/216,610, filed Mar. 23, 1994 U.S. Pat. No. 5,585,957.

BACKGROUND OF THE INVENTION

1. Field of the Invention

The present invention relates to semiconductor optical functional devices which can be used in the field of optical communication and more particularly to a plurality of optical functional devices which have light emitting or receiving wavelengths that differ slightly one from another. The present invention also relates to methods for producing such devices. Optical functional devices include light emitting devices, light detecting devices, optical waveguides, spot-size converters, wavelength converters, optical couplers, optical splitters, etc. Making the most of their wide band and high directivity, semiconductor light emitting devices can be used widely and are applicable to light sources for optical measurement, integrated light sources, wavelength-tunable light sources, light sources for optical communication, etc. For example, semiconductor light emitting devices are used, in the field of optical communication, as a multi-wavelength integrated light source which allows high density communication in the order of terabit, while in the field of optical measurement, they are useful as light sources for fiber gyros or OTDR (optical time-domain reflectometry).

Further, the present invention relates to semiconductor integrated optical devices which can be used in optical processing such as optical information processing and optical switching and more particularly to an optical integrated device which includes a semiconductor substrate having provided thereon at least one semiconductor device having optical transmitting and receiving functions. The present invention also relates to a method for producing such semiconductor integrated optical devices.

2. Description of Related Art

In coping with increasing sophistication of optical communication systems or methods, there has been progressing investigation on an optical integrated circuit which includes a semiconductor substrate having arranged thereon a plurality of optical functional devices such as a light emitting device, an optical waveguide, and a light detecting device and which enables processing of many optical communication signals at a time en bloc. In order to provide an effective optical integrated circuit, it is of urgent necessity to develop optical functional devices that can process a plurality of optical beams having communication wavelengths which differ slightly one from another. Therefore, there is a keen desire to develop an optical functional device which includes a semiconductor substrate having provided thereon a plurality of light emitting devices having oscillating wavelengths slightly different from each other.

As for the method for varying oscillating wavelengths of light emitting devices, there has been generally used, for example, a method which uses a DFB (distributed feedback) laser diode or a DBR (distributed Bragg reflector) laser diode whose semiconductor multilayer has incorporated therein a plurality of diffraction gratings of various frequencies corresponding to their oscillating wavelengths, respectively. However, this method is disadvantageous in that the variation of wavelength is limited at most to a range of about 100 nm since the range of wavelength in which a single light emitting device can oscillate depends on the oscillating region of the active layer, i.e., gain width, and that the oscillating characteristics of the light emitting device varies depending on the wavelength range.

Also, there has been used a method in which the oscillating wavelength of a semiconductor is varied depending on the temperature by making use of temperature dependence of its bandgap. This method, however, is disadvantageous in that the response of the device is relatively slow, the device is not suited for integration, and the oscillating characteristics of the device other than oscillating wavelength also vary concomitantly.

On the other hand, in order to slightly vary the oscillating wavelength characteristics or wavelength sensitivity characteristics of light emitting devices or detectors, respectively, arranged on a semiconductor substrate two-dimensionally, it is usually necessary to fabricate semiconductor layers having crystal compositions corresponding to respective wavelengths. According to conventional semiconductor growth technologies, a plurality of semiconductor layers having crystal compositions slightly differing from each other have been fabricated on the same semiconductor substrate by repeating growth of a crystal several times.

Several methods have been proposed or tried which grow crystals having different light emitting characteristics on the same substrate. However, none of them is a decisive technology which is superior to the method that involves repeating growth several times.

For example, as the method in which in order to vary wavelengths of a plurality of optical functional devices, the widths of the respective active layers are made different slightly from each other, there can be cited, for example, a method in which there are arranged on a semiconductor substrate stripe masks made of an oxide or nitride film having predetermined widths corresponding to those of active layers or optical waveguides to be fabricated, and crystals are grown between the stripes (usually referred to as "mask selection growth method", cf., e.g., Aoki, et al., Oyo Denshi Bussei Bunkakai Kenkyu Hokoku No. 445, p9–14 (Applied Electronic Physical Property Meeting Study Report No. 445, p9–14).

FIGS. 1A to 1C illustrate the above-mentioned masked selective growth method. FIG. 1A is a perspective view showing a planar semiconductor substrate 1 on which there are formed, for example, two oxide or nitride films 2a in the form of stripes having predetermined dimensions. Wm is a width of each stripe, and Wg is a width of the gap between the two stripes 2a. On the substrate shown in FIG. 1A, there is formed a semiconductor multilayer by crystal growth. FIG. 1B is a perspective view showing the semiconductor substrate of FIG. 1A after the selective crystal growth. As a result of the selective growth, the substrate 1 is provided with a semiconductor multilayer grown on regions other than the masks 2a to form a ridge 3 with a groove or gap 4 on each side thereof. The semiconductor multilayer includes a buffer layer, an active layer or optical waveguide layer 6, a cladding layer 7 and a contact layer 10. FIG. 1C is a graph illustrating an example of characteristics, or relationship between mask width (Wm) and oscillating wavelength (photoluminescence (PL) wavelength), at various gap distances (Wg), of $In_{1-x}Ga_xAs/InGaAsP$ crystal ($\lambda g=1.15$ μm) fabricated by the crystal growth.

The amount of shift of oscillating wavelength increases with an increase in the mask width, Wm, and with a decrease in the mask distance, Wg. This is because the source materials migrate from on the masks into the gap to vary the growth rate. As a result, there occur changes in the thicknesses of various semiconductor layers on the mesa structure, particularly quantum well layers, and the changes give rise to changes in the light emitting characteristics of the resulting semiconductor device.

However, the above-described crystal growth method is inevitably susceptible to influences by the mask such as incorporation of impurities from the mask. Hence, the product of the above method has crystal quality which is not always superior to that of the semiconductor device fabricated without masks. In addition, during the progress of process steps, the masks must be removed after the growth of crystals. This makes the fabrication process complicated.

To obtain a shift of the oscillating wavelength of a light emitting device in the order of about 100 nm, masks to be used must extend about 100 µm in a transverse direction, which makes it difficult to use the above-described selective growth method in the integration of such light emitting devices in a minute region as wide as several µm. When the wavelength is varied largely, the position of the light emitting layer is shifted longitudinally in a direction of the cavity, resulting in deteriorated light coupling.

On the other hand, variation of the oscillating characteristics of a light emitting device by slightly changing the crystal composition of the active layer without using masks has been achieved conventionally by, for example, irradiation of laser beam during the crystal growth utilizing an metalorganic molecular beam epitaxy (MOMBE method) as described in Yamada, et al., Oyo Denshi Bussei Bunkakai Kenkyu Hokoku No. 445, p27–32 (Applied Electronic Physical Property Meeting Study Report No. 445, p27–32). However, this method is disadvantageous in that it must use a special, expensive apparatus, and that it fails to fabricate a plurality of crystals having slightly different compositions in a relatively wide region of the semiconductor device.

There is known a light emitting device which includes a ridged or nonplanar semiconductor substrate on which semiconductor layers are grown. Japanese Patent Application Laying-open No. 4-305991 (1992) describes realization of a plurality of light emitting devices having slightly different oscillating wavelengths by growing, by molecular beam epitaxy (MBE), strained quantum well active layers on a nonplanar semiconductor substrate having a plurality of ridges which differ slightly in width from each other.

However, this method provides a light emitting device which utilizes exciton transition energy of strained quantum wells. When the ridge width of the nonplanar substrate is set to 2 µm, 3 µm, 5 µm, or 8 µm, the oscillating wavelength of the device is varied to 1.52 µm, 1.53 µm, 1.54 µm, or 1.55 µm, respectively. However, the amount of variation is rather small so that the amount of shift of wavelength is not so highly controllable with the change in ridge width alone.

Japanese Patent Application Laying-open No. 4-364084 (1992) discloses a method for fabricating a multiple wavelength laser diode by growing semiconductor layers on a nonplanar semiconductor substrate having ridges of varied widths and distances (gap distances) to vary the thicknesses of the active layers in the ridges, respectively, thereby varying their oscillating wavelengths. On the other hand, Japanese Patent Application Laying-open No. 4-206982 (1992) describes a light emitting device fabricated by growing semiconductor layers by metalorganic vapor phase epitaxy (MOVPE) on a semiconductor substrate having ridges each of which is sandwiched by two types of grooves of different widths. The light emitting device is a so-called window-structure laser diode at each terminal end of which there is formed a semiconductor layer having a large bandgap so that the deterioration of terminal end surfaces can be prevented and higher output can be obtained.

Further, there have been known functional superluminescent diodes which are produced by growing semiconductor layers having different compositions along its length in order to get wide-band light emitting characteristics (Noguchi, et al., Denshi Joho Tsushin Gakkai OQE 91-83 (1991) (The Institute of Electronics, Information and Communication Engineers OQE 91-83 (1991)). The functional superluminescent diode is fabricated by performing crystal growth twice for forming light emitting portions having different compositions. Hence, it is troublesome to perform crystal growths and a special countermeasure is required to make as small as possible a waste growth area existing between the both light emitting portions.

Although it could in principle have been possible to fabricate an emitter having three or more different light emitting regions, a high technology in the aspects of crystal growth and processing process is required to fabricate such a light emitting device. In fact, there have been known few light emitting devices that have three or more semiconductor devices having different compositions integrated in a longitudinal direction.

Conventionally, most of transceivers with terminal optical amplifiers used in optical communication are combinations of individual components such as splitters, LD, PD, etc. There are also those which include optical guides made of quartz or the like material, and laser diodes and photodetectors made of semiconductors, respectively, are connected to each other with solder, for example, or coupled via optical fibers or the like. Further, there are those which have necessary semiconductor parts or components integrated on one semiconductor substrate.

However, the transceivers constructed with the semiconductor components and/or quartz guides as described above have various disadvantages. They tend to have larger sizes since there is needed space for connecting various components or for other reasons, and as a result adjustment becomes troublesome, and a complicated fabrication process becomes necessary, which is not suited for mass production. In addition, their coupling coefficient is insufficient. In the case of integrated semiconductor circuits, semiconductors having various bandgaps must be fabricated on one semiconductor substrate and, hence, a very complicated fabrication process is necessary which involves removal of a part of a once grown crystal and growing again a semiconductor crystal which has a composition different from that of the previously grown crystal, or there is needed high techniques. At present, this monolithic integration techniques cannot be a candidate of techniques which substitute for the above-described hybridizing connection of individual components.

On the other hand, for obtaining more improved optical communication systems and optical information processing systems in view of performance, functionality, and costs, it is an essential technique to integrate semiconductor optical devices. In the integration of semiconductor optical devices, individual semiconductor optical devices are connected to each other through glass optical circuits or optical fibers. Even when a plurality of devices are integrated monolithically on one and the same semiconductor substrate, optical signals are inputted in and outputted from the integrated device through glass optical circuits or optical fibers.

Integration of optical devices, unlike integration of electronic devices, is vulnerable to connection losses upon transmission and receipt of light between the devices. This is mainly because the optical spot size on the side of a semiconductor device is smaller than the optical spot size on the side of a glass optical circuit or an optical fiber. In order to avoid this problem and alleviate allowance for connection, there has been proposed a device which converts relatively small spot size on the side of a semiconductor device to a relatively large spot size on the side of a glass optical circuit or an optical fiber.

In the case where an optical waveguide is used to convert the spot size of an optical device, the core of the optical waveguide must have a structure which varies in a direction of light transmission in at least one physical property selected from thickness, width, and difference in refractive index with respect to the cladding. Usually, semiconductor optical waveguides are fabricated by processing epitaxially grown layers by dry etching or the like technique and performing epitaxial regrowth. Therefore, conversion of the spot size of optical devices using optical waveguides suffers from various problems on production such as complicated process steps, deterioration of interfaces during the processing, and contamination of impurities.

FIG. 2 is a schematic perspective view showing the spot size converter described in ELECTRONICS LETTERS 26 Mar. 1992 Vol. 28, No. 7, p-631 as an example of the current technique. This spot size converter is composed of three portions, a first portion I, a second portion II, and a third portion III. The first portion I includes an optical waveguide having a smaller spot and for optical connection to the chip itself. The second portion II has two tapered layers which convert the spot size. An upper optical waveguide $6_U$ has a width which is decreased linearly toward an end to form a tip end while a lower optical waveguide $6_L$ has a width which is increased linearly toward an end to the same width as an output optical waveguide in the third portion III.

The spot size converter includes a semi-insulating InP wafer $1a$ as a substrate, an InP buffer layer 5 grown on the substrate $1a$ by metalorganic vapor phase epitaxial growth (MOVPE), and two layers epitaxially grown on the buffer layer 5 to provide the upper and lower tapered optical waveguides $6_U$ and $6_L$. The upper and lower layers $6_U$ and $6_L$ are made of InGaAsP's having different bandgaps. These layers are each tapered by dry etching in two steps. On the layers $6_U$ and $6_L$ there is formed an InP layer $7a$ by MOVPE growth.

As described above, the fabrication of this spot size converter requires at least two epitaxial growth steps and at least two etching steps and, hence, its fabrication process is complicated.

SUMMARY OF THE INVENTION

An object of the present invention is to provide an optical functional device, particularly a semiconductor light emitting device which is integrated on a semiconductor substrate having an unevenness pattern (ridges) by crystal growth and which has a wide-band oscillating characteristics.

Another object of the present invention is to provide a monolithically integrated optical device having a plurality of such optical functional devices on a semiconductor substrate.

Still another object of the present invention is to provide a method for fabricating such an optical functional device.

Yet another object of the present invention is to provide a method for fabricating such a monolithically integrated optical device.

Further object of the present invention is to provide a method for selecting an oscillating wavelength of a semiconductor light emitting device.

According to the present invention, there is provided an optical functional device comprising: a semiconductor substrate; an optical functional layer provided on the semiconductor substrate and selected from the group consisting of a light emitting layer, a light absorbing layer, and an optical waveguide layer; the optical functional layer comprising a multi-quantum well layer; and the semiconductor substrate being a nonplanar semiconductor substrate having a ridge and two grooves adjacent the ridge, the ridge having a ridge width of from 1 to 10 µm, a ridge height of from 1 µm to 5 µm, and a gap distance of from 1 µm to 10 µm.

Here, the ridge may have an upper face and a side face; and the ridge may have a diffractive grating on at least one of the upper and side surfaces.

Also, there is provided an optical functional device comprising: a nonplanar semiconductor substrate; a ridge provided on the nonplanar semiconductor substrate, the ridge having an upper face and a side face; an optical functional layer provided on the nonplanar semiconductor substrate and selected from the group consisting of a light emitting layer, a light absorbing layer, and an optical waveguide layer; an active layer formed in the optical functional layer and having a multi-quantum well structure, the active layer having a first portion and a second portion, the first portion being provided above the ridge and the second portion being provided above a portion of the semiconductor substrate other than the ridge; the first portion of the active layer having a composition different from a composition of the second portion of the active layer; and a diffractive grating provided on at least one of the upper face and the side face of the ridge.

Here, the ridge width may be from 1 µm to 5 µm; and the multi-quantum well structure may comprise a monolithic crystal having different compositions in a direction of a cavity; the optical functional device having oscillating or detecting characteristics varying in a direction of the cavity.

The upper face of the ridge may have a diffractive grating whose pitch is varied in accordance with the composition of the crystal above the ridge; the optical functional device having a facet through which light transmits, and emitting a plurality of light beams at single longitudinal mode out of the facet or receiving a light beam or beams having a wavelength or wavelengths shorter than a predetermined wavelength through the facet.

The ridge may have provided therein an optical guide layer.

The ridge width may be from 1 µm to 5 µm; the ridge having a shape whose ridge width, ridge height or gap distance being varied in a transverse direction; the optical functional device having oscillating or detecting characteristics which vary in the transverse direction.

The upper face of the ridge may have a diffractive grating whose pitch is varied in accordance with the composition of the crystal above the ridge; the optical functional device emitting a light beam at single longitudinal mode or receiving a light beam or beams having a wavelength or wavelengths shorter than a predetermined wavelength in a direction parallel to the direction of cavity.

The optical functional layer may be a semiconductor light emitting layer; and the grooves may be formed thereon with a semiconductor thin film layer having a conductivity type different from that of the semiconductor substrate.

The optical functional layer may be a semiconductor light emitting layer; and wherein the ridge on the nonplanar semiconductor substrate has a ridge shape of anti-mesa structure.

The optical functional layer may be a semiconductor light emitting layer; and the nonplanar semiconductor substrate may have formed thereon a semiconductor buffer layer.

Further, there is provided an integrated optical device comprising: a nonplanar semiconductor substrate having a ridge shape; a plurality of optical functional devices arranged on the nonplanar semiconductor substrate and selected from the group consisting of a light emitting device and a detecting device; the plurality of optical functional devices being connected to each other operationally so that characteristics of the plurality of optical functional devices can be combined functionally; the plurality of optical functional devices each comprising a part of a strained multi-quantum well layer formed on the monolithically; at least a part of the plurality of optical functional devices having a composition or respective compositions different in composition from each other.

The nonplanar semiconductor substrate may be provided with a ridge having a ridge width of from 1 to 10 μm, a ridge height of from 1 μm to 5 μm, and a gap distance of from 1 μm to 10 μm.

The ridge may have an upper face and a side face; and the ridge may have a diffractive grating on at least one of the upper and side surfaces.

The diffractive grating may have a period varying in accordance with a position at which the diffractive grating is arranged.

Still further, there is provided an integrated optical device comprising: a nonplanar semiconductor substrate; a ridge provided on the nonplanar semiconductor substrate, the ridge having an upper face and a side face; a light emitting portion provided on the nonplanar semiconductor substrate and including an optical functional device; a detecting portion provided on the nonplanar semiconductor substrate and including an optical device; the light emitting portion and the detecting portion being arranged in parallel to and optically connected each other; a semiconductor optical waveguide optically connected to the light emitting portion and the detecting portion, the optical waveguide including an optical functional device and having a common inputting and outputting portion connected to the optical functional device; the optical functional devices being connected to each other operationally so that characteristics of the optical functional devices can be combined functionally; the optical functional device in the light emitting portion having a light emitting device which emits light having a first wavelength and a detecting device which detects an output of the light emitting device; the optical functional device in the detecting portion having a detecting device which detects the light having the first wavelength, a wavelength filter which absorbs the light having the first wavelength, and a detecting device which detects light having a second wavelength; and the integrated optical device having a function of emitting and detecting two light beams which have different wavelengths and which propagate in the common inputting and outputting portion.

Also, there is provided an integrated optical device comprising: a nonplanar semiconductor substrate; a ridge provided on the nonplanar semiconductor substrate; a light emitting portion which is provided on the nonplanar semiconductor substrate which exhibits a light emitting function and a detecting function; a detecting portion which is provided on the nonplanar semiconductor substrate and which exhibits a detecting function; a semiconductor optical waveguide which is optically connected to the light emitting portion and the detecting portion; the light emitting portion having a light emitting device which emits light having a first wavelength and a reflector having a diffractive grating, the light emitting portion exhibiting a light emitting function and a function of detecting the light having the first wavelength; the detecting portion having a wavelength filter which absorbs light having the first wavelength, and a detecting device which detects light having a second wavelength, the detecting portion exhibiting a function of detecting a wavelength filter which absorbs the light haven; the integrated optical device exhibiting a function of emitting and detecting two light beams which have wavelengths differing from each other and which propagate in the common inputting and outputting portion.

Further, there is provided an optical device comprising: a nonplanar semiconductor substrate; a ridge provided on the nonplanar semiconductor substrate; an optical waveguide provided on the nonplanar semiconductor substrate; a quantum well layer formed on the optical waveguide and having a multi-quantum well structure; the ridge having a dimension varied from one end thereof toward another end thereof so that the quantum well layer has a composition or thickness which is varied form one end toward another end of the optical waveguide and a light wave propagating in the waveguide is converted of its spot size.

Still further, there is provided a method for fabricating an optical functional device having at least one optical functional layer selected from the group consisting of a light emitting layer, an absorbing layer and an optical waveguide layer, comprising the steps of: providing a nonplanar semiconductor substrate having a ridge of which a ridge width is from 1 μm to 10 μm, a ridge height is from 1 μm to 5 μm, and a gap distance is from 1 μm to 10 μm; and growing a strained multi-quantum well layer on the nonplanar semiconductor substrate by metalorganic vapor phase epitaxy.

Here, the method may further comprise the steps of: providing a planar semiconductor substrate; forming a semiconductor protective thin film layer having a composition different from that of the planar semiconductor substrate; and processing the planar substrate having the protective thin film layer to render the planar substrate nonplanar.

Yet further, there is provided a method for controlling optical characteristics of an optical functional device having a semiconductor substrate, at least one optical functional layer selected from the group consisting of a light emitting layer, a detecting layer and an optical waveguide layer, the method comprising the steps of: providing as the semiconductor substrate a nonplanar semiconductor substrate having a ridge of a selected shape of which a ridge width is from 1 μm to 10 μm, a ridge height is from 1 μm to 5 μm, and a gap distance is from 1 μm to 10 μm; and growing a multi-quantum well structure on the nonplanar semiconductor substrate by metalorganic vapor phase epitaxy to form the at least optical functional layer; whereby varying a composition of the multi-quantum well structure formed on the ridge to change optical characteristics hereof.

Here, the optical characteristics may be a bandgap or refractive index of the quantum well structure, and at least one of the ridge width, ridge height and gap distance may be varied from one end toward another end of the waveguide on the ridge.

The optical characteristics may be a light emitting characteristics or detecting characteristics of the optical functional device; and at least one of the ridge width, ridge height and gap distance may be varied in a longitudinal direction, so that the light emitting characteristics or the detecting characteristics of the optical functional device can be varied in a direction of a cavity.

The optical characteristics may be a light emitting characteristics or detecting characteristics of the optical functional device; and at least one of the ridge width, ridge height and gap distance may be varied in a transverse direction to form an array-like optical functional device, so that the light emitting characteristics or the detecting characteristics of the optical functional device can be varied in a transverse direction.

The above and other objects, effects, features and advantages of the present invention will become more apparent from the following description of the embodiment thereof taken in conjunction with the accompanying drawings.

DESCRIPTION OF PREFERRED EMBODIMENTS

According to a basic aspect, the present invention relates to an optical functional device such as an emitter, a detector or the like fabricated based on the phenomenon that the composition of a multi-quantum well layer formed on a nonplanar semiconductor substrate varies depending on the shape of its ridge. Also, the present invention relates to an optical component or device having a portion with such a ridge-shape-dependent composition. Further, the present invention relates to an integrated optical device including a plurality of such optical functional devices which are arranged on a semiconductor substrate and whose characteristics are combined functionally.

According to a first aspect of the present invention, a semiconductor multilayer composed of a strained multi-quantum well (MQW) structure as an active layer is formed by metalorganic vapor phase epitaxy (MOVPE) on a semiconductor substrate provided with at least one ridge whose shape, i.e., ridge width, distance between two adjacent ridges or between a ridge and a side surface of a groove opposing the ridge (gap distance), and ridge height are set to dimensions within predetermined ranges, respectively.

When a semiconductor multilayer of a strained MQW structure is formed by an MOVPE method on a ridged or nonplanar semiconductor substrate of which the ridge width, gap distance and ridge height are set to predetermined values in advance, the speed of migration of component atoms which constitute the semiconductor differ on each crystalline surfaces due to intrinsic nature of crystal growth. As a result, the composition of the strained MQW multilayer on the ridge varies slightly from place to place. Utilizing this phenomenon, there can be fabricated, on a plurality of ridges, a corresponding number of optical functional devices whose active layers have thicknesses and compositions both slightly different from each other so that their oscillating characteristics can be controlled within wide ranges.

Figure 1A:
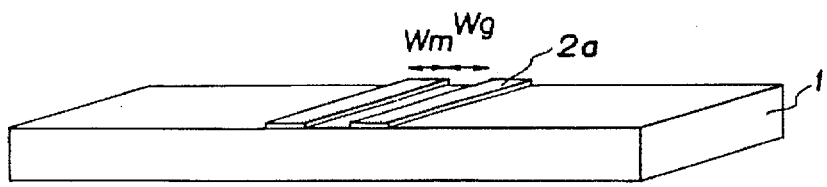
FIG. 1A is a perspective view showing a semiconductor substrate during a process for fabricating a strained quantum well structure by a masked selective growth method.
Figure 1B:
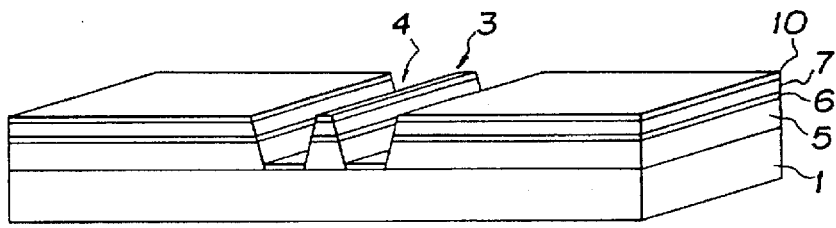
FIG. 1B is a perspective view showing a semiconductor substrate during a process for fabricating a strained quantum well structure by a masked selective growth method.
Figure 1C:
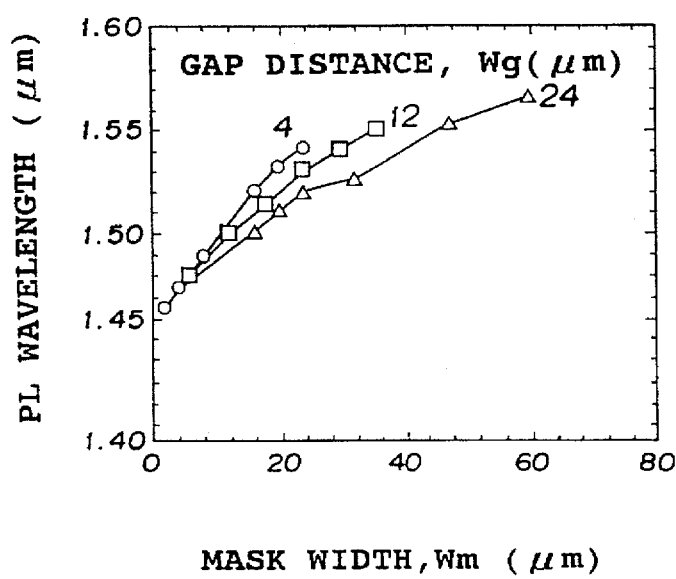
FIG. 1C is a graph illustrating the dependence of oscillating wavelength on mask width at various gap distances.
Figure 2:
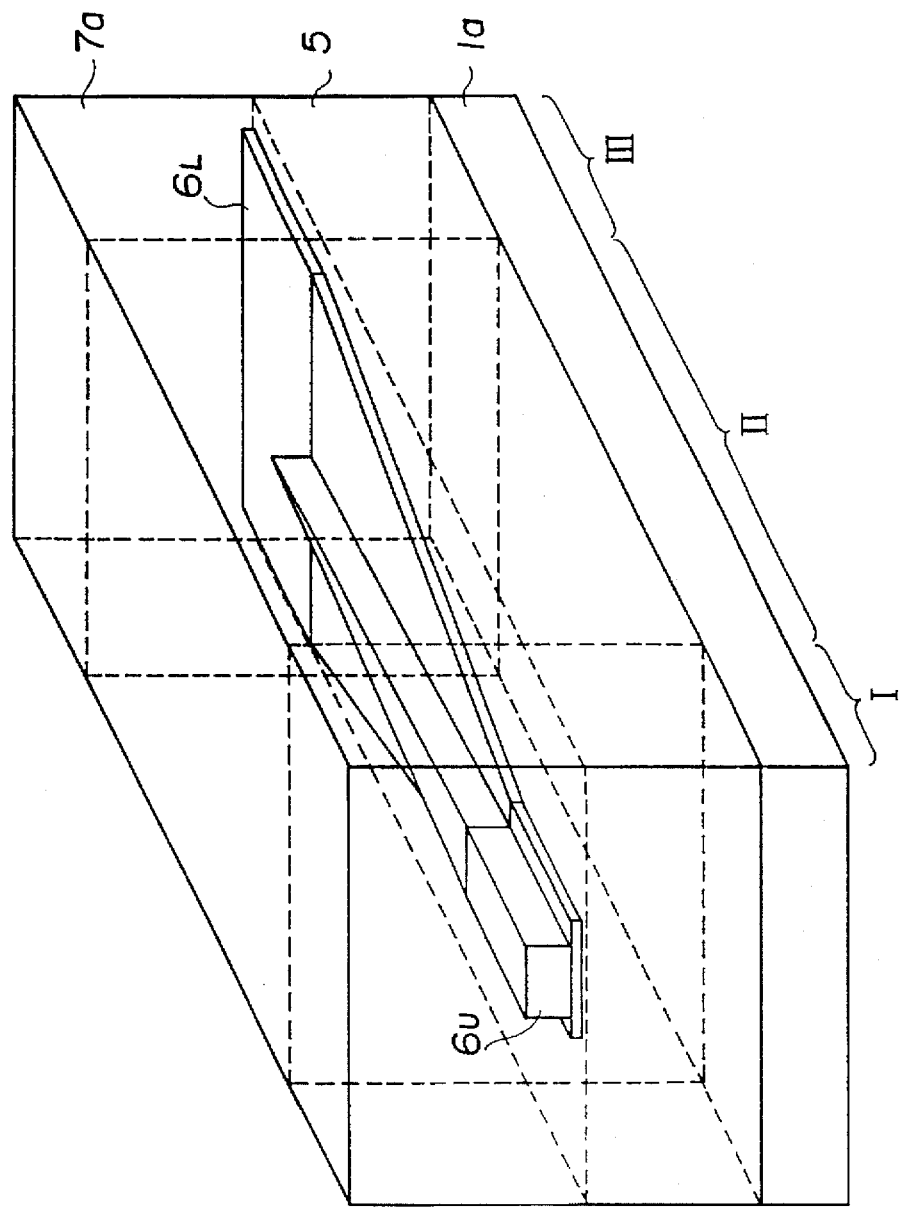
FIG. 2 is a schematic perspective view showing a conventional spot size converter.
Figure 3:
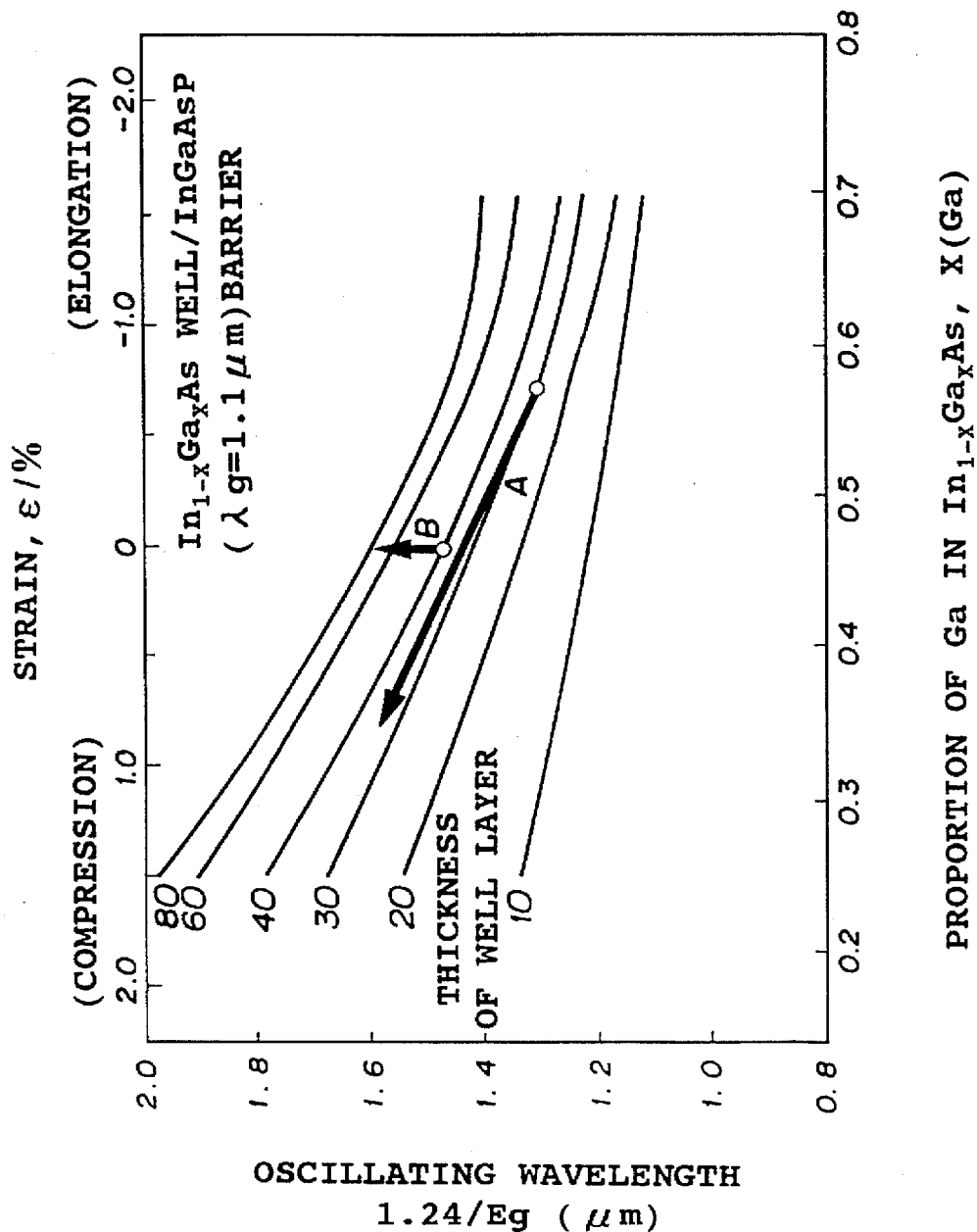
FIG. 3 is a graph illustrating the dependence of oscillating wavelength on composition of a strained quantum well structure at various thicknesses.

In controlling the oscillating characteristics of such an optical functional device, major cause of controllability is attributable to the change in the composition of the MQW layer, particularly when the gap distance is varied. FIG. 3 illustrates results of calculation of oscillating characteristic of an $In_{1-x}Ga_xAs/InGaAsP$ ($\lambda g=1.1$ μm) crystal depending on the content, x, of Ga, with the thickness of the MQW layer being taken as a parameter. Since the change in the thickness of the MQW layer formed by the MOVPE method on the ridge when the gap distance is varied from 1 μm to 10 μm is no greater than 10% regardless of the ridge width, it is believed that the change in oscillating wavelength is attributable mainly to the change in the composition of the MQW structure.

For example, in the case where the MQW is 30 Å, a decrease in the content, x, of Ga of from 0.57 to 0.32 (about 40% decrease), the oscillating wavelength varies from 1.3 μm to 1.55 μm as indicated by an arrow A. The amount of decrease in the content of Ga is considered to be a reasonable variation amount taking into consideration the difference in the speed of migration between In and Ga on the crystal surface, or proportion of the surface on which such a difference between In and Ga unveils to the total crystal growth surface on the ridge.

On the other hand, the conventional masked selective growth method gives rise to change in oscillating wavelength as indicated by an arrow B in FIG. 3, which shows that the change in oscillating wavelength is attributable to the change in the thickness of the MQW layer rather than the change in the composition.

In the above-described case, an optical device which emits light beams of various wavelengths in a wide range from the same output face can be fabricated by growing several kinds of crystals different in composition in a direction of its cavity. It is suitable that the width of grooves formed in the semiconductor substrate be not smaller than 1 μm, preferably within the range of 1 μm to 10 μm, and than the ridge existing between two such grooves have a width of non smaller than 1 μm, preferably within the range of 1 μm to 5 μm, and a height within the range of 1 μm to 5 μm, preferably 1 μm to 3 μm. Preferably, the ridge has an optical waveguide layer therein.

The above-described growth method allows controlling the composition of the active layer by the sizes of gaps and ridges and as a result the oscillating wavelength can be controlled over a wide range of not smaller than 300 nm.

Figure 4A:
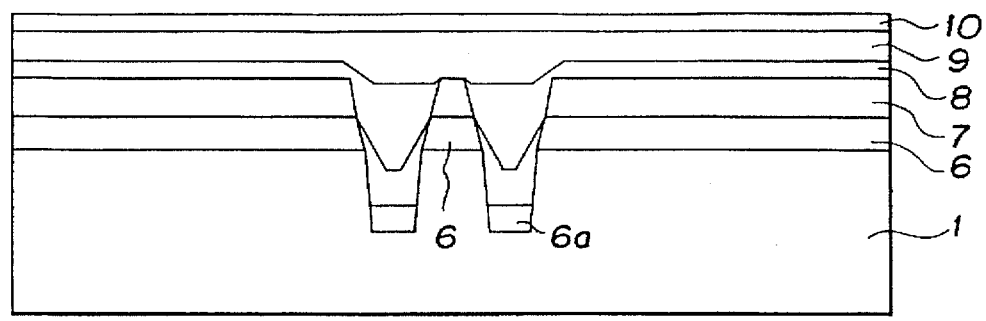
FIG. 4A is a cross sectional view showing an example of a structure of a 1.55 μm band light emitting device formed on a nonplanar semiconductor substrate.

FIG. 4A shows an example of the structure of a semiconductor light emitting device which includes a light emitting diode (LD) and a laser diode (LED) fabricated by the above-described method according to the present invention. In FIG. 4A, reference numeral 1 denotes an n-InP substrate, 6 is an active layer (for example, a strained MQW layer consisting of InGaAsP/InGaAs), 6a is an MQW layer in a groove, 7 is a p-InP cladding layer, 8 is an n-InP buried layer, 9 is a p-InP layer, and 10 is a contact layer.

In order to further improve the oscillating characteristics of the semiconductor light emitting device fabricated by the above-described method, two problems must be solved.

More particularly, for example, when a crystal is grown on a nonplanar semiconductor substrate 1 having a ridge shape of a ridge width of 1.5 μm, a gap distance of 2 μm, and a ridge height of 2 μm using a composition which gives an oscillating wavelength in a 1.35 μm band in a planar region of the substrate, the actual composition of the active layer 6 on the ridge becomes one which corresponds to 1.55 μm band while the actual composition of the crystal 6a in the groove corresponds to 1.3 μm band. In the case where a semiconductor substrate having the same ridge shape as above is used for growing on it a composition giving an oscillating wavelength of 1.45 μm band or 1.55 μm band in the planar region of the substrate, the actual composition of the active layer 6 on the ridge is not varied so greatly and corresponds to an oscillating wavelength in the vicinity of 1.55 μm for both of the starting compositions corresponding to 1.45 μm band and 1.55 μm band wile the actual composition of the MQW layer 6a in the groove is varied so as to correspond to 1.4 μm band or 1.5 μm band for the starting composition corresponding to 1.45 μm or 1.55 μm, respectively.

As stated above, the composition of the active layer 6 on the ridge is constant, corresponding to 1.55 μm band while the composition of the MQW layer 6a in the groove is varied considerably.

Analysis of the oscillating characteristics of such a semiconductor laser diode by a computer simulation revealed that the closer the composition of the MQW layer in the groove to the composition of the active layer on the ridge, the smaller the difference in potential in a vertical direction between the both portions, and as a result there occurs the more leakage of current into the groove portion to increase the threshold current.

Figure 4B:
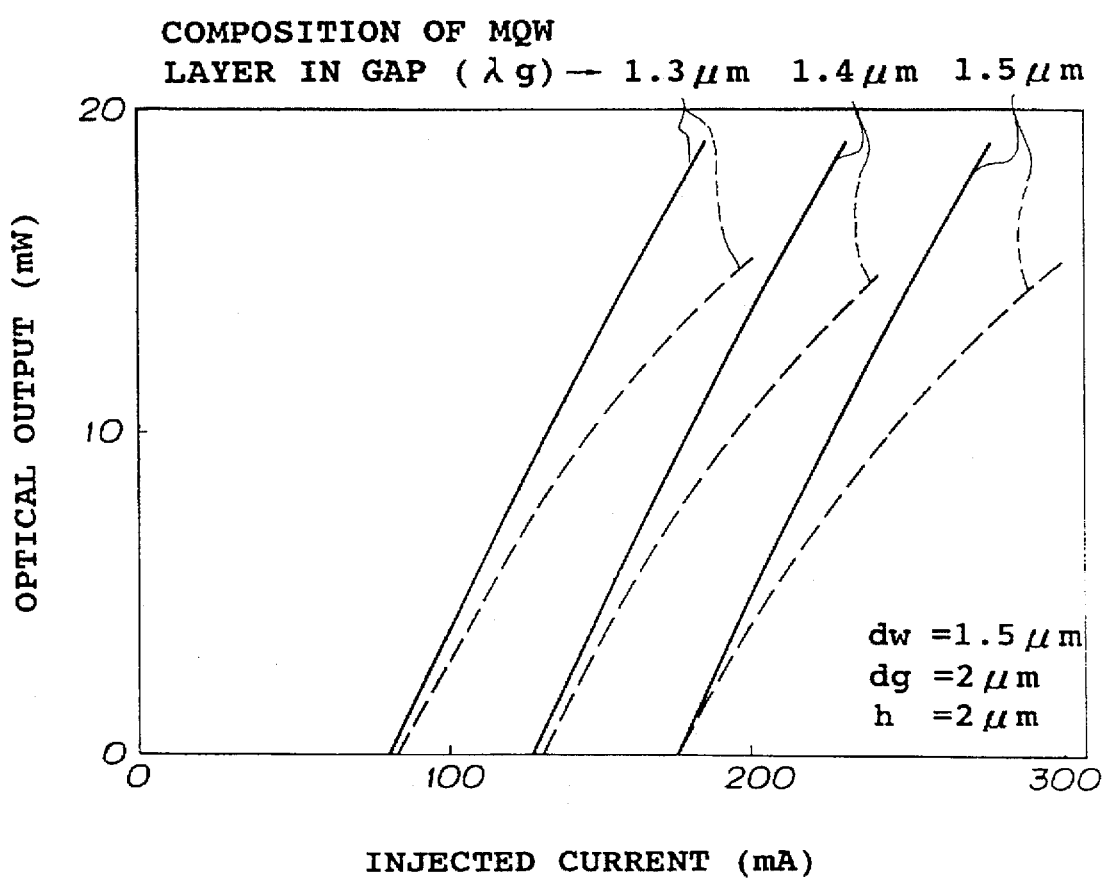
FIG. 4B is a graph illustrating results of simulation of oscillation in the structure shown in FIG. 4A, with solid and broken lines indicating differences in crystal properties.

FIG. 4B illustrates an example of results of simulated oscillation using a relatively simple model of a semiconductor laser diode having a nonplanar substrate of 1.5 μm in ridge width, 2 μm in gap distance, and 2 μm in ridge height (groove depth), on which there is grown an MQW layer having a composition in the groove portion set so as to correspond to 1.3 μm, 1.4 μm or 1.5 μm. In other words, FIG. 4B illustrates dependence of optical output on injected current for varied composition of the MQW layer in the groove region. In FIG. 4B, the solid line indicates an ideal state in which there is no crystal defect while the broken line indicates a state in which crystal quality is insufficient, or there are crystal defects in a density of $10^{12}$ per $cm^3$.

From what is illustrated in FIG. 4B, one will be aware of two problems. First one is that the injected current threshold of the laser diode varies greatly depending on the composition of the MQW layer in the groove region. Second one is that the oscillating characteristics varies depending on crystal quality; the oscillating characteristics obtained by the current technology is considered to resemble one indicated in broken line. To improve the oscillating characteristics of a laser diode as described above, there are needed uniformity of injected current threshold and improvement of the quality of a crystal.

Quality of a crystal depends largely on the density of damages occurring during the patterning of a nonplanar semiconductor substrate underlying he crystal although it also depends on the conditions of crystal growth. It is considered that the current oscillating characteristics are attributable to a decrease in crystal quality which occurs when the crystal growth of an active layer is performed directly on a nonplanar semiconductor substrate made by a dry process. Accordingly, in order to further increase the oscillating characteristic of a current optical device, it is necessary to decrease the occurrence of damages in a nonplanar semiconductor substrate inclusive of those damages occurring during processing before the crystal growth The semiconductor light emitting device of the present invention preferably has a semiconductor thin film layer formed in the above-described groove region which layer has a conductivity type different from than of the substrate.

It is also preferred that the active layer be formed on a nonplanar semiconductor substrate having a ridge shape of an anti-mesa structure.

Further, it is preferred that a semiconductor thin film buffer layer be formed on a nonplanar semiconductor substrate.

The method for the fabrication of the above-described semiconductor light emitting device includes the steps of forming on a planar semiconductor substrate a semiconductor thin film protective layer having a composition different from that of the semiconductor substrate, and processing the substrate into a nonplanar substrate.

More particularly, in a semiconductor light emitting device having a strained MQW structure formed by MOVPE on a nonplanar semiconductor substrate having the above-described specified ridge configuration, improvements are made to introduce a semiconductor current blocking layer, form a semiconductor buffer thin film layer and introduce an anti-mesa ridge structure.

Formation of the strained MQW thin film on the nonplanar semiconductor substrate by the introduction of a semiconductor current blocking thin film layer, formation of a semiconductor buffer thin film layer, introduction of an anti-mesa ridge structure enables fabrication of a semiconductor light emitting device having a high quality and a high injection efficiency. This allows diversified control of amount of wavelength shift along with control of oscillating wavelength by controlling the composition which in turn is controlled by the pattern of the ridge and, hence, a highly improved semiconductor light emitting device can be realized.

According to a second aspect of the present invention, an integrated optical circuit is provided which includes a semiconductor laser diode (LD), a first semiconductor detector or photodetector (PD), a second semiconductor detector which detects light of a wavelength longer than that detected by the first detector, a wavelength filler arranged between the first and second detector, all being connected through an optical waveguide for integration. This device can be used as a single wavelength transmitter and as a two-wavelength receiver.

In the integrated optical circuit of the present invention, the semiconductor multilayer is formed preferably on a ridge formed between two grooves. By so doing, the effective bandgap of the semiconductor multilayer can be varied by adjusting the ridge width, gap distance and ridge height. Utilizing this phenomenon, a light emitting layer or active layer, light absorbing layer and an optical waveguide layer can be formed on the same semiconductor substrate simultaneously.

First, explanation will be made on the formation of a ridge or ridges used in the present invention and crystal growth thereon as well as change in bandgap of the thus grown multilayer.

Figure 5A:
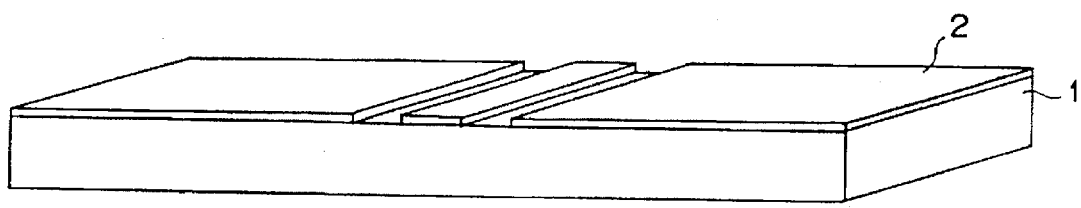
FIG. 5A is a perspective view showing a semiconductor substrate during a process for fabricating a nonplanar substrate, the substrate being formed thereon with a mask for etching.
Figure 5B:
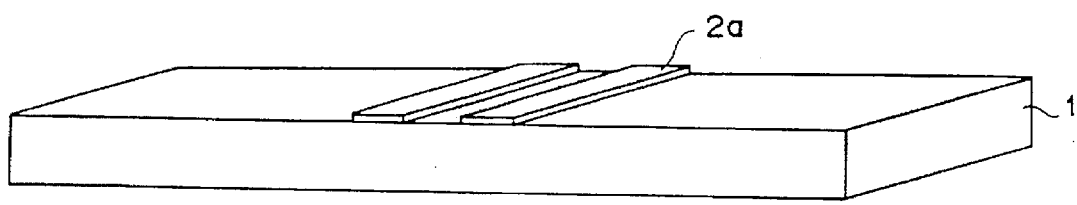
FIG. 5B is a perspective view showing a semiconductor substrate during a fabrication process, the substrate being formed thereon with a mask for selective growth.
Figure 5C:
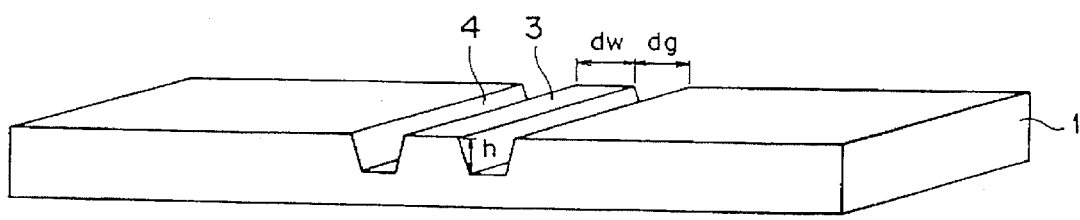
FIG. 5C is a perspective view showing a semiconductor substrate during a fabrication process, the substrate being formed therein with grooves.

As shown in FIG. 5A, there is formed on a planar substrate 1 an oxide or nitride layer 2 by pattering. Thereafter, a ridge (or mesa) 3 on both sides of which there are formed grooves as shown in FIG. 5C by dry etching with a reactive gas ion such as chlorine ion or the like or by wet etching with a hydrochloric acid-containing etchant. The direction of the mesa is the same as in the case of fabrication of ordinary semiconductor laser diodes, that is, <011> direction on a (100) substrate (i.e., so-called "anti-mesa" direction). Formation of a ridge or ridges can also be performed utilizing a selective growth. In this case, a first mask pattern is formed using an insulator layer $2a$ which occupies a region where a groove 4 is to be formed as shown in FIG. 5B. This selective growth method can also provide a ridge as shown in FIG. 5C. In FIG. 5C, ridge width, dw, and gap distance, dg, are defined by distances on the upper surface of the mesa structure. The height, h, of the mesa (ridge) is defined by a difference of height between the upper surface of the mesa and a flat surface in a bottom region of the groove. On the nonplanar semiconductor substrate having a ridge thus formed is grown a semiconductor multilayer (MQW structure) by MOVPE.

Figure 6A:
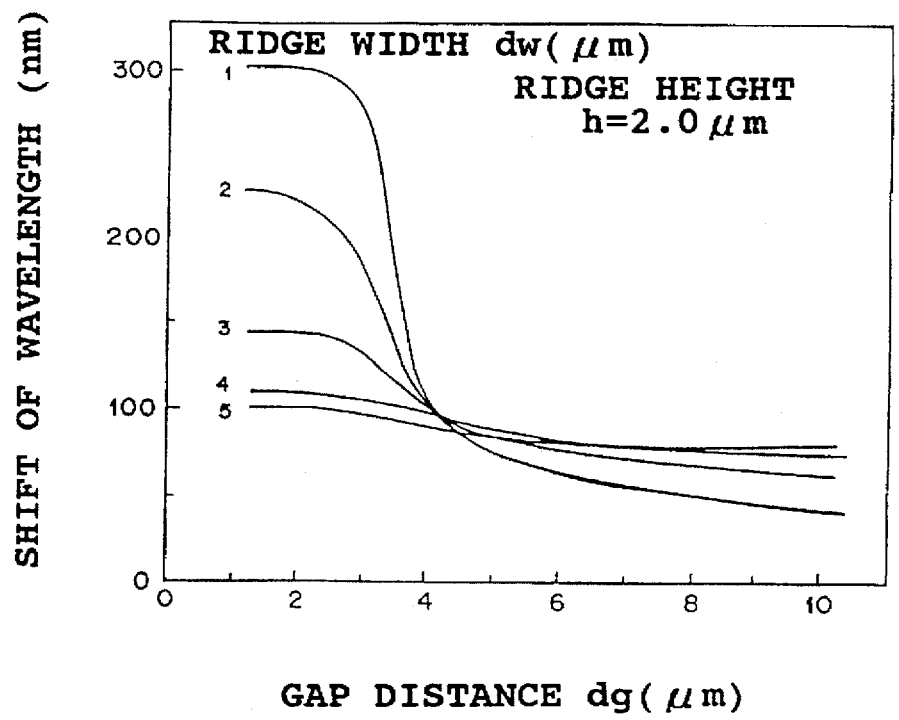
FIG. 6A is a graph illustrating a shift in the bandgap wavelength, as influenced by ridge width, of a multi-quantum well structure formed on a ridge.
Figure 6B:
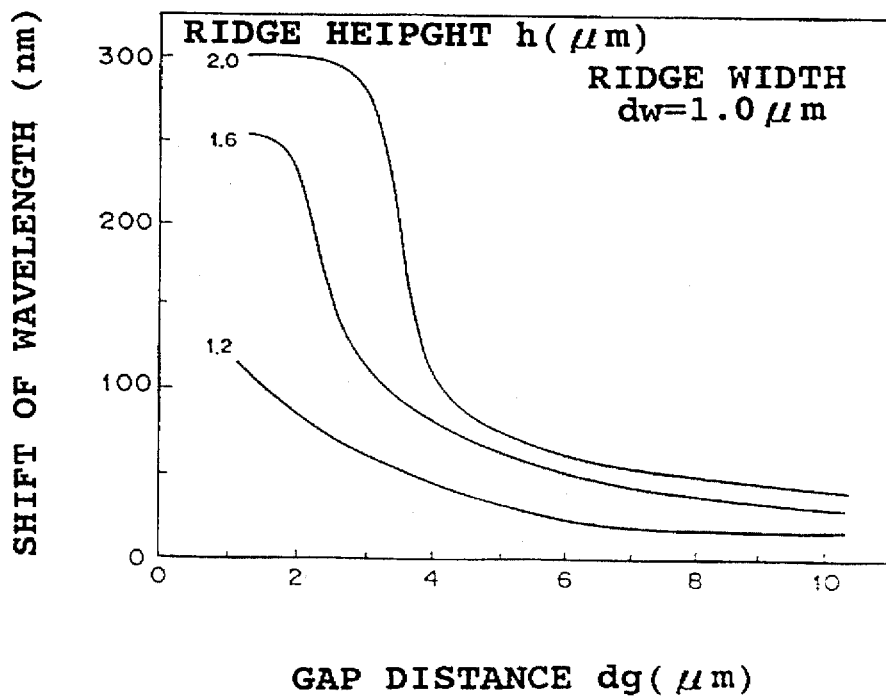
FIG. 6B is a graph illustrating a shift in the bandgap wavelength, as influenced by ridge height, of a multi-quantum well structure formed on a ridge.

The MQW structure grown by the above-described method has a composition which varies depending on the ridge width, gap distance and ridge height and so the bandgap wavelength varies accordingly. FIG. 6A is a graph illustrating shifts of the bandgap wavelengths of MQW structures formed on ridges having the same height of 2 μm, and different widths of 1 μm, 2 μm, 3 μm, 4 μm and 5 μm, respectively, with the gap distance being varied from 1 μm to 10 μm from the bandgap wavelengths of MQW structures simultaneously grown on a planar region of the substrate. FIG. 6B is a graph illustrating shifts of the bandgap wavelengths of MQW structures formed on ridges of the same ride width and three different heights of 1.2 μm, 1.6 μm and 2.0 μm, with the gap distance being varied continuously from the bandgap wavelengths of MQW structures simultaneously grown on a planar region of the substrate. As shown in FIGS. 6A and 6B, shift of bandgap wavelength till 300 nm can be achieved by growing a MQW structure on a nonplanar semiconductor substrate. The narrower the ridge width or gap distance, the longer wavelength side the bandgap wavelength is shifted.

As the MQW structure, there can be used any combination of compositions such as InGaAs/InGaAsP, InAsP/InGaAsP, InGaAsP/InGaAsP, InGaAs/InP, InGaAs/InAlAs, InGaAs/InGaAlAs, etc.

According to a third aspect of the present invention, there is provided an optical device in the form of a spot size converter makes most of changes in the composition and thickness of an epitaxial layer grown on a ridged substrate depending on the shape of the ridge-like structure or waveguide. The changes in the composition or thickness of the epitaxially grown layer results in changes in the bandgap wavelength and refractive index.

Here, the "ridge-like waveguide" consists of grooves and a ridge formed between the grooves. Hence, the sizes of the ridge-like waveguide include not only the ridge width and ridge height but also the width of the groove (gap distance).

Figure 7:
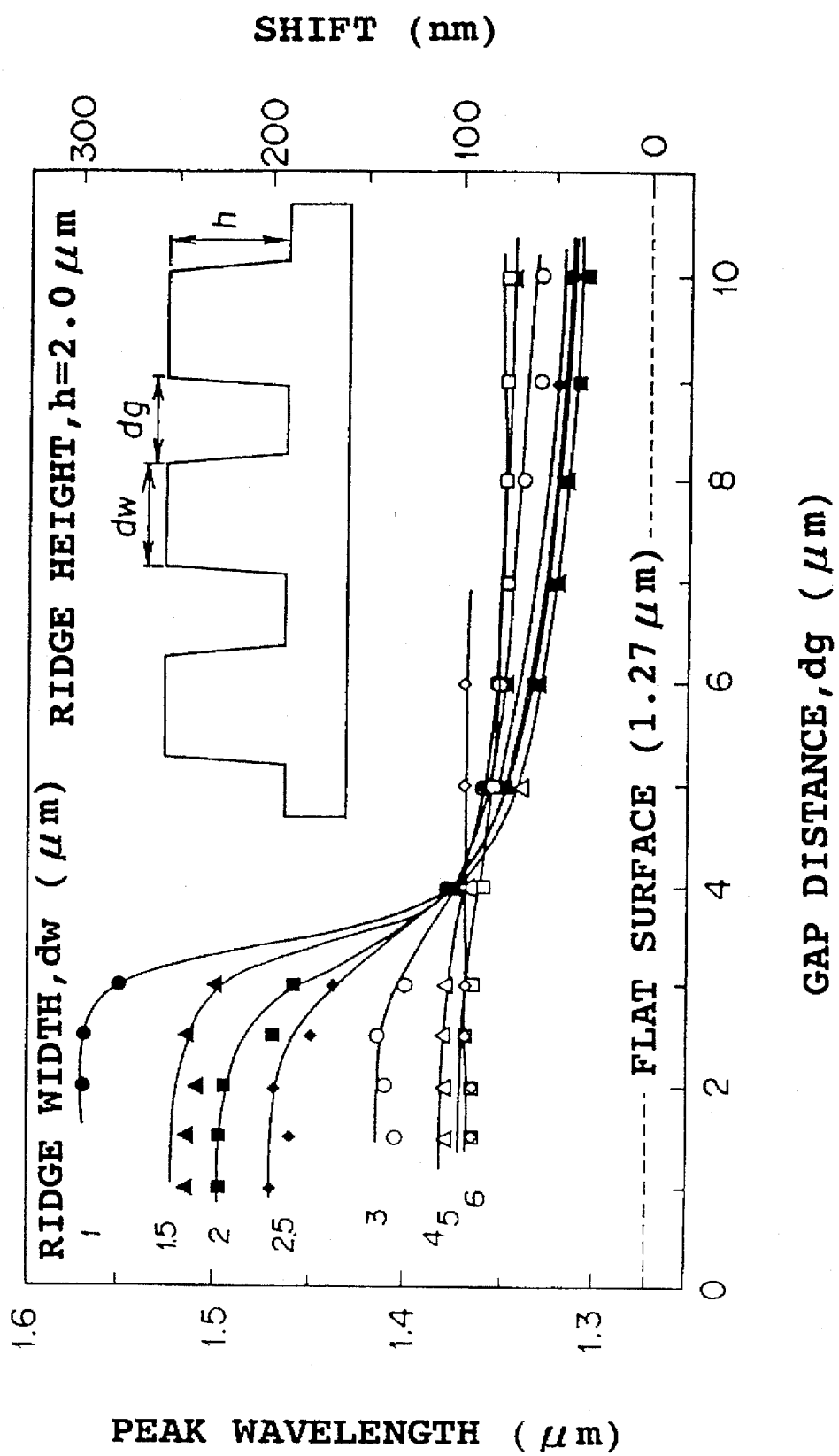
FIG. 7 is a graph illustrating dependence, on ridge and gap distance, of a photoluminescence peak wavelength of a quantum well structure grown on a nonplanar semiconductor substrate.
Figure 8:
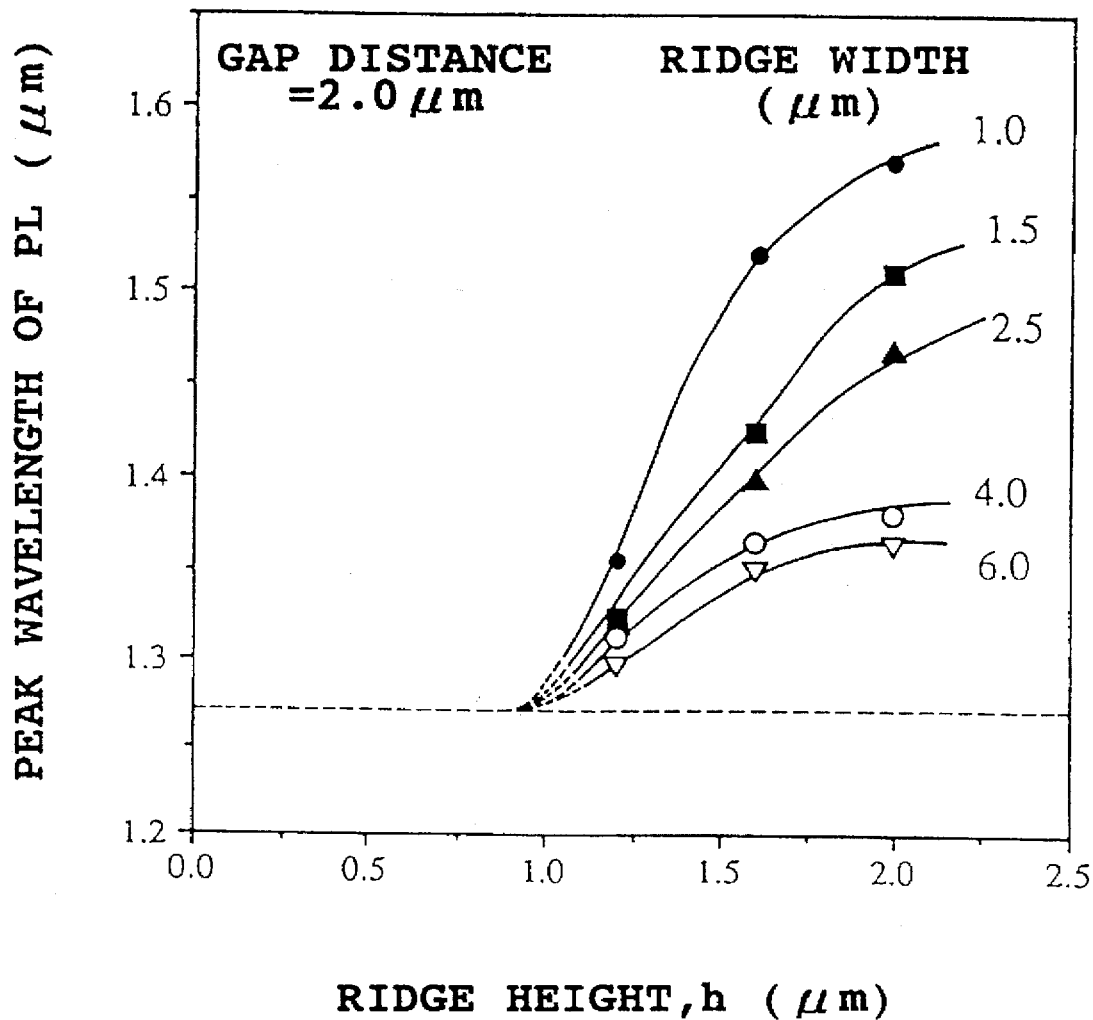
FIG. 8 is a graph illustrating dependence, on ridge height, of a photoluminescence peak wavelength of a quantum well structure grown on a nonplanar semiconductor substrate.

FIGS. 7 and 8 illustrate variation of PL (photoluminescence) peak wavelength of a spot size converter which has a MQW structure consisting of an InGaAs layer of 17 Å thick and a 1.1 µm (composition)-InGaAsP layer of 150 Å thick. FIG. 7 illustrates dependence of wavelength shift on the gap distance, dg, using the ridge width, dw, as a parameter, when the ridge height is 2.0 µm. PL peak wavelength on a planar substrate without any ridge is about 1.27 µm. FIGS. 7 and 8 show that when the size or sizes of the ridge structure is or are varied in a direction of light transmission, the epitaxial layer grown on the ridge has a bandgap wavelength which is varied in a direction of light transmission with concomitant change in refractive index. Therefore, an optical waveguide which includes such a layer formed as a core has refractive index distributions of the core and cladding, respectively, which differ at both end faces of the waveguide. As a result, there can be readily realized an optical device which includes waveguides of different spot sizes, respectively.

DETAILED DESCRIPTION OF PREFERRED EMBODIMENTS

Hereinbelow, the present invention will be described in more detail by examples with reference to the drawings. However, the present invention should not be construed as being limited thereto.

EMBODIMENT 1

Light Emitting Device

The instant embodiment relates to a light emitting device (light emitting diode, LD, and laser diode, LD) fabricated by MOVPE growing of a crystal on a nonplanar InP substrate whose ridge width, ridge distance (gap distance) and ridge height were varied. The light emitting device had a oscillating wavelength region near a region of 1.3 µm to 1.65 µm.

Figure 9A:
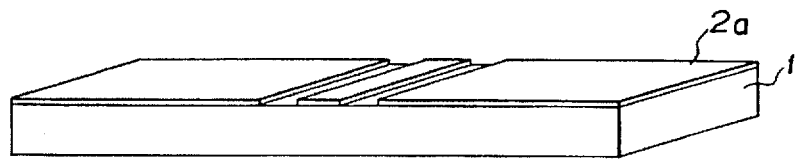
FIG. 9A is a perspective view showing a semiconductor substrate during a process for fabricating an optical functional device according to a first embodiment of the present invention, the semiconductor substrate being formed thereon with a mask for etching.

FIGS. 9A through 9E illustrate a process for fabricating the light emitting device of the instant embodiment First, as shown in FIG. 9A, a mask pattern for forming a ridge of predetermined sizes was formed on an InP substrate 1 with an oxide or nitride layer 2.

Figure 9B:
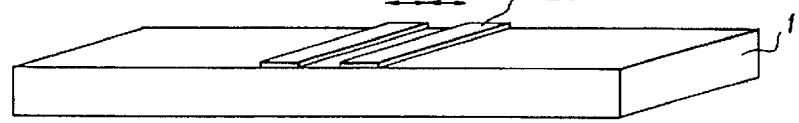
FIG. 9B is a perspective view showing a semiconductor substrate during a process for fabricating an optical functional device according to a first embodiment of the present invention, the semiconductor substrate being formed thereon with a mask for selective growth.

Next, as shown in FIG. 9B, grooves 4 for forming a ridge 3 were formed by dry etching with a reactive gas ions, for example, halogen ions such as chlorine ions, bromine ions, hydrocarbon ions such as those derived from methane, ethane, etc., ion milling with inert gas ions such as Ar ions, or wet etching with an etchant such as chlorine, sulfuric acid, bromine or the like. The angle of the formation of the ridge 3 was in a direction of <011> on an InP (100) substrate (so-called "anti-mesa" direction). As will be described later on, it has empirically revealed that this direction gives the largest shift.

Figure 9C:
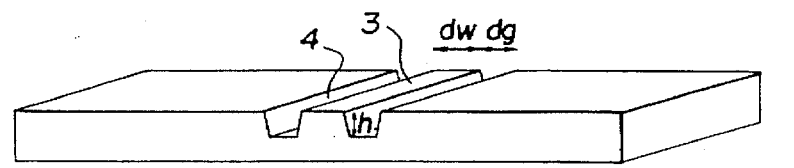
FIG. 9C is a perspective view showing a semiconductor substrate during a process for fabricating an optical functional device according to a first embodiment of the present invention, the semiconductor substrate being formed therein with grooves to form a nonplanar substrate.
Figure 9D:
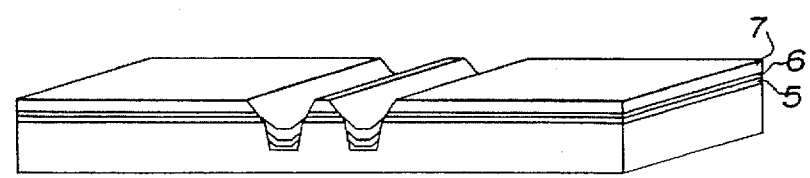
FIG. 9D is a perspective view showing a semiconductor substrate during a process for fabricating an optical functional device according to a first embodiment of the present invention, the semiconductor substrate being formed thereon with an active layer by a crystal growth (growth of an active layer)

The ridge 3 may be formed by a selective growth method. In this case, the mask pattern is reversed to that used in the formation of ridges by etching. That is, as shown in FIG. 9B, masks 2a were placed on regions in which grooves were to be formed. The selective growth method also gave the ridge 3 as shown in FIG. 9C. The ridge 3 may also be formed by crystal growth of an optical waveguide layer of InGaAsP to a thickness of about 1,000 Å on a semiconductor substrate by an MOVPE method details of which will be described later on, followed by formation of ridged nonplanar substrate as shown in FIG. 9C. In this case, freedom increases in the design of optical functional devices. In FIG. 9C, the ridge width, dw, and the gap distance, dg, were measured in terms of distance on the upper surface of the mesa structure, and the height of the ridge 3 was defined by a difference between the upper surface of the ridge and a flat surface of the bottom portion of the groove, taking into consideration the possibility that the shape of the ridge 3 was not upright.

Subsequently, a semiconductor multilayer of a laser diode structure was formed on the nonplanar InP substrate I having the ridge 3 by an MOVPE method.

The semiconductor multilayer was grown in a low pressure vertical MOVPE growth furnace at a pressure of 70 Torr and a growth temperature of 630° C. As the source material, there were used TMI (trimethylindium), TEG (triethylgallium), $AsH_3$ (arsine), and $PH_3$ (phosphine).

The semiconductor multilayer consisted of an n-InP buffer layer 5, a 4- to 6-period InGaAsP strained MQW active layer of InGaAs (17 Å)/InGaAsP (150 Å) (lg=1.1 µm) and InGaAsP optical waveguide layer 6, a p-InP cladding layer 7.

Figure 9E:
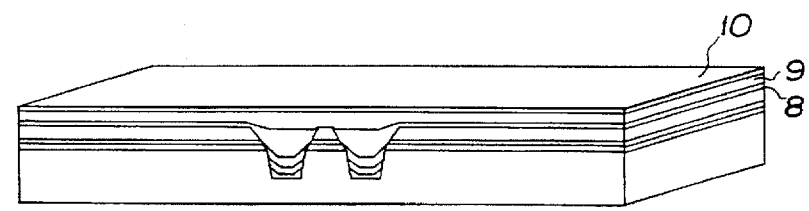
FIG. 9E is a perspective view showing a semiconductor substrate during a process for fabricating an optical functional device according to a first embodiment of the present invention, the semiconductor substrate being buried by a crystal growth (burying growth)

Further, an upper portion of the ridge was masked and an n-InP buried layer 8 was grown as shown in FIG. 9E. Thereafter, the mask was removed and a p-InP buried layer 9 and a p-InGaAsP contact layer 10 were grown overall (FIG. E). The growth steps shown in FIGS. 9D and 9E may be performed as a through process by controlling growth conditions such as growth temperature, doses of dopants, etc. or the ridge width, dw.

Figure 9F:
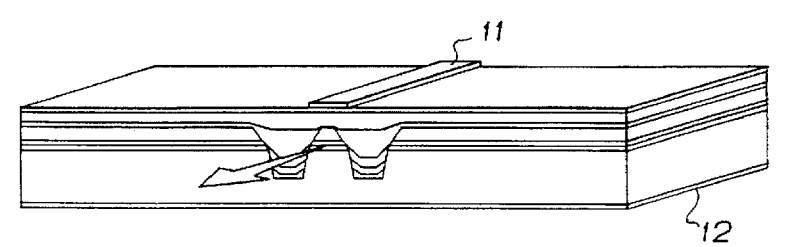
FIG. 9F is a perspective view showing a semiconductor substrate during a process for fabricating an optical functional device according to a first embodiment of the present invention, the semiconductor substrate being formed thereon with an electrodes.

Finally, as shown in FIG. 9F, a p-type electrode 11 was formed on the p-InGaAsP contact layer 10 as the uppermost multilayer on the ridge, and an n-type electrode 12 was formed on the InP substrate 1. After alloying, devices were fabricated by cleavage or separation of electrodes. Injection of current in the resulting device caused laser beam emission in a direction indicated by an arrow in FIG. 9F.

In the above-described fabrication process, a light emitting device of a buried heterostructure was realized on an InP substrate. When current was injected into the light emitting device, there was observed light emission from an end face of the ridge 3.

Figure 10A:
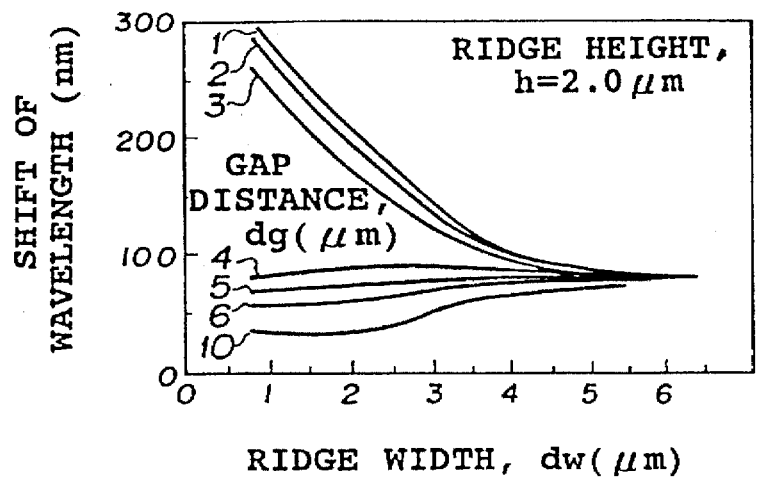
FIG. 10A is a graph illustrating dependence, on ridge width (dw), of oscillating wavelength of an optical functional device according to a first embodiment of the present invention.
Figure 10B:
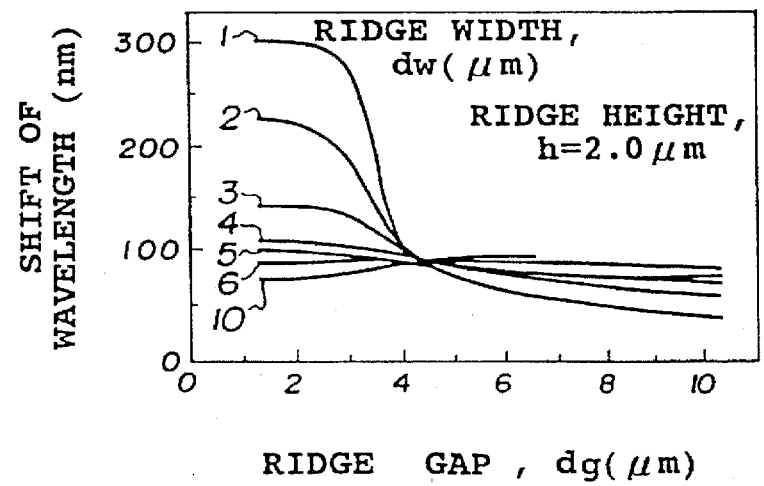
FIG. 10B is a graph illustrating dependence, on gap distance (dg), of oscillating wavelength of an optical functional device according to a first embodiment of the present invention.
Figure 10C:
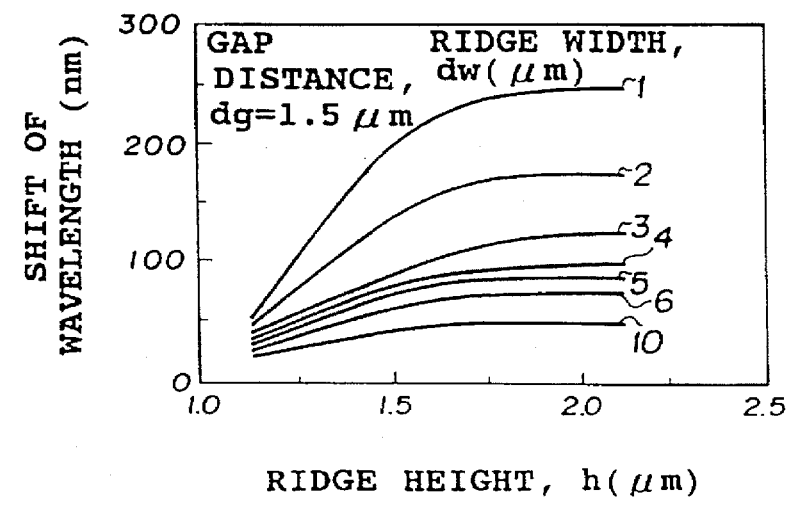
FIG. 10C is a graph illustrating dependence, on ridge height, h, of oscillating wavelength of an optical functional device according to a first embodiment of the present invention.

FIGS. 10A through 10C illustrate optical characteristics of the light emitting device of the present invention in comparison with the conventional light emitting device in which the active layer is formed on a nonplanar semiconductor substrate.

More particularly, FIGS. 10A through 10C illustrate shifts in the oscillating wavelength of a MQW layer of $In_{1-x}Ga_xAs$/InGaAsP (lg=1.1 µm) of 17 Å thick which was formed on a ridged substrate and had a tension of 0.5%. For comparison, a light emitting device was fabricated by growing on a planar substrate a crystal of MQW layer similarly to the present invention, dry etching the active layer to a predetermined width, and regrowing a buried semiconductor thin film layer. The comparative light emission had an oscillating wavelength of 1.27 µm.

FIG. 10A illustrates dependence of wavelength shift on the ridge width, dw, ranging from 1 µm to 6 µm, using the gap distance, dg, as a parameter, when the ridge height is 2.0 µm. As will be apparent from FIG. 10A, at a gap distance of not greater than 3 μm (dg≦3 μm), shift of the oscillating wavelength increases considerably according as the ridge width, dw, decreases. On the contrary, shift of the oscillating wavelength is little at a ridge width of not smaller than 4 μm.

FIG. 10B illustrates dependence of wavelength shift on the gap distance, dg, ranging from 1 μm to 10 μm, using the ridge width, dw, as a parameter, when the ridge height is 2.0 μm. As will be apparent from FIG. 10B, shift of the oscillating wavelength increases considerably according as the gap distance, dg, decreases when the ridge width, dw, is not greater than 2 μm (dw≦2 μm). This variation is remarkable when the ridge width is not greater than 6 μm.

FIG. 10C illustrates dependence of wavelength shift on the ridge height, h, ranging from 1.2 μm to 2.2 μm, using the ridge width, dw, as a parameter, when the gap distance, dg, is a constant value of 1.5 μm. As will be apparent from FIG. 10C, shift of the oscillating wavelength increases considerably according as the ridge height, h, increases. From the characteristics illustrated in FIGS. 10A through 10C, it can be seen that the shift of oscillating wavelength is very large when the ridge has minute sizes, i.e., a ridge width, dw, a ridge height, h, and a gap distance, dg, each not greater than 10 μm, and in addition that the oscillating wavelength can be controlled by processing the ridge, etc. The oscillating wavelength shifts at a longer wavelength side with a smaller ridge width or a smaller gap distance. According to the present invention, there can be realized a light emitting device having a maximum oscillating wavelength of 1.6 μm in contrast to the conventional light emitting device having an oscillating wavelength of 1.3 μm using a planar substrate. This means a shift of 300 nm can be achieved by the present invention.

Figure 11A:
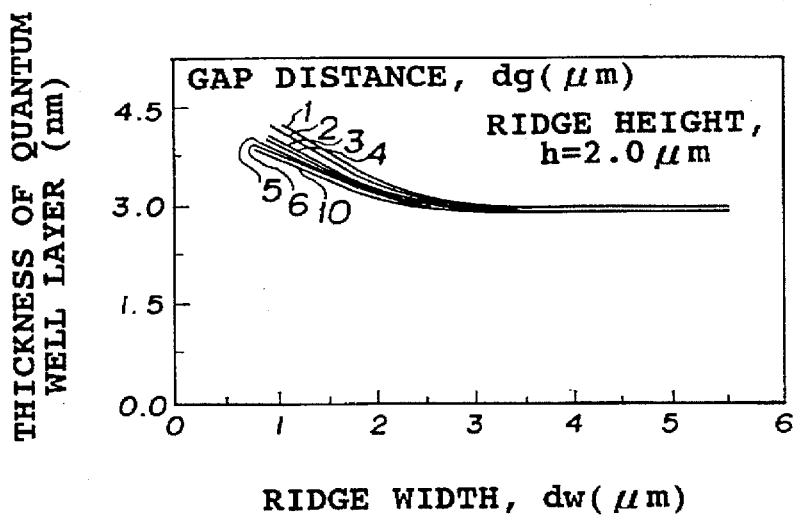
FIG. 11A is a graph illustrating dependence, on ridge width, of thickness of InGaAs quantum well layer of an optical functional device according to a first embodiment of the present invention.
Figure 11B:
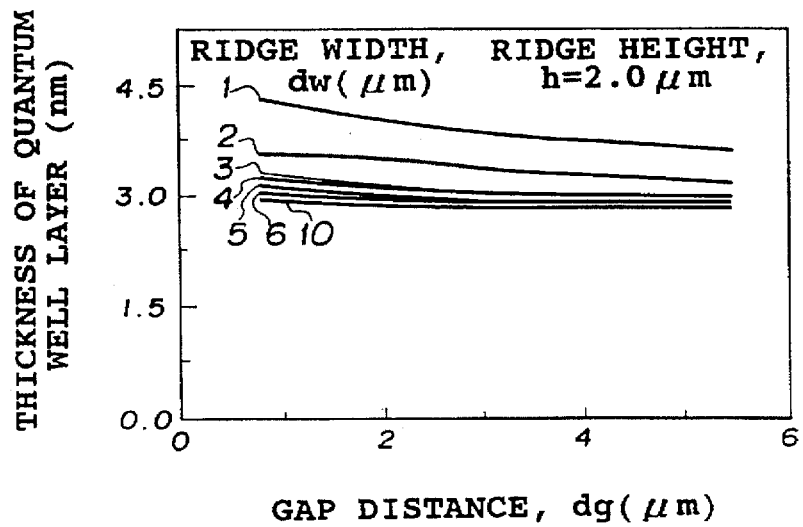
FIG. 11B is a graph illustrating dependence, on gap distance, of thickness of InGaAs quantum well layer of an optical functional device according to a first embodiment of the present invention.
Figure 11C:
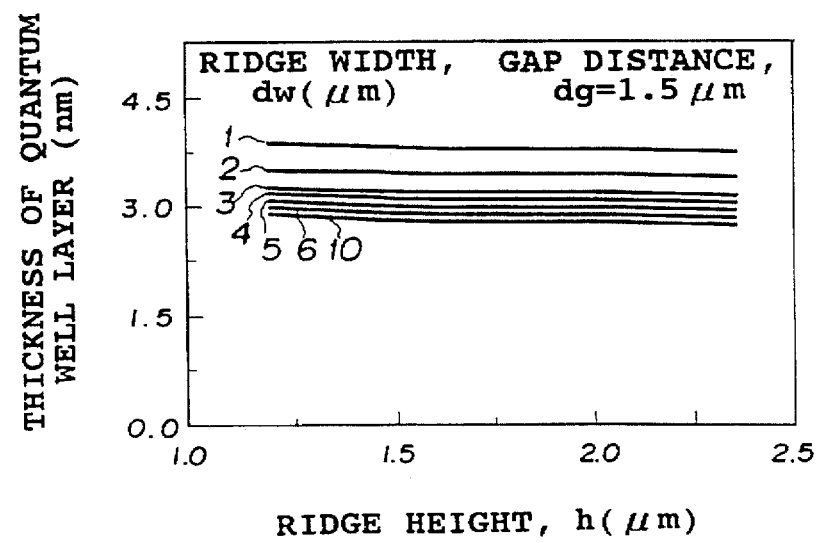
FIG. 11C is a graph illustrating dependence, on ridge height, of thickness of InGaAs quantum well layer of an optical functional device according to a first embodiment of the present invention.

To confirm what is a major factor of the shift of the oscillating wavelength according to the present invention, an InGaAs ($\lambda g=1.1$ μm) MQW layer was grown on a ridged substrate, and dependence of the thickness of the MQW layer on the ridge width, dw, gap distance, dg, or the ridge height, h, of the substrate was examined. FIGS. 11A through 11C illustrate the results in such a manner that they correspond to respective sizes in the embodiments. FIG. 11A is a graph illustrating dependence of the thickness of the MQW layer on the ridge width. The phenomenon that the ridge width, dw, abruptly increases at a ridge width of not greater than 1.5 μm is believed to reflect the migration of component atoms, particularly In, on the crystal surface.

FIG. 11B is a graph illustrating dependence of the thickness of the MQW layer on the gap distance, dg. On the other hand, FIG. 11C illustrates dependence of the thickness of the MQW layer on the ridge height, h. Both FIGS. 11B and 11C show less variation in the thickness of the MQW layer. From the characteristics illustrated in FIGS. 11A through 11C, it can be seen that although the thickness of the MQW increases slightly within the ranges of the ridge width, dw, ridge height, h, and gap distance, dg, each not greater than 10 μm, used in the present invention, the major factor that changes the shift of the oscillating wavelength greatly is a change in the composition of the MQW layer due to effects of the shape of the ridge.

What is described above is an example in which the strained MQW layer consists of InGaAs/InGaAsP. Also, there may be used other III-V group MQW materials that can grow on an InP substrate, for example, InGaAsP/InGaAsP, InGaAs/InP, InAsP/InAlAs, InGaAs/InGaAlAs, etc. The above-described control of the oscillating wavelength can be achieved in a shorter wavelength region (from 0.8 μm to near 1.1 μm) by growing an MQW structure of GaAs/AlGaAs, InGaAs/AlGaAs, etc. on a GaAs substrate.

Embodiment 2 DFB Laser Diode

The instant embodiment relates to fabrication of a DFB laser diode which has an improved controllability of the oscillating wavelength of the light emitting device described in Embodiment 1, and which oscillates in a single spectrum.

Figure 12A:
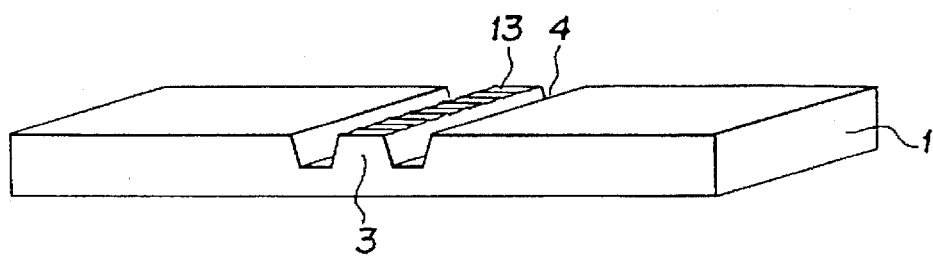
FIG. 12A is a perspective view showing a nonplanar semiconductor substrate according to a second embodiment of the present invention, with diffractive gratings being formed on a ridge.
Figure 12B:
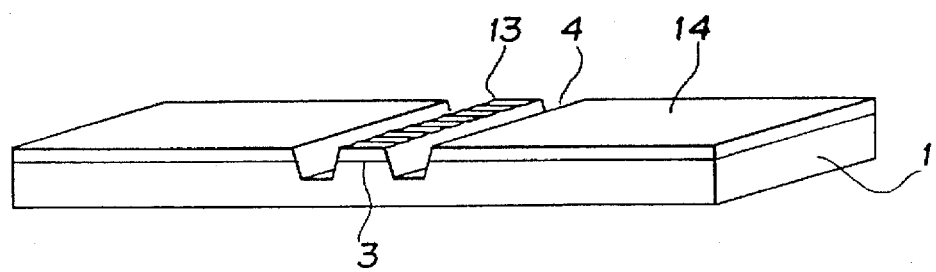
FIG. 12B is a perspective view showing a nonplanar semiconductor substrate according to a second embodiment of the present invention, with diffractive gratings being formed in an upper surface of an optical waveguide layer provided on a ridge.
Figure 12C:
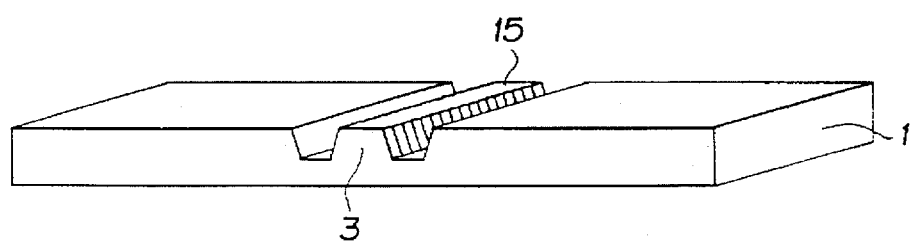
FIG. 12C is a perspective view showing a nonplanar semiconductor substrate according to a second embodiment of the present invention, with diffractive gratings being formed on a ridge.

FIGS. 12A through 12C show formation of diffractive gratings on a ridged substrate for fabricating a DFB laser diode according to the instant embodiment.

FIG. 12A is a perspective view showing a semiconductor substrate having a ridge on which diffractive gratings of a predetermined period are formed. The ridged substrate was formed with diffractive gratings 13 of a predetermined period by electron beam lithography or laser holography in a region where a ridge is to be formed, followed by forming a ridge 3. Subsequent processes such as formation of a semiconductor MQW layer and fabrication of a light emitting device were the same as in Embodiment 1.

FIG. 12B is a perspective view showing a semiconductor substrate for fabricating a laser diode of the present invention. After a semiconductor optical waveguide 14 was formed on a substrate 1, diffractive gratings 13 having a predetermined period were formed by electron beam lithography in a region where a ridge was to be formed. Then, the so-processed substrate 1 was formed with a ridge 3 similarly to the substrate as shown in FIG. 12A. Subsequent processes such as formation of a semiconductor MQW layer and fabrication of a laser diode were the same as in Embodiment 1 except that the step of forming an optical waveguide layer was unnecessary.

FIG. 12C is a perspective view showing an example of a ridged semiconductor substrate for fabricating a laser diode of the present invention. The ridged substrate shown in FIG. 12C has diffractive gratings 15 on side faces of a ridge 3. This construction was obtained by the steps of processing by electron beam lithography a mask for forming a ridge to provide the mask with diffractive gratings of a predetermined period, forming a ridge 3 and simultaneously forming diffractive gratings 15 on a side face of the ridge 3. Subsequent processes such as formation of a semiconductor MQW layer and fabrication of a laser diode were the same as in Embodiment 1.

In the instant embodiment, the laser diode operated at a single longitudinal mode upon injection of current into the laser to cause light emission.

Embodiment 3 Gap Distance-Modulated Laser Diode Array

The instant embodiment relates to fabrication of a semiconductor laser diode (LD) array having constant ridge width, dw, and constant ridge height of a groove 4, with the gap distance, dg, being varied in four ways. FIGS. 13A through 13E show a fabrication process for fabricating an LD diode array according to the instant embodiment.

Figure 13A:
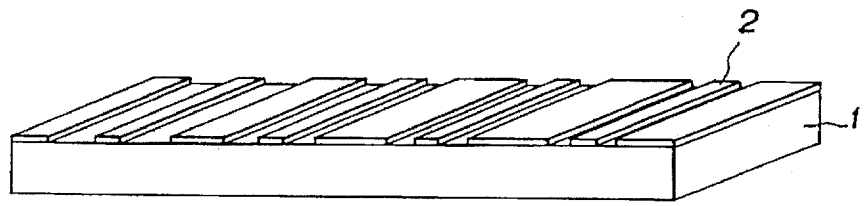
FIG. 13A is a perspective view showing a semiconductor substrate during a fabrication process (gap distance-modulated method) for fabricating a four-channel integrated laser diode array according to a third embodiment of the present invention, the semiconductor substrate being formed thereon with a mask for etching.
Figure 13B:
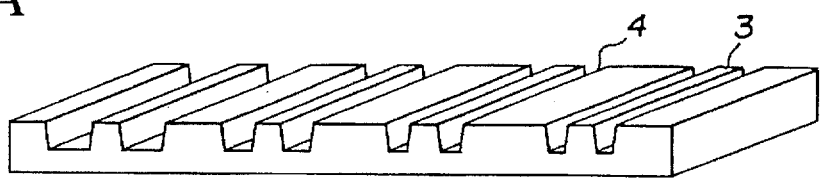
FIG. 13B is a perspective view showing a semiconductor substrate during a fabrication process (gap distance-modulated method) for fabricating a four-channel integrated laser diode array according to a third embodiment of the present invention, the semiconductor substrate being formed therein with grooves to form a nonplanar semiconductor substrate.

First, a stripe pattern made of an oxide or nitride layer 2 was formed on an n-InP (100) substrate 1 by photolithography as shown in FIG. 13A. Then, the substrate was dry etched with chlorine gas to form a nonplanar substrate having ridges 3 and grooves 4 of a gap distance-modulated type as shown in FIG. 13B. In this case, the ridges 3 having a ridge width, dw, of 1.5 μm were formed in a direction of <011> (so-called "anti-mesa" direction). The ridge height was 2 μm. The gap distance, dg, was varied serially from 1.5 μm on the leftmost side, toward right hand side 1.3 μm, 3.0 μm, 3.5 μm, and 4.0 μm on the rightmost side.

Figure 13C:
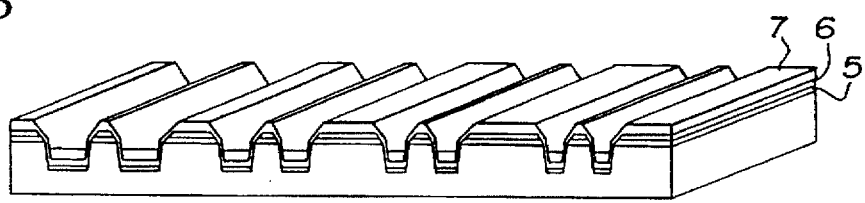
FIG. 13C is a perspective view showing a semiconductor substrate during a fabrication process (gap distance modulated method) for fabricating a four-channel integrated laser diode array according to a third embodiment of the present invention, the semiconductor substrate being formed thereon with an active layer by crystal growth (growth of an active layer)

Subsequently, there were formed on the n-InP substrate 1 an InP buffer layer 5, an active layer and optical waveguide layer 6 including an InGaAsP optical waveguide and a strained MQW active layer consisting of 5-periods of InGaP well (20 Å)/InGaAsP barrier (150 Å), and a p-InP cladding layer 7, as shown in FIG. 13C. A semiconductor multilayer consisting of the semiconductor layers 5, 6 and 7 was grown by an MOVPE method at 630° C. and at a pressure of 0.1 atm using TMI, TMG, AsH$_3$, PH$_3$ as source gases for fabricating a semiconductor and selenium hydride and diethylzinc as doping gases.

Figure 13D:
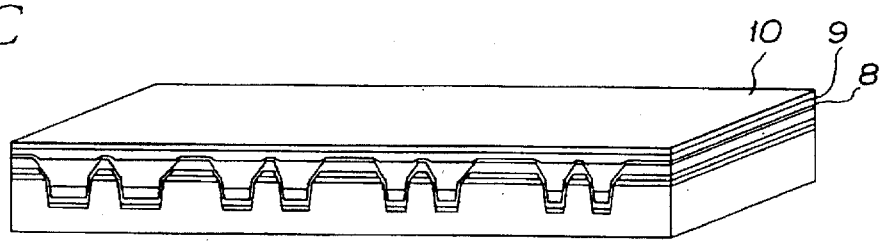
FIG. 13D is a perspective view showing a semiconductor substrate during a fabrication process (gap distance modulated method) for fabricating a four-wavelength integrated laser diode array according to a third embodiment of the present invention, the semiconductor substrate being buried by crystal growth (burying growth)

Further, an n-InP layer 8 and a p-InP layer 9 for blocking current were formed by an MOVPE method, and then a p-InGaAsP contact layer 10 was formed on the layer 10 as shown in FIG. 13D. The crystal growth steps shown in FIGS. 13C and 13D may be performed in one time by controlling the growth conditions. However, in order to exactly control the thickness of the buried layer and doping, the growth may be performed in two or three times dividedly.

Figure 13E:
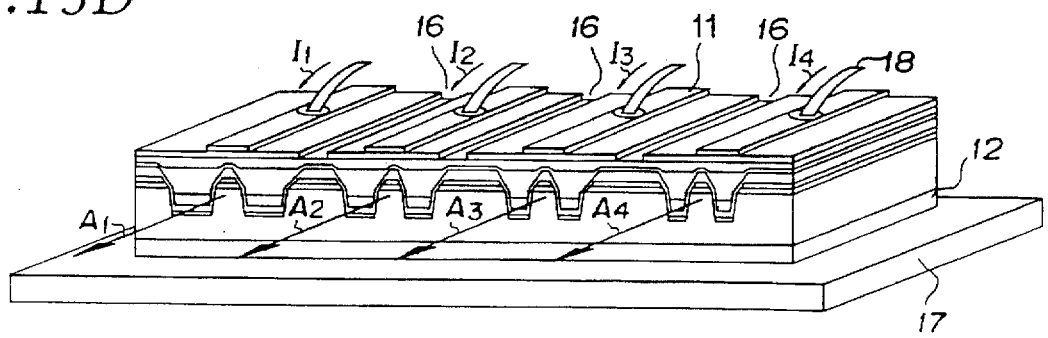
FIG. 13E is a perspective view showing a semiconductor substrate during a fabrication process (gap distance modulated method) for fabricating a four-wavelength integrated laser diode array according to a third embodiment of the present invention, the semiconductor substrate being formed thereon with electrodes.

Subsequently, as shown in FIG. 13E, p-type electrodes 11 and n-type electrodes 12 were formed on the both sides of the substrate, and isolation grooves 16 were formed to electrically isolate the device in a transverse direction. The device thus fabricated was mounted on a heat sink 17 and leads 18 were bonded to the electrodes 11. Thereafter, currents $I_1$, $I_2$, $I_3$ and $I_4$ were injected into the ridges 3. As a result, there was observed emission of laser beams $A_1$, $A_2$, $A_3$ and $A_4$ in a direction indicated by arrows shown in FIG. 13E.

Figure 14:
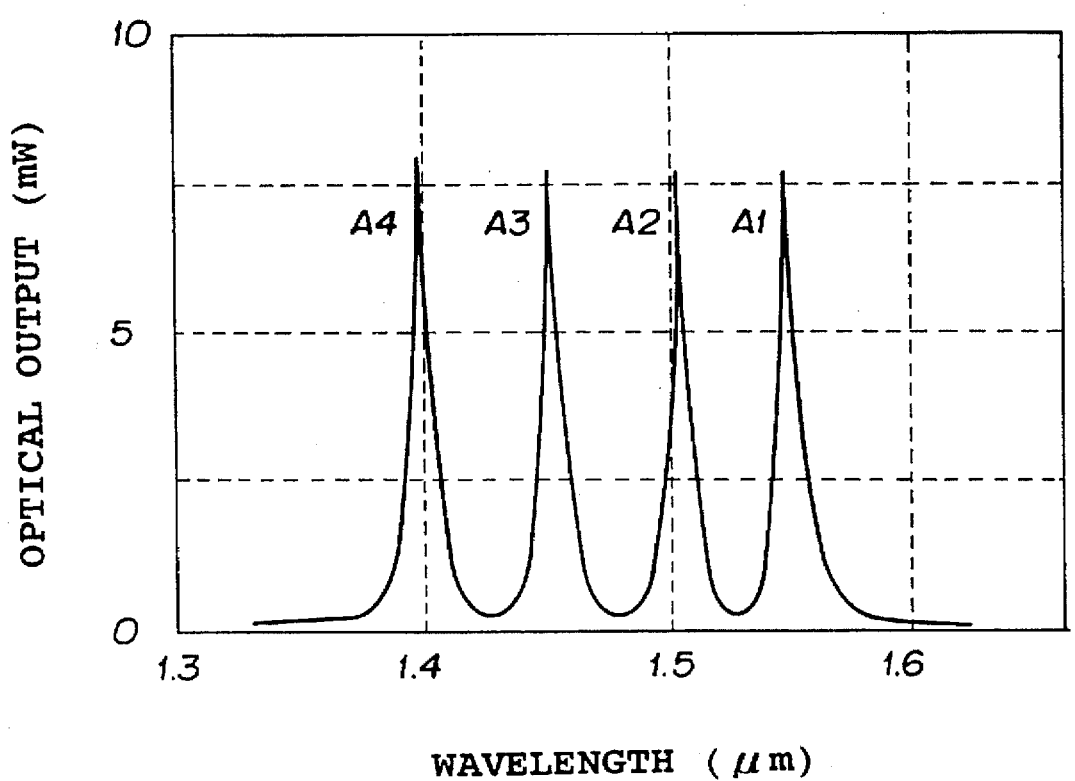
FIG. 14 is a graph illustrating oscillating characteristics of a four-channel laser diode array according to a third embodiment of the present invention.

The oscillating wavelength corresponded well to the results of measurements of photoluminescence, which confirmed that there was obtained light emission of high directivity corresponding to the change in composition. The oscillating spectrum on a planar substrate observed by photoluminescence had a peak at 1.3 µm whereas laser beams $A_1$, $A_2$, $A_3$ and $A_4$ from the respective end faces of the ridges separated by two adjacent grooves at a gap distance of 1.5 µm, 3.0 µm, 3.5 µm or 4.0 µm, respectively, had peaks at 1.55 µm, 1.5 µm, 1.45 µm or 1.4 µm, respectively, as shown in FIG. 14.

Embodiment 4 Gap Distance-Modulated Laser Diode Array with Diffractive Gratings

According to the instant embodiment, diffractive gratings were introduced into the construction of the LD array according to Embodiment 3 above in order to improve the controllability of oscillating wavelength and make the device oscillate in a single spectrum.

FIGS. 15A through 15E show a fabrication process for fabricating gap distance-modulated LD array according to the present invention.

Figure 15A:
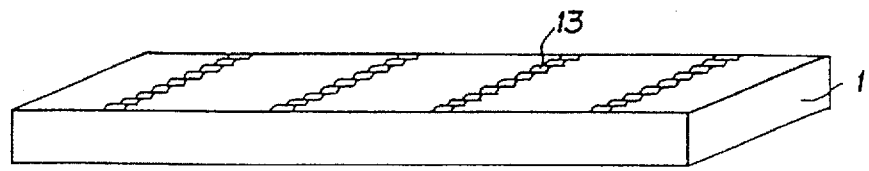
FIG. 15A is a perspective view showing a semiconductor substrate during a process (gap distance-modulated method) for fabricating a four-channel integrated DFB laser diode array according to a fourth embodiment of the present invention, the semiconductor substrate being formed thereon with diffractive gratings.

First, diffractive gratings 13 were formed on an InP substrate 1 by electron beam lithography as shown in FIG. 15A. The diffractive gratings had a width of 5 µm and various periods of 2,400 Å, 2,300 Å, 2,200 Å, and 2,100 Å, respectively, from right hand side toward left hand side. Sometimes, before the diffractive gratings 13 were formed on the InP substrate, an optical waveguide layer, for example, an InGaAsP layer, had been formed in advance by crystal growth. In this case, the corresponding step of growing such an optical waveguide in the subsequent process was omitted.

Figure 15B:
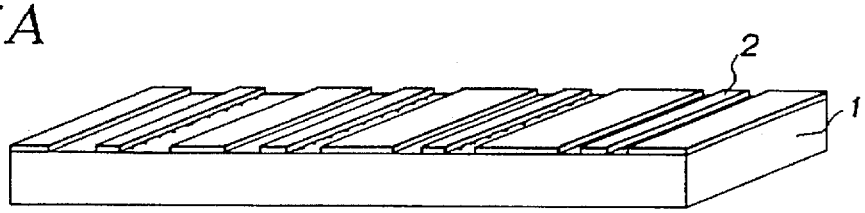
FIG. 15B is a perspective view showing a semiconductor substrate during a process for fabricating a four-channel integrated DFB laser diode array according to a fourth embodiment of the present invention, the semiconductor substrate being formed thereon with a mask for etching.
Figure 15C:
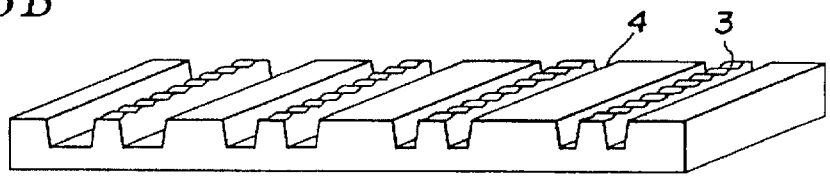
FIG. 15C is a perspective view showing a semiconductor substrate during a fabrication process (gap distance-modulated method) of a four-channel integrated DFB laser diode array according to a fourth embodiment of the present invention, the semiconductor substrate being formed therein with grooves to form a nonplanar substrate.
Figure 15D:
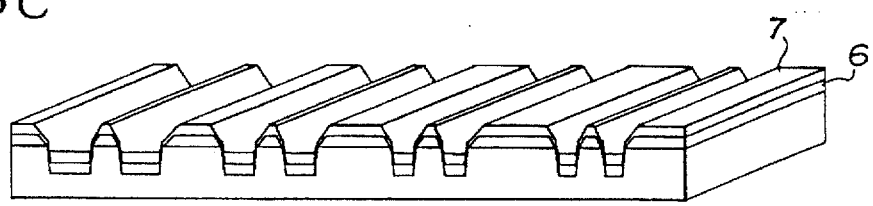
FIG. 15D is a perspective view showing a semiconductor substrate during a process for fabricating a four-channel integrated DFB laser diode array according to a fourth embodiment of the present invention, the semiconductor substrate being formed thereon with an active layer by a crystal growth (growth of an active layer)
Figure 15E:
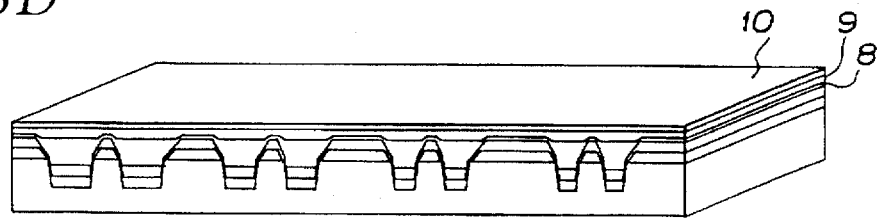
FIG. 15E is a perspective view showing a semiconductor substrate during a process for fabricating a four-channel integrated DFB laser diode array according to a fourth embodiment of the present invention, the semiconductor substrate being buried by a crystal growth (burying growth)
Figure 15F:
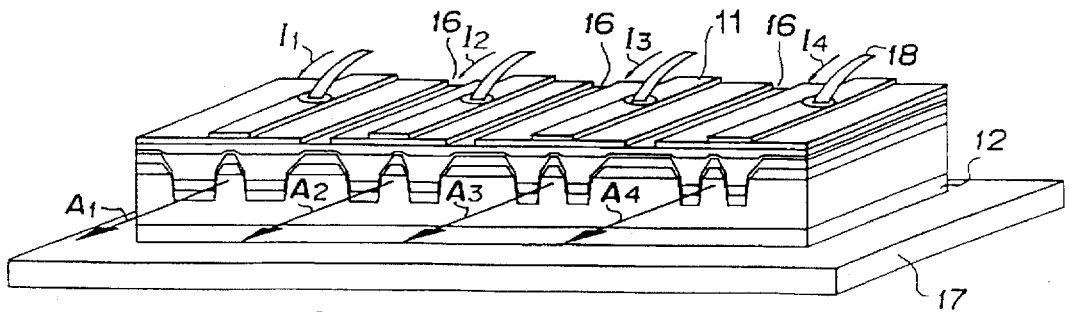
FIG. 15F is a perspective view showing a semiconductor substrate during a process for fabricating a four-channel integrated DFB laser diode array according to a first embodiment of the present invention, the semiconductor substrate being formed thereon with electrodes.
Figure 16:
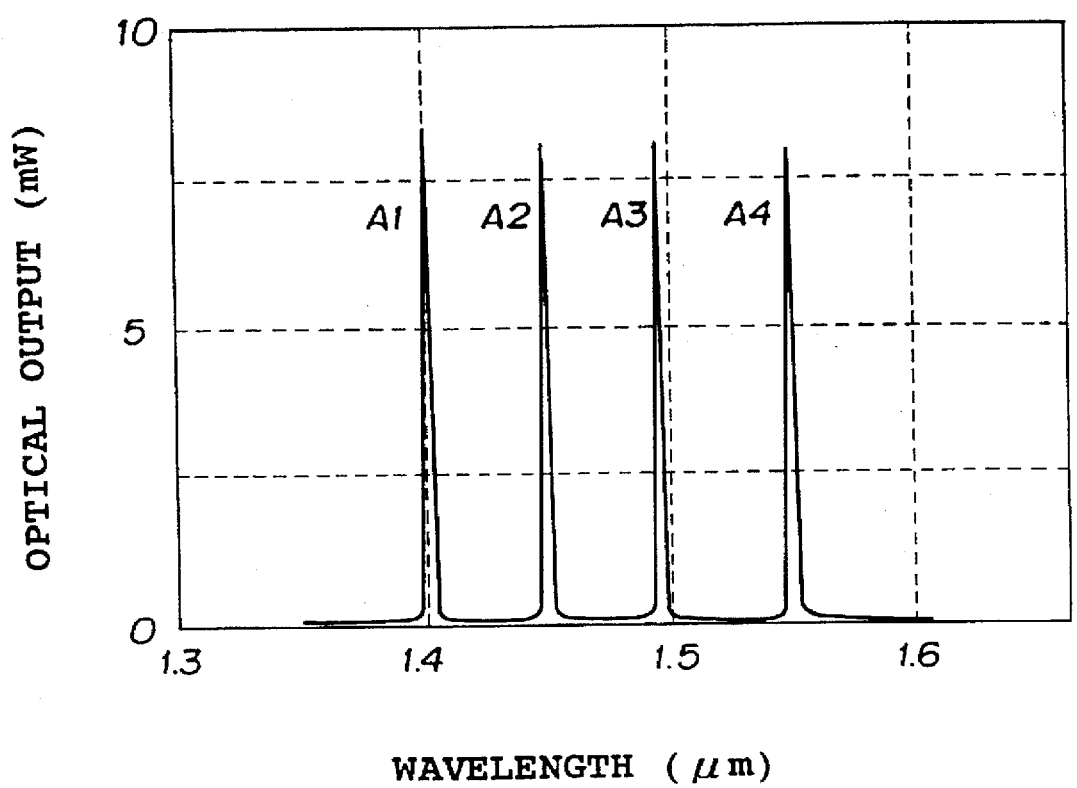
FIG. 16 is a graph illustrating oscillating characteristics of a four-channel laser diode array according to a fourth embodiment of the present invention.

Next, the same procedure as in Embodiment 3 were repeated. That is, after a stripe pattern consisting of an oxide or nitride layer 2 was formed as shown in FIG. 15B, the substrate was dry etched to give a nonplanar substrate having ridges 3 and grooves 4 as shown in FIG. 15C. Further, a semiconductor multilayer consisting of the active layer and optical waveguide 6 and the cladding layer 7 were grown on the nonplanar substrate 1 as shown in FIG. 15D, and the buried layers 8, 9 and 10 were grown on the layer 7 as shown in FIG. 15E. Then, p-type electrodes 11 were formed on the buried layer 10 while n-type electrodes 12 were formed on the substrate 1, the resulting structure being mounted on a heat sink 17, followed by attaching leads 18 to the electrodes 11. Isolation grooves 16 were formed in the buried layer 10 to electrically isolate the electrodes 11. When currents $I_1$, $I_2$, $I_3$ and $I_4$ were injected into the ridges 3, there was observed emission of laser beams $A_1$, $A_2$, $A_3$ and $A_4$ in a direction indicated by arrows shown in FIG. 15F. As shown in FIG. 16, there were obtained 4-wavelength integrated emissions $A_1$, $A_2$, $A_3$ and $A_4$ each in a single mode.

Embodiment 5 Ridge Width-Modulated Laser Diode Array

The instant embodiment relates to a fabrication of an LD array having a ridge 3 that has a constant height, h, and a constant gap distance, dg, with the width, dw, being varied in four ways. FIGS. 17A through 17E show a fabrication process for fabricating an LD array according to the instant embodiment.

Figure 17A:
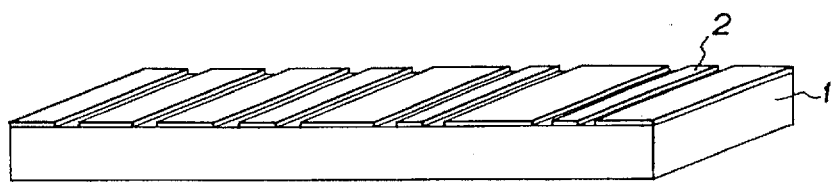
FIG. 17A is a perspective view showing a semiconductor substrate during a process for fabricating a four-channel integrated laser diode array according to a fifth embodiment of the present invention, the semiconductor substrate being formed thereon with a mask for etching.
Figure 17B:
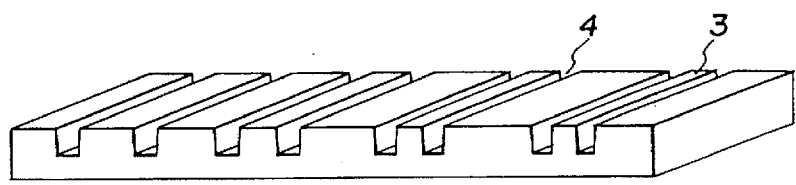
FIG. 17B is a perspective view showing a semiconductor substrate during a fabrication process (ridge width-modulated method) of a four-channel integrated laser diode array according to a fifth embodiment of the present invention, the semiconductor substrate being formed therein with grooves to form a nonplanar substrate.

A stripe pattern made of an oxide or nitride layer 2 was formed on an n-InP (100) substrate 1 by photolithography as shown in FIG. 17A. The substrate was dry etched with chlorine gas to form a nonplanar substrate with ridges 3 and grooves 4 of a ridge width-modulated type as shown in FIG. 17B. Here, the ridge height, h, and the gap distance, dg, were fixed to 2 µm and 1.5 µm, respectively, and the ridge width, dw, was varied from 1.5 µm at the rightmost side toward 2.0 µm, 2.5 µm and 3.0 µm at the leftmost side.

Figure 17C:
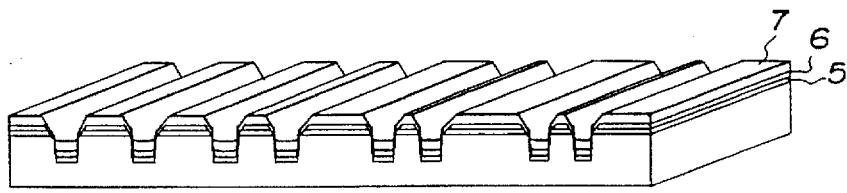
FIG. 17C is a perspective view showing a semiconductor substrate during a process for fabricating four-channel integrated laser diode array according to a fifth embodiment of the present invention, the semiconductor substrate being formed thereon with an active layer by a crystal growth (growth of an active layer)

Subsequently, there was formed on the nonplanar substrate a crystal having an active layer 6 of a strained MQW structure consisting of 5-periods of InGaP well (20 Å)/InGaAsP barrier (150 Å) together with the semiconductor layers 5 and 7 in the same manner as in Embodiment 3, as shown in FIG. 17C.

Figure 17D:
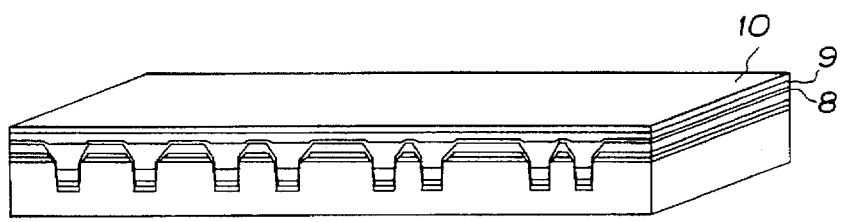
FIG. 17D is a perspective view showing a semiconductor substrate during a process for fabricating a four-channel integrated laser diode array according to a fifth embodiment of the present invention, the semiconductor substrate being buried by a crystal growth (burying growth)
Figure 17E:
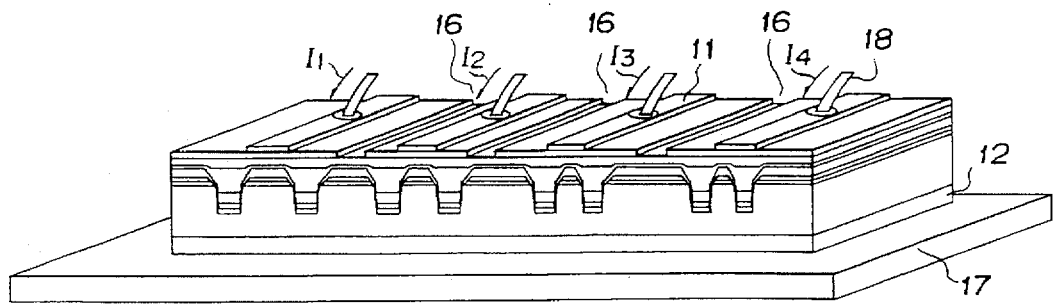
FIG. 17E is a perspective view showing a semiconductor substrate during a process for fabricating a four-channel integrated laser diode array according to a fifth embodiment of the present invention, the semiconductor substrate being formed thereon with electrodes.

Further, embedding regrowth was performed to form buried layers 8, 9 and 10 in the same manner as in Embodiment 3 to obtain a structure as shown in FIG. 17D. Also, formation of electrodes 11 and 12 and subsequent procedure including mounting of the device on a heat sink 17 were performed in the same manner as in Embodiment 3 to finally obtain a four-wavelength integrated laser diode array as shown in FIG. 17E. This had oscillating characteristics similar to those illustrated in FIG. 16. That is, oscillating spectrum on a planar substrate was observed to have a peak at 1.3 µm while the peak emission from the active layer on the ridge varied from 1.55 µm, to 1.5 µm, 1.45 µm, and 1.4 µm according as the ridge width increases from 1.5 µm to 2.0 µm, 2.5 µm, and 3.0 µm.

Embodiment 6 Detector

The instant embodiment relates to a detector having the same structure as the light emitting device of Embodiment 1 except that the active layer in the structure of Embodiment 1 was replaced by a detecting layer. This detector was fabricated by the same process as in Embodiment 1. The detector of the instant embodiment like light emitting devices responded to light having a wavelength corresponding to the composition of the detecting layer formed on the ridge. Therefore, optical response was able to be detected by inputting light in a direction opposite to that of the arrow in FIG. 9F and detecting current generated in the electrode 11. For example, a detector having a 1.3 µm-composition did not respond to a 1.55 µm beam inputted through an end face while when both 1.3 µm and 1.55 µm light beams were inputted simultaneously, the detector responded to a light beam of 1.3 µm alone.

Embodiment 7 Integrated Optical Device

Various other optical functional devices can be realized by fabrication processes similar to the process shown in FIGS.

9A through 9F. For example, there can be fabricated optical waveguides having different optical characteristics depending on different compositions, optical modulators or optical switches operating within specified wavelength regions, wide-band semiconductor amplifiers, etc. Simultaneous fabrication of these on one semiconductor substrate results in the realization of integrated optical devices having high interdevice coupling efficiencies.

Figure 18:
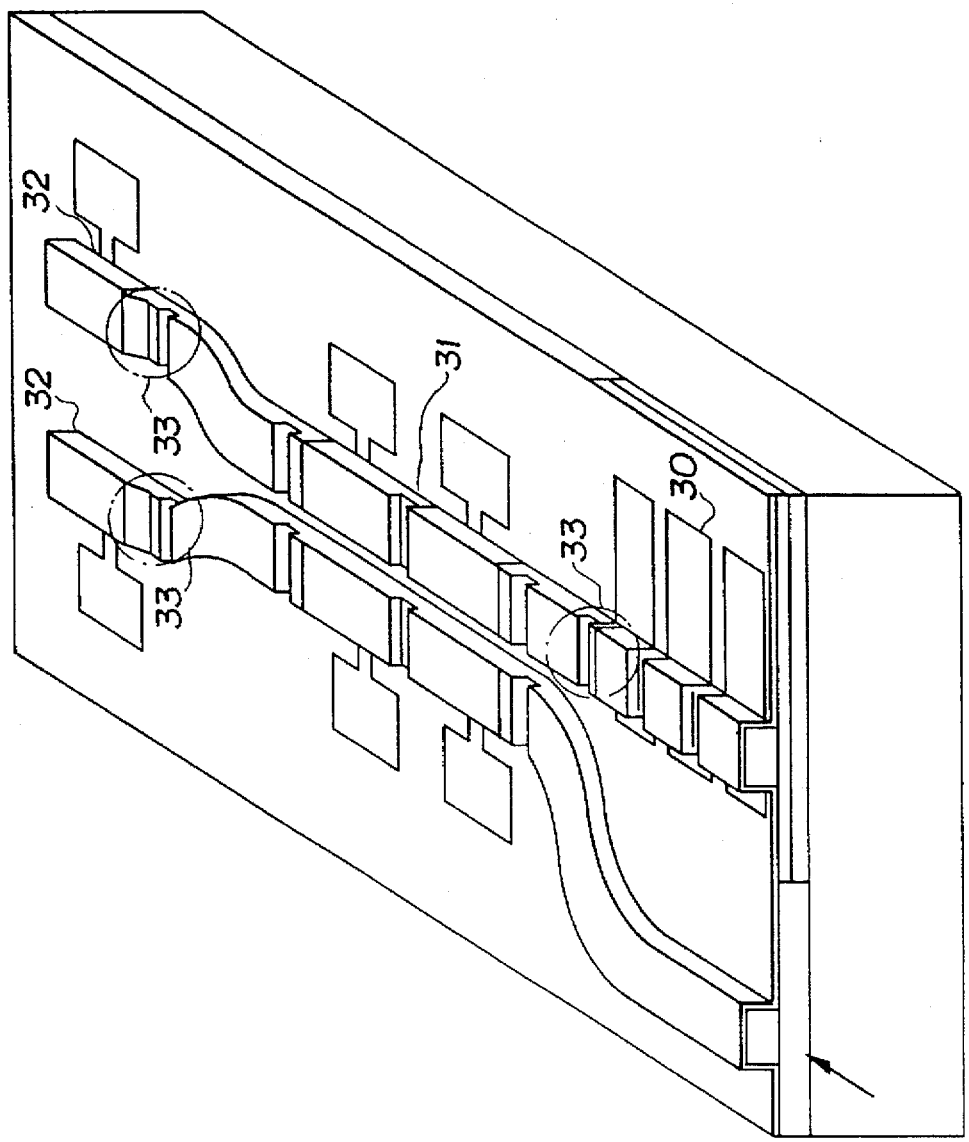
FIG. 18 is a schematic perspective view showing a monolithic heterodyne receiver according to a seventh embodiment of the present invention.

More concretely, there can be cited as an example a monolithic integrated optical circuit for use in receivers in coherent communication systems. As shown in FIG. 18, this integrated circuit includes a wavelength-tunable multielectrode DFB laser 30 as a local oscillation light source, a directional coupler-type 3 dB coupler 31, a waveguide-type PIN photodetector 32, a butt-joint portion 33, and optical waveguides for transmitting optical signals. By combination of 4- or 5-times of crystal growths and high processing techniques, there have already been realized a device which affords fundamental operations (Takeuchi, et al., Denshi Joho Tsushin Gakkai Ronbunshi, C-f1, Vol. J73-J-1, No. 5, pp360–367, May 1990) (The Institute of Electronics, Information and Communication Engineers, transactions, C-f1, Vol. J73-J-1, No. 5, pp 360–367, May 1990).

However, the above-described device has insufficient characteristics, not to speak of optical coupling efficiency, because of repetition of the process many times. According to the present invention, the above-described integrated optical circuit can be realized by only one growing operation if only a mask pattern is formed on the substrate in the beginning, and the product has excellent characteristics to begin with coupling efficiency. This makes crystal growth and the process simplified so that fabrication cost can be reduced greatly.

As described concretely by Embodiments 1 to 7 above, the present invention enables one to relatively easily realize optical devices including a semiconductor substrate on which a plurality of optical functional devices are arranged whose optical characteristics differ slightly from each other, or on which optical functional devices are integrated at high density. This makes a rapid progress in optical communication.

Embodiment 8 Gap Distance-Modulated Superluminescent Photodiode (SLD)

FIGS. 19A through 19E show a process for fabricating a gap distance-modulated superluminescent photodiode (SLD) according to the instant embodiment. In this embodiment, the ridge width and ridge height were made constant, and the gap distance was varied in five ways.

Figure 19A:
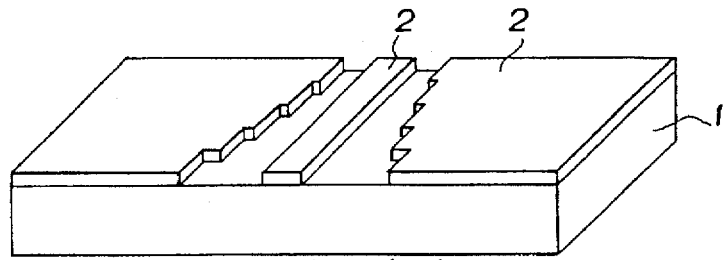
FIG. 19A is a perspective view showing a semiconductor substrate during a fabrication process (gap distance-modulated method) of a superluminescent diode according to an eighth embodiment of the present invention, the semiconductor substrate being formed thereon with a mask for etching.

As shown in FIG. 19A, a stripe pattern made of an oxide or nitride layer 2 was formed on an n-InP (100) substrate 1 by photolithography. This pattern was constructed by a stripe which corresponded to a ridge to be formed and two mask pieces sandwiching the stripe therebetween. The masks were in the form of a plateau stepped along the length of the stripe. When an optical waveguide, for example, an InGaAsP layer, was grown on the n-InP substrate before the patterning, the corresponding growth step in the subsequent crystal growth was able to be omitted.

Figure 19B:
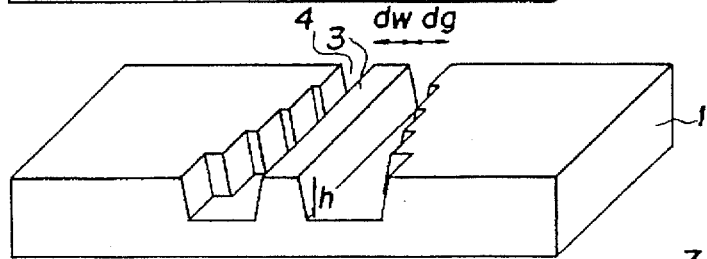
FIG. 19B is a perspective view showing a semiconductor substrate during a fabrication process (gap distance-modulated method) of a superluminescent diode according to an eighth embodiment of the present invention, the semiconductor substrate being formed therein with grooves to form a nonplanar substrate.

Next, the substrate was dry etched with chlorine gas to form a nonplanar substrate with ridges 3 and grooves 4 of a gap distance-modulated type as shown in FIG. 19B. Here, the ridge 3 was formed in a direction of <011> (so-called "anti-mesa" direction), and the ridge width, dw, and the ridge height, h, were set to 1.5 µm and 2 µm, respectively. The gap distance, dg, was set, at every 300 µm along the length of the ridge, to 1.5 µm, 3.0 µm, 3.5 µm and 4.0 µm, and 10.0 µm.

Figure 19C:
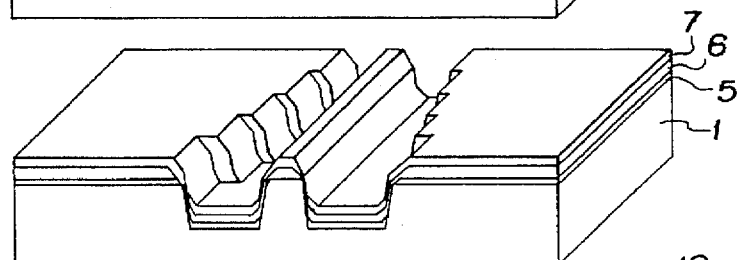
FIG. 19C is a perspective view showing a semiconductor substrate during a process for fabricating a superluminescent diode according to an eighth embodiment of the present invention, the semiconductor substrate being formed thereon with an active layer by a crystal growth (growth of an active layer)

Subsequently, there were formed, on the nonplanar substrate 1, an InP buffer layer 5, an active layer 6 having an InGaAsP waveguide layer and a strained MQW structure consisting of 5-periods of InGaP well (20 Å)/InGaAsP barrier (150 Å), and a p-InP layer 7, as shown in FIG. 19C. These layers were grown by MOVPE using TMI, TMG, $ASH_3$, and $PH_3$ as source gases for fabricating semiconductors and selenium hydride and diethylzinc as doping gases at 630° C. and at 0.1 atm.

The spectrum on a planar substrate observed by a photoluminescence method had a peak at 1.3 µm while the peak emission from the active layer on the ridge whose adjacent grooves was of a gap distance of 1.5 µm, 3.0 µm, 3.5 µm, 4.0 µm or 10.0 µm varied from 1.55 µm, to 1.5 µm, 1.45 µm, 1.4 µm, or 1.35 µm, respectively.

Figure 19D:
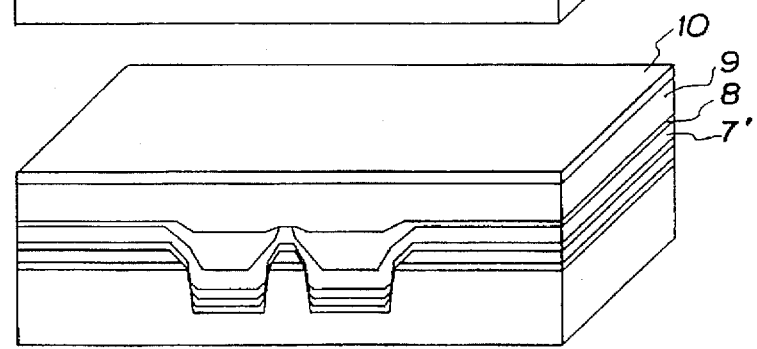
FIG. 19D is a perspective view showing a semiconductor substrate during a process for fabricating a superluminescent diode according to an eighth embodiment of the present invention, the semiconductor substrate being buried by a crystal growth (burying growth)

Further, using MOVPE, a p-InP cladding layer 7' was overgrown on the p-InP cladding layer 7, and then an n-InP layer 8 and a p-InP layer 9 were grown on the cladding layer 7 for blocking current. Thereafter, a p-InGaAsP contact layer 10 was formed as shown in FIG. 19D. The crystal growth steps shown in FIGS. 19C and 19D may be performed in one time by controlling the growth conditions. However, in order to exactly control the thickness of the buried layer and doping, the growth may be performed in two or three times dividedly.

Figure 19E:
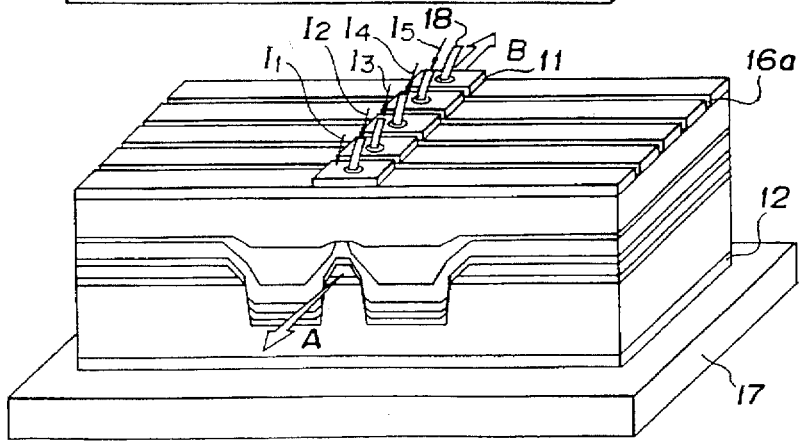
FIG. 19E is a perspective view showing a semiconductor substrate during a process for fabricating a superluminescent diode according to an eighth embodiment of the present invention, the semiconductor substrate being formed thereon with electrodes.

Thereafter, p-electrodes 11 and n-electrodes 12 were formed on the upper and lower faces of the substrate, and isolation grooves 16a for isolating individual portions which vary in the composition on the ridges were provided as shown in FIG. 19E.

The device thus fabricated was mounted on a heat sink 17, and wiring 18 was bonded. Upon injection of currents $I_1$ through $I_5$, highly directional light emissions dependent on the injected currents were observed in a direction shown by an arrow A in FIG. 19E. The emitted light beams corresponded to respective compositions of the active layers on the ridges, and also corresponded well to results of photoluminescence measurement indicated by thin solid lines $A_1$ through $A_5$ in FIG. 20.

Figure 20:
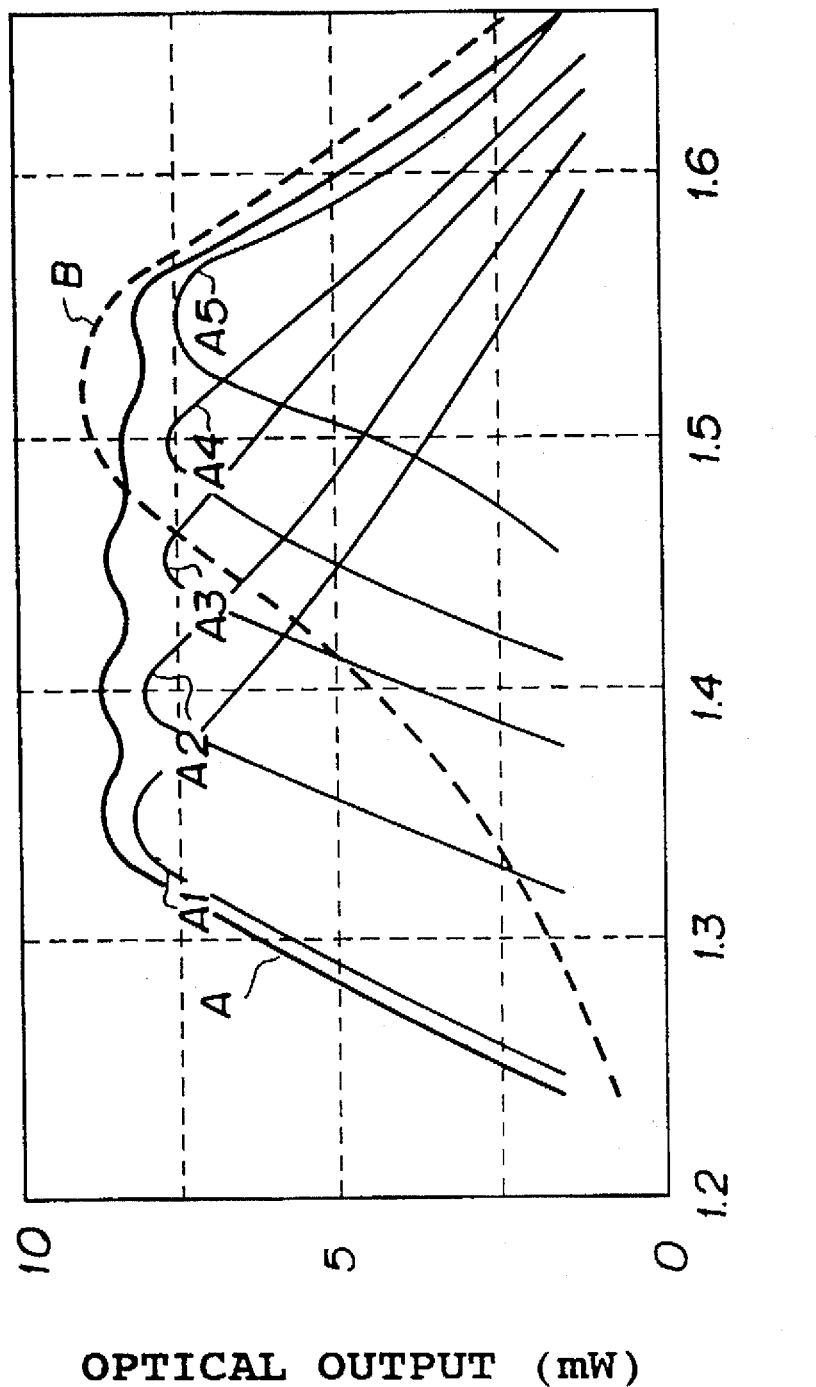
FIG. 20 is a graph illustrating oscillating spectrum characteristics of a superluminescent diode according to an eighth embodiment of the present invention.

When current was applied to all of the electrodes simultaneously, the device oscillated in a wide band ranging from 1.3 µm to 1.6 µm as shown in a thick solid line A in FIG. 20. Then, another emission was observed as shown in a thick broken line B in FIG. 20 in a direction indicated by an arrow B which is opposite to the direction indicated by the arrow A in FIG. 19. This is because light with a relatively short wavelength emitted on the front face is absorbed in a region opposite thereto.

Embodiment 9 Ridge Width-Modulated SLD

The instant embodiment relates to a ridge width-modulated SLD, and FIGS. 21A through 21E illustrate a process for fabricating such a ridge width-modulated SLD. In this embodiment, the groove width (gap distance and groove depth (ridge height) were kept constant while the ridge width was varied in five ways.

Figure 21A:
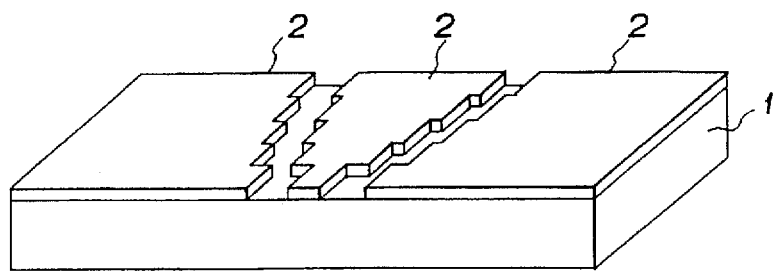
FIG. 21A is a perspective view showing a semiconductor substrate during a fabrication process (ridge width-modulated method) of a superluminescent diode according to a ninth embodiment of the present invention, the semiconductor substrate being formed thereon with a mask for etching.

As shown in FIG. 21A, a stripe pattern made of an oxide or nitride layer 2 was formed on an n-InP (100) substrate 1 by photolithography. This pattern was constructed by a polygonal stripe portion which included an expected ridge portion and two mask pieces sandwiching the stripe portion therebetween. The masks were in the form of a plateau stepped in width along the length of the stripe.

Figure 21B:
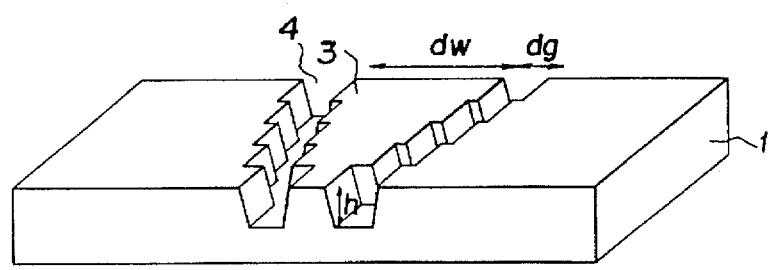
FIG. 21B is a perspective view showing a semiconductor substrate during a fabrication process (ridge width-modulated method) of a superluminescent diode according to a ninth embodiment of the present invention, the semiconductor substrate being formed therein with grooves to form a nonplanar substrate.

Next, the substrate was dry etched in the same manner as in Embodiment 8 to form a nonplanar substrate with a ridge 3 and grooves 4 of a gap distance-modulated type as shown in FIG. 21B. Here, the ridge 3 was formed in a direction of <011> (so-called "anti-mesa" direction). The ridge 3 had 5 kinds of ridge widths, dw, differing at every 300 μm along the length of the ridge, i.e., 1 μm, 2 μm, 3 μm, 4.0 μm, and 10.0 μm. The height of the ridge, h, was 2 μm, and the gap distance, dg, was 2.5 μm.

Figure 21C:
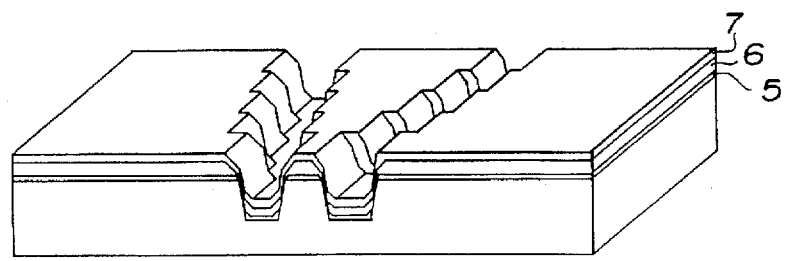
FIG. 21C is a perspective view showing a semiconductor substrate during a process for fabricating a superluminescent diode according to a ninth embodiment of the present invention, the semiconductor substrate being formed thereon with an active layer by a crystal growth (growth of an active layer)

Subsequently, the procedures of Embodiment 8 were repeated to grow, on the nonplanar substrate 1, an InP buffer layer 5, an active layer 6 including an InGaAsP waveguide layer and a strained MQW structure consisting of 5-periods of InGaP well (20 Å)/InGaAsP barrier (150 Å), and a p-InP layer 7, as shown in FIG. 21C.

The oscillating spectrum of the crystal grown on the ridge was measured by photoluminescence. The crystal had different peak wavelengths from crystal portion to crystal portion corresponding to different ridge widths. Thus, the peak wavelengths of 1.55 μm, 1.5 μm, 1.45 μm, 1.4 μm, and 1.35 μm corresponded to ridge widths of 1 μm, 2 μm, 3 μm, 4.0 μm, and 10.0 μm.

Figure 21D:
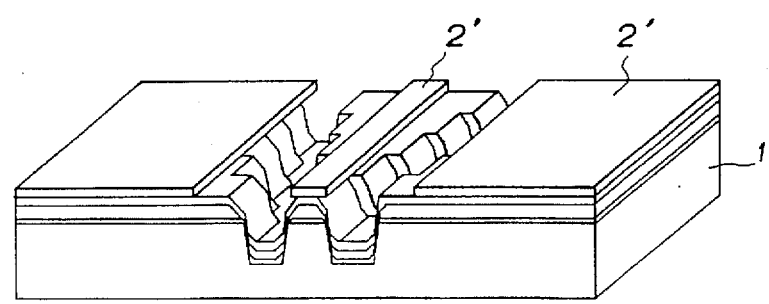
FIG. 21D is a perspective view showing a semiconductor substrate during a process for fabricating a superluminescent diode according to a ninth embodiment of the present invention, the semiconductor substrate being formed thereon a mask for etching.
Figure 21E:
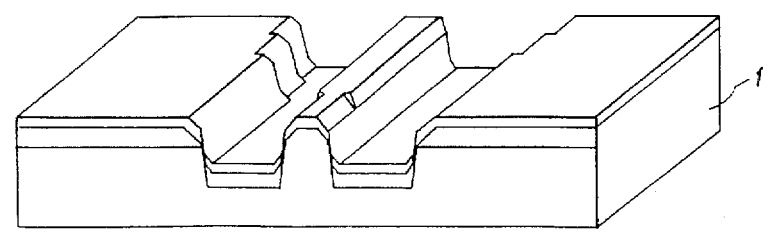
FIG. 21E is a perspective view showing a semiconductor substrate during a process for fabricating a superluminescent diode according to a ninth embodiment of the present invention, the semiconductor substrate being dry-etched to form a nonplanar substrate for burying growth.

Thereafter, in order to obtain a buried heterostructure, an oxide or nitride layer 2' was again formed as a mask as shown in FIG. 21D, followed by dry etching to obtain a structure as shown in FIG. 21E. Embedding regrowth and formation of electrodes were performed in the same manner as in Embodiment 8 to obtain structures similar to those shown in FIGS. 19D and 19E, respectively. The optical device thus fabricated had oscillating characteristics similar to that illustrated in FIG. 20.

Embodiment 10 Ridge Height-Modulated SLD

The instant embodiment relates to a ridge height-modulated SLD. FIGS. 22A through 22E illustrate a fabrication process for fabricating such a ridge height-modulated SLD. In the instant embodiment, the ridge width and groove width (gap distance) were kept constant while the ridge height (groove depth) was varied in five ways.

Figure 22A:
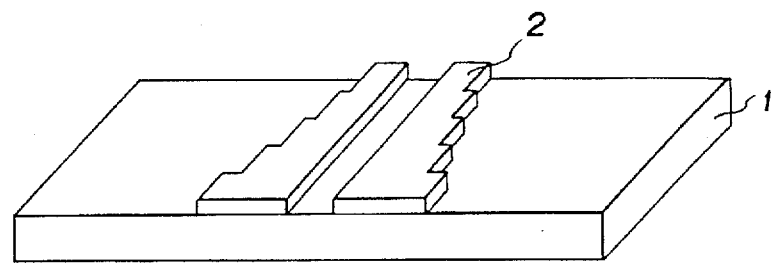
FIG. 22A is a perspective view showing a semiconductor substrate during a fabrication process (ridge height-modulated method 1) of a superluminescent diode according to a tenth embodiment of the present invention, the semiconductor substrate being formed thereon with a mask for selective growth.

First, as shown in FIG. 22A, a stripe pattern made of an oxide or nitride layer 2 was formed on an n-InP (100) substrate 1 by photolithography. This pattern comprises two plateau-shaped mask pieces, formed on the substrate 1 at a predetermined distance from each other so that a ridge was able to be formed therebetween. Each of the mask pieces 2 had portions stepped in width on the outer side as shown in FIG. 22A.

Figure 22B:
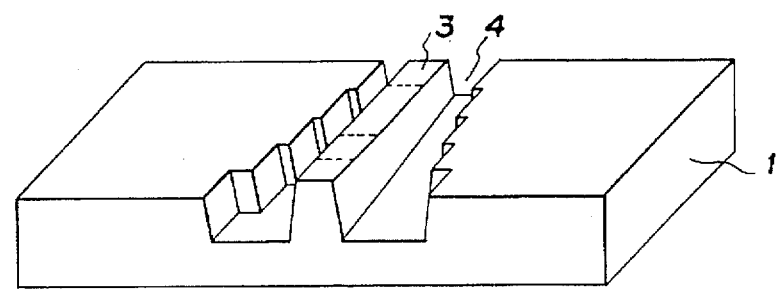
FIG. 22B is a perspective view showing a semiconductor substrate during a fabrication process (ridge height-modulated method 1) of a superluminescent diode according to a tenth embodiment of the present invention, the semiconductor substrate having become a nonplanar substrate (after removal of the mask)

Next, an n-InP layer was grown selectively to form a nonplanar substrate having a ridge sandwiched by two grooves with different groove widths or gap distances along the length of the ridge, as shown in FIG. 22B. The ridge thus formed had different heights along its length and, hence, stepped in height as shown in FIG. 22B, since growth rate varied depending on the width of the mask.

Here, the ridge 3 was formed in a direction of <011> (so-called "anti-mesa" direction). The ridge 3 had five kinds of ridge heights, h, differing at every 300 μm along the length of the ridge, i.e., 1.2 μm, 1.4 μm, 1.6 μm, 1.8 μm, and 2.0 μm. The width of the ridge, dw, was 1.5 μm, and the gap distance, dg, corresponded to the widths of the mask.

Figure 22C:
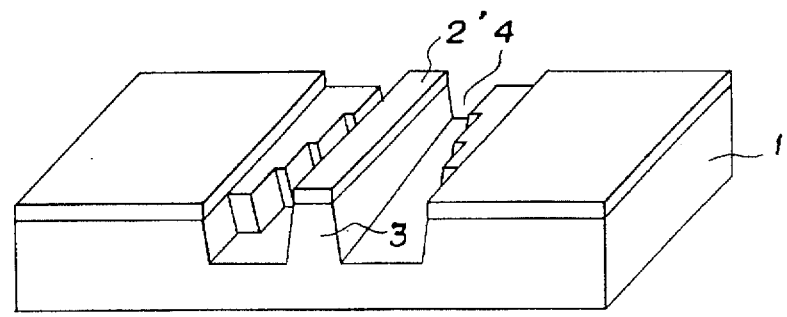
FIG. 22C is a perspective view showing a semiconductor substrate during a process for fabricating a superluminescent diode according to a tenth embodiment of the present invention, the semiconductor substrate being formed thereon a mask for etching.
Figure 22D:
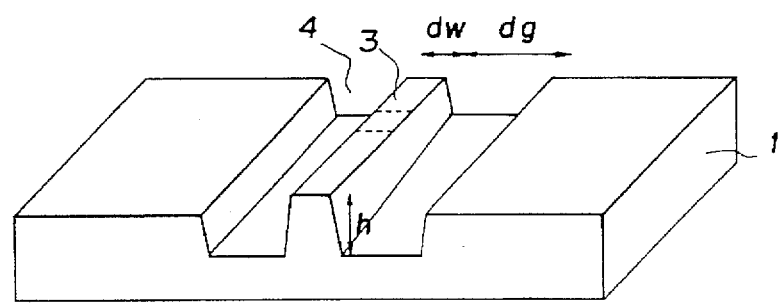
FIG. 22D is a perspective view showing a semiconductor substrate during a process for fabricating a superluminescent diode according to a tenth embodiment of the present invention, the semiconductor substrate being a nonplanar substrate for crystal growth with its ridge height being modulated.

Subsequently, in order to make the gap distance uniform, the oxide or nitride layer 2 was formed again as a mask as shown in FIG. 22C, and the substrate was dry etched to obtain a nonplanar substrate which differed only in ridge height, h, and had constant ridge width, dw, and gap distance, dg, along the length of the ridge as shown in FIG. 22D. The gap distance was adjusted to 2.5 μm uniformly.

Figure 22E:
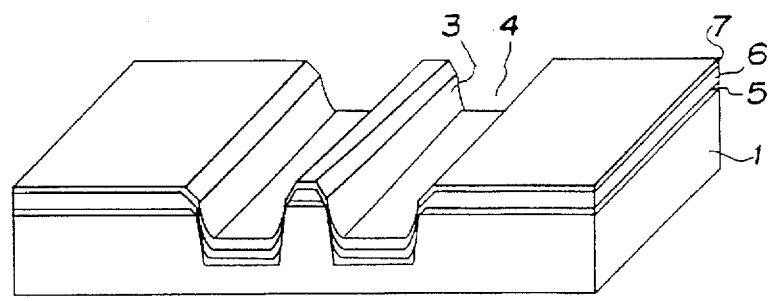
FIG. 22E is a perspective view showing a semiconductor substrate during a process for fabricating a superluminescent diode according to a tenth embodiment of the present invention, the semiconductor substrate being formed thereon with an active layer by a crystal growth (growth of an active layer)

Then, the procedures of Embodiment 8 were repeated to grow, on the nonplanar substrate 1, an InP buffer layer 5, an active layer 6 including an InGaAsP waveguide layer and a strained MQW structure consisting of 5-periods of InGaP well (20 Å)/InGaAsP barrier (150 Å), and a p-InP cladding layer 7, as shown in FIG. 22E.

The spectrum of the crystal grown on the ridge was measured by photoluminescence. The crystal had different peak wavelengths from crystal portion to crystal portion corresponding to different ridge heights. That is, there were obtained peak wavelengths of 1.35 μm, 1.4 μm, 1.45 μm, 1.5 μm, and 1.55 μm which corresponded to ridge heights of 1.35 μm, 1.4 μm, 1.45 μm, 1.5 μm, and 1.55 μm.

Further, embedding regrowth was performed in the same manner as in Embodiment 8 to give a structure similar to that shown in FIG. 19D, followed by formation of electrodes in the same manner as in Embodiment 8 to give an optical device similar to that shown in FIG. 19E. The optical device thus fabricated had oscillating characteristics similar to that illustrated in FIG. 20.

Variation

Figure 23A:
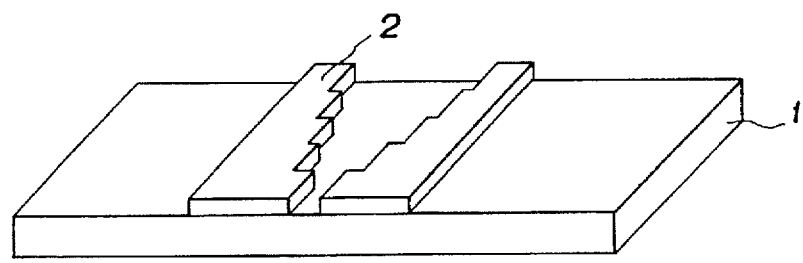
FIG. 23A is a perspective view showing a semiconductor substrate during a fabrication process (ridge height-modulated method 2) of a superluminescent diode according to a variation of the tenth embodiment of the present invention, the semiconductor substrate being formed thereon with a mask for selective growth.
Figure 23B:
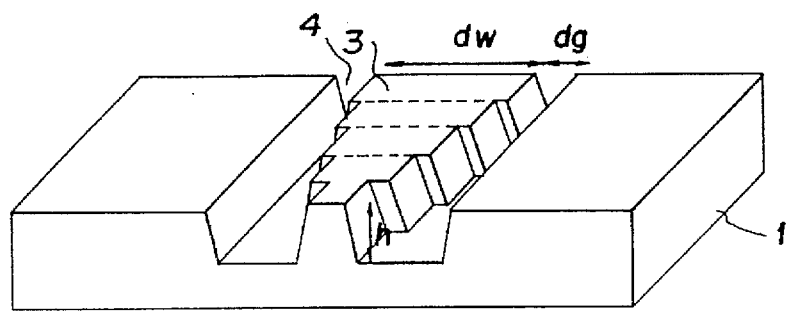
FIG. 23B is a perspective view showing a semiconductor substrate during a fabrication process (ridge height-modulated method 2) of a superluminescent diode according to a variation of the tenth embodiment of the present invention, the semiconductor substrate having become a nonplanar substrate (after removal of the mask)
Figure 23C:
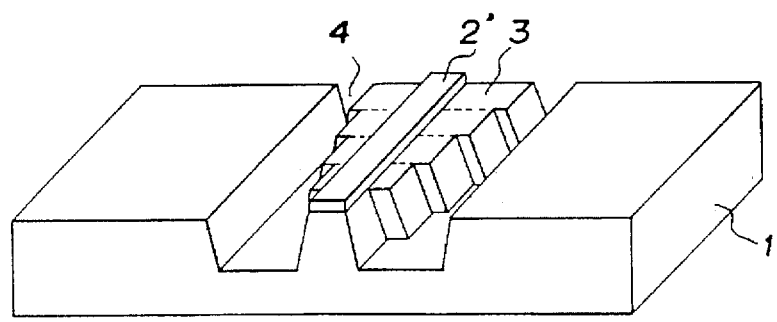
FIG. 23C is a perspective view showing a semiconductor substrate during a process for fabricating a superluminescent diode according to a variation of the eleventh embodiment of the present invention, the semiconductor substrate being formed thereon a mask for etching.

FIGS. 23A through 23C illustrate a variation of a process for fabricating a ridge height-modulated SLD according to Embodiment 10.

As shown in FIG. 23A, a mask 2 was so that two mask pieces were arranged in a relation inside out to the situation shown in FIG. 22A. After selective growth, a nonplanar substrate was fabricated whose ridge had various widths and heights along its length as shown in FIG. 23B. In order to make the ridge width uniform, an oxide or nitride layer 2' was formed again as shown in FIG. 23C, and the substrate was dry etched to give a nonplanar substrate of which only the ridge height varied, similar to the nonplanar substrate shown in FIG. 22D. The device thus fabricated had oscillating characteristics similar to that shown in FIG. 20.

Further, a ridge height-modulated SLD was fabricated in the same manner as in Embodiment 10 to have a structure similar to that shown in FIG. 22E. The device thus obtained had oscillating characteristics similar to that shown in FIG. 20.

As described concretely in Embodiments 8 to 10, highly integrated SLD can be realized by the present invention. Therefore, there is expected rapid progress in the development of measurement or evaluation methods making most of the advantage of wide-band oscillating wavelength characteristics.

Embodiment 11 Semiconductor Light Emitting Device with a Current Blocking Layer

FIGS. 24A through 24E illustrate a process for fabricating a light emitting device which has a current blocking layer in grooves of a nonplanar semiconductor substrate.

Figure 24A:
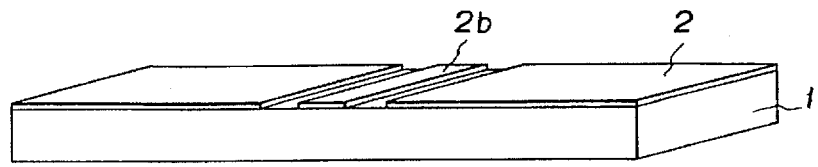
FIG. 24A is a perspective view showing a semiconductor substrate during a process for fabricating an optical device according to an eleventh embodiment of the present invention, the semiconductor substrate being formed thereon with an oxide mask for etching.
Figure 24B:
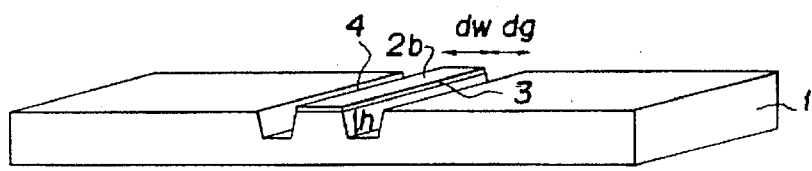
FIG. 24B is a perspective view showing a semiconductor substrate during a process for fabricating an optical device according to an eleventh embodiment of the present invention, the semiconductor substrate being formed therein with grooves to form a nonplanar substrate.

First, oxide layers 2, 2b (same composition) were formed on an n-InP substrate 1 for etching in a predetermined pattern for preparing a nonplanar semiconductor substrate as shown in FIG. 24A. Then, the n-InP substrate 1 was dry etched by reactive ion etching with chlorine gas so that grooves 4 were formed therein. Thereafter, the oxide layer 2 was removed while the oxide layer 2b on the ridge was left as was. Thus, there was obtained a nonplanar substrate having a ridge width, dw, a ridge height, h, and a gap distance, dg, as shown in FIG. 24B.

Figure 24C:
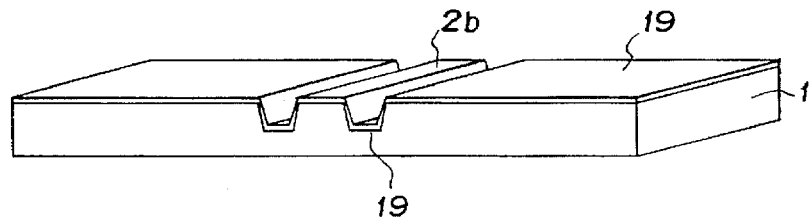
FIG. 24C is a perspective view showing a semiconductor substrate during a process for fabricating an optical device according to an eleventh embodiment of the present invention, the nonplanar semiconductor substrate being formed thereon with a block layer.

On this nonplanar substrate was a p-InP layer 19 was grown to a thickness of from about 0.2 μm to 0.3 μm by MOVPE at a pressure of 70 Torr and at a substrate temperature of from about 600° C. to 700° C. with feeding TMI, $PH_3$, and diethylzinc ($Zn(C_2H_5)_2$) as a p-type dopant as shown in FIG. 24C. The thin film layer thus grown which had a conductivity type different from that of the nonplanar substrate will be referred to hereinafter to "current blocking layer".

Figure 24D:
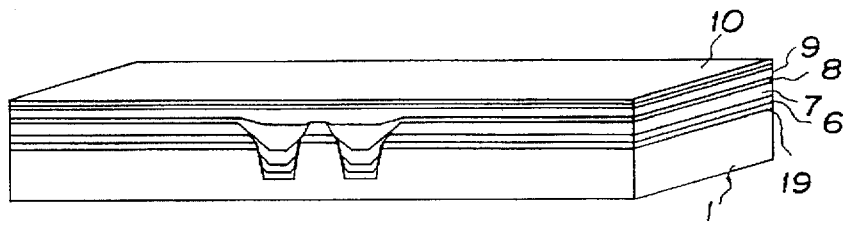
FIG. 24D is a perspective view showing a semiconductor substrate during a process for fabricating an optical device according to an eleventh embodiment of the present invention, the semiconductor substrate being formed with a device structure by MOVPE growth.

Next, the oxide layer 2b on the ridge 3 was removed and there were formed an MQW active layer 6 and an in-groove MQW layer 6a, both layers having a composition of InGaAsP/InGaAs. These layers 6 and 6a were formed by feeding predetermined amounts (flow rates) of TEGa, AsH$_3$, TMI, and PH$_3$ in a manner such that 1.1 μm-InGaAsP thin film of 150 Å thick and InGaAs thin film of 20 Å were grown alternately in, for example, 4 to 6 periods, to form an MQW structure. Subsequently, a p-InP cladding layer 7, an n-InP buried layer 8, a p-InP layer 9, a p-InGaAsP contact layer 10 were grown in this order to obtain a buried heterostructure as shown in FIG. 24D.

Figure 24E:
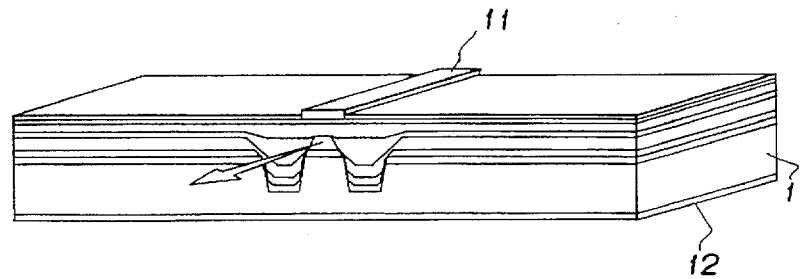
FIG. 24E is a perspective view showing a semiconductor substrate during a process for fabricating an optical device according to an eleventh embodiment of the present invention, the semiconductor substrate being formed thereon with electrodes.

The process according to the instant embodiment enables controlling oscillating wavelength of the fabricated light emitting device to within the range of from 1.3 μm to 1.6 μm depending on the shape factors of the semiconductor substrate, i.e., ridge width, dw, gap distance, dg, and ridge height, h. In the process of the instant embodiment, since the p-InP current blocking layer 19 was to be formed first, adjustment of the ridge height was necessary. It was sufficient to adjust the ridge height by making the ridge height, i.e., groove depth, prior to the growth of the current blocking layer (cf. FIG. 24B) larger than what should be obtained finally by a decrease in the groove depth by the growth of a current blocking layer, i.e., by the thickness of the current blocking layer to be grown. Thereafter, a p-electrode 11 was formed on a portion of the contact layer 10 just above the ridge 3 while an n-electrode 13 was formed on the side of the semiconductor substrate to fabricate a light emitting diode chip as shown in FIG. 24E.

Figure 25:
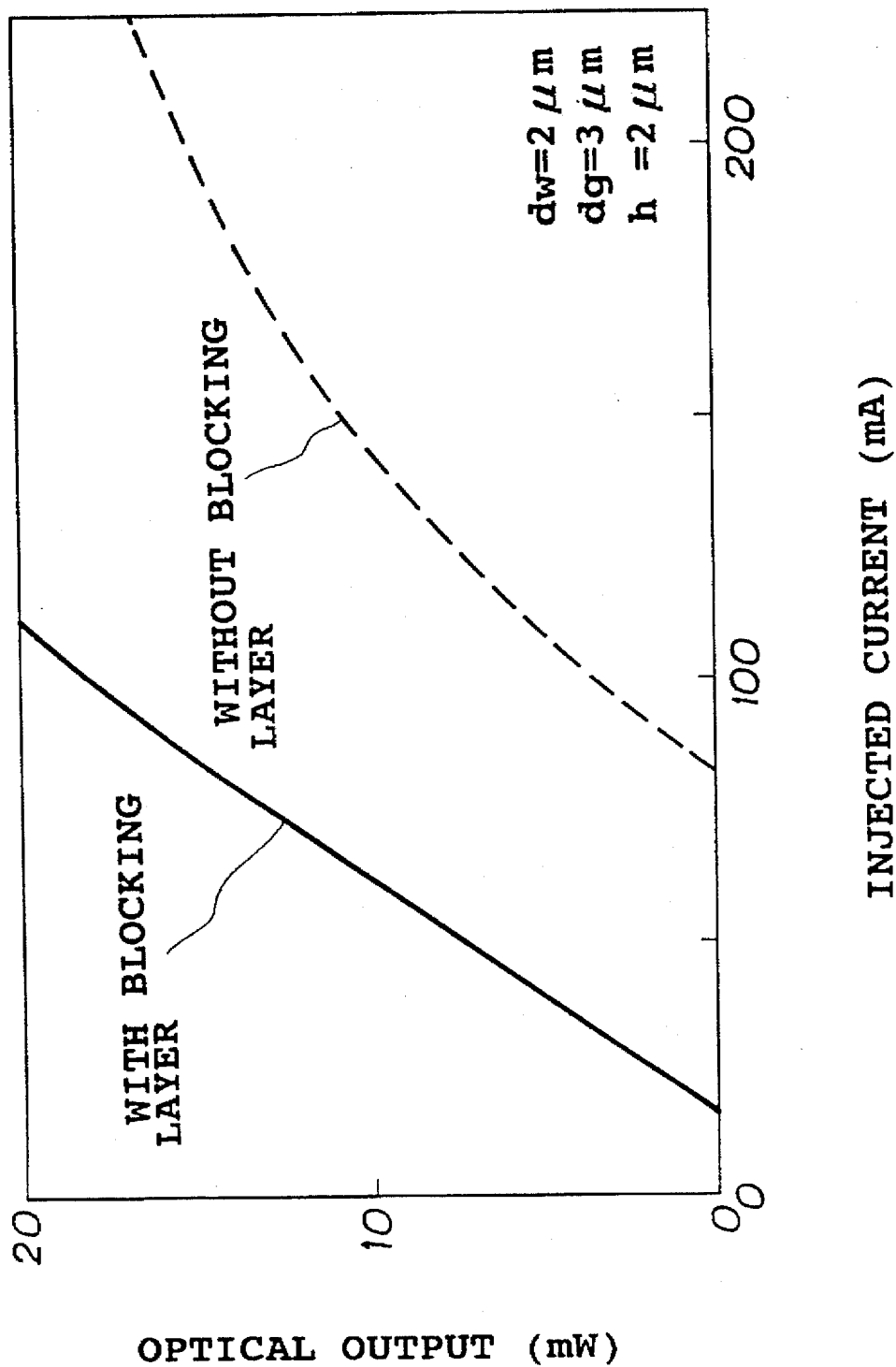
FIG. 25 is a graph illustrating the oscillating characteristics of an optical device according to an eleventh embodiment of the present invention.

FIG. 25 is a graph which illustrates the oscillating characteristics of the light emitting device fabricated by the above-described process in solid line. For comparison, the oscillating characteristics of a similar light emitting device having no current blocking layer was indicated in broken line. In the instant embodiment, provision of a current blocking layer resulted in decrease in threshold of injected current and high linearity to increase oscillating efficiency and output. Hence, it was confirmed that the introduction of p-InP current blocking layer 19 improved the oscillating characteristics considerably.

Embodiment 12 Light Emitting Device with a Buffer Layer

FIGS. 26A to 26D illustrate a fabrication process for fabricating a light emitting device having an n-InP thin film layer as a buffer layer grown on a nonplanar semiconductor substrate in order to avoid the occurrence of a damaged layer during the preparing the nonplanar semiconductor substrate so that the oscillating characteristics can be improved. To examine influences of the presence of a buffer layer and the shape of the ridge, two types of light emitting devices were fabricated which had buffer layers of normal-mesa and anti-mesa structures, respectively.

Figure 26A:
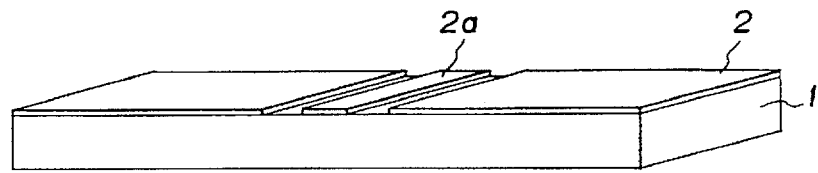
FIG. 26A is a perspective view showing a semiconductor substrate during a process for fabricating an optical device according to a twelfth embodiment of the present invention, the semiconductor substrate being formed thereon with an oxide mask for etching.

First, an oxide layer 2 was formed on an n-InP substrate 1 for etching in a predetermined pattern as shown in FIG. 26A.

Figure 26B:
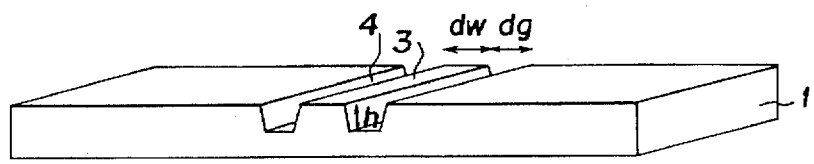
FIG. 26B is a perspective view showing a semiconductor substrate during a process for fabricating an optical device according to a twelfth embodiment of the present invention, the semiconductor substrate being formed therein with grooves to form a ridge of a mesa structure.
Figure 26C:
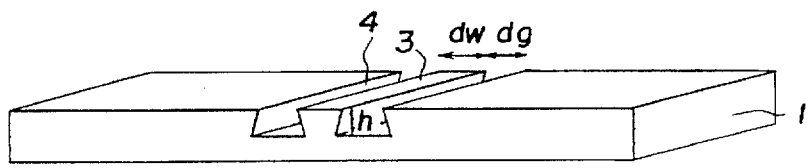
FIG. 26C is a perspective view showing a semiconductor substrate during a process for fabricating an optical device according to a twelfth embodiment of the present invention, the semiconductor substrate being formed therein with grooves to form a ridge of an anti-mesa structure.

Next, the substrate 1 was dry etched by reactive ion etching (RIE) with, for example, chlorine gas to form grooves 4 so that the n-InP substrate 1 was able to have a ridge 3 of a normal-mesa structure to obtain a normal-mesa type nonplanar semiconductor substrate (FIG. 26B). On the other hand, another n-InP substrate 1 having the oxide layer 2 was wet etched with bromine-containing etchant, for example, an aqueous solution of hydrobromic acid (3HBr+ H$_2$O) to fabricate an anti-mesa type nonplanar semiconductor substrate having a ridge 3 of an anti-mesa structure (FIG. 26C). Thereafter, the oxide layer 2 was removed from the both types of the semiconductor substrates.

Figure 26D:
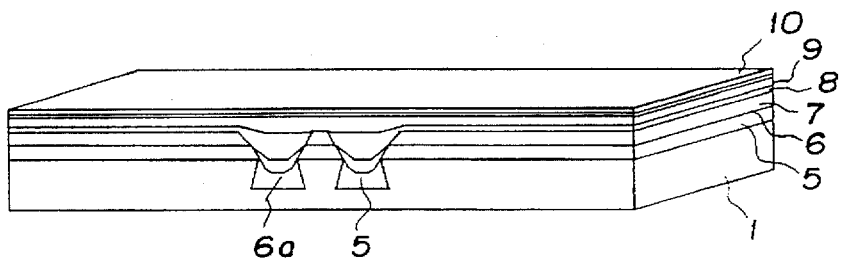
FIG. 26D is a perspective view showing a semiconductor substrate during a process for fabricating an optical device according to a twelfth embodiment of the present invention, the nonplanar semiconductor substrate being formed thereon with a device structure by MOVPE growth.
Figure 26E:
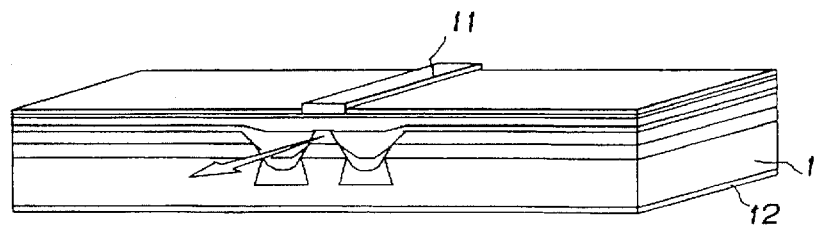
FIG. 26E is a perspective view showing a semiconductor substrate during a process for fabricating an optical device according to a twelfth embodiment of the present invention, the semiconductor substrate being formed thereon with an electrode.

Then, a buffer layer 5 was grown to a thickness of about 0.1 μm to 1.0 μm. The growth was performed by MOVPE at a pressure of 70 Torr and a substrate temperature within the range of from about 600° C. to 700° C., with feeding as the source material TMI and PH$_3$ as well as selenium hydride (H$_2$Se) as an n-type dopant. Subsequently, there were formed an MQW active layer 6 and an in-groove MQW layer 6a, both layers having a composition of InGaAsP/InGaAs. These layers 6 and 6a were formed by feeding predetermined amounts (flow rates) of TEGa, AsH$_3$, TMI, and PH$_3$ in a manner such that 1.1 μm-InGaAsP thin film of 150 Å thick and InGaAs thin film of 20 Å thick were superimposed alternately in, for example, 4 to 6 periods, to form a MQW striker. Further, a p-InP cladding layer 7, an n-InP buried layer 48, a p-InP layer 9, a p-InGaAsP contact layer 10 were grown in this order to obtain a buried heterostructure as shown in FIG. 26D. Finally, a p-electrode 11 was formed on a part of the contact layer 10 just above the ridge 3, and an n-electrode 12 was formed on the side of the semiconductor substrate. Thus, a light emitting diode chip of the present invention was fabricated (FIG. 26E).

The process according to the instant embodiment enables one to control the oscillating wavelength of a fabricated light emitting diode to within the range of from 1.3 μm to 1.6 μm depending on the shape factors of the semiconductor substrate, i.e., ridge width, dw, gap distance, dg, and ridge height, h.

Figure 27:
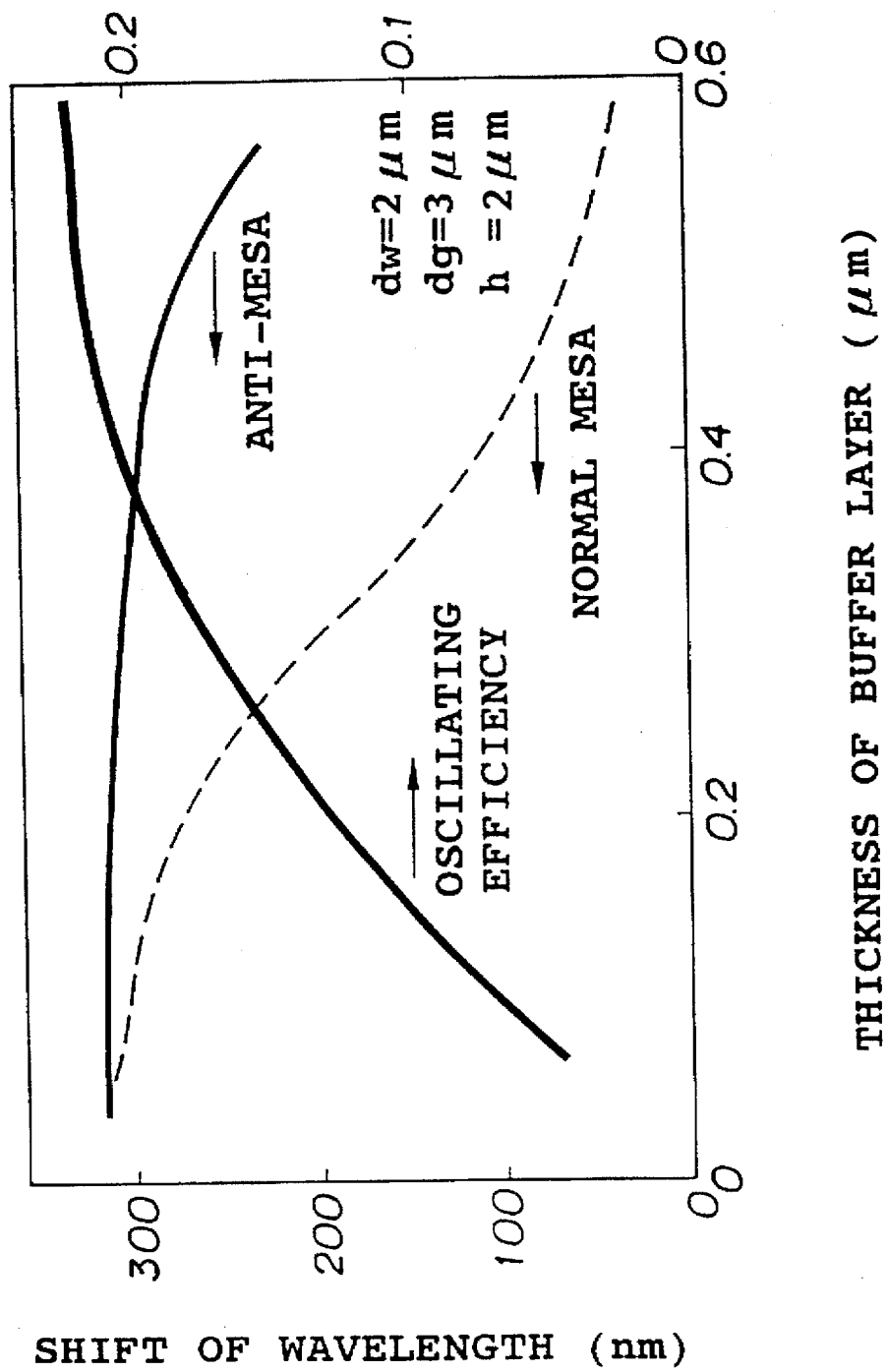
FIG. 27 is a graph illustrating the optical characteristics of an optical device according to a twelfth embodiment of the present invention.

FIG. 27 is a graph which illustrates the oscillating characteristics of the semiconductor light emitting diode fabricated by the above-described process. More particularly, FIG. 27 illustrates the dependence of oscillating efficiency (thick solid line) and wavelength shift (thin solid line for anti-mesa type, and broken line for normal-mesa type) on the thickness of a buffer layer. Oscillating efficiency was independent of the shape of the mesa and varied considerably depending on the thickness of the buffer layer in the same fashion regardless of whether it was of a normal-mesa structure or of an anti-mesa structure, as indicated by thick solid line. From FIG. 27, it can be seen that provision of a buffer layer improved the oscillating characteristics by about 5 times as high as that exhibited by the structure having no buffer layer. This improvement is believed to be attributable to the phenomenon that the more improved quality of the crystal, the thicker the buffer layer.

Further, it can be seen that assuming wavelength shift is a wavelength region in which the oscillating wavelength can be controlled, the wavelength shift decreased steeply with increase in the thickness of the buffer layer in the case of a normal-mesa structure while this decrease was relatively moderate in the case of an anti-mesa structure. This tendency is believed to be attributable to the fact that the effective depth of groove (ridge height), h, decreases during the growth of the buffer layer, and this decrease in effective ridge height is alleviated more in anti-mesa structures than in normal-mesa structures since the former have greater volume than the latter. The oscillating characteristics illustrated in FIG. 27 indicates that provision of a buffer layer and anti-mesa structure of a ridge structure are effective for further improvement of the oscillating characteristics of a light emitting device.

Embodiment 13 Semiconductor Light Emitting Device Having a Damage Absorbing Layer It is known that while a nonplanar semiconductor substrate is being formed, particularly when an oxide layer is formed and when dry etching, for example RIE with chlorine, damages tend to occur in the semiconductor substrate and the quality of crystals grown thereon deteriorates, resulting in deteriorated characteristics of the resulting light emitting device. The instant embodiment is intended to prevent this deterioration by provision of a damage absorbing layer on the semiconductor substrate.

FIGS. 28A to 28D illustrate a fabrication process for fabricating a semiconductor light emitting diode having a damage absorbing layer.

Figure 28A:
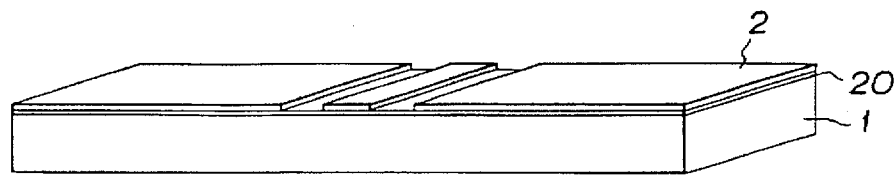
FIG. 28A is a perspective view showing a semiconductor substrate during a process for fabricating an optical device according to a thirteenth embodiment of the present invention, the semiconductor substrate being formed thereon with an oxide mask for etching via a damage absorbing layer.
Figure 28B:
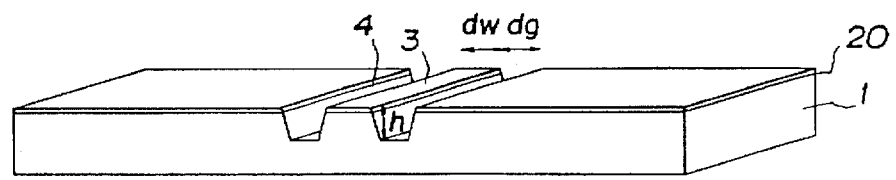
FIG. 28B is a perspective view showing a semiconductor substrate during a process for fabricating an optical device according to a thirteenth embodiment of the present invention, the semiconductor substrate being formed therein with grooves to form a nonplanar substrate (prior to removal of a damage absorbing layer)
Figure 28C:
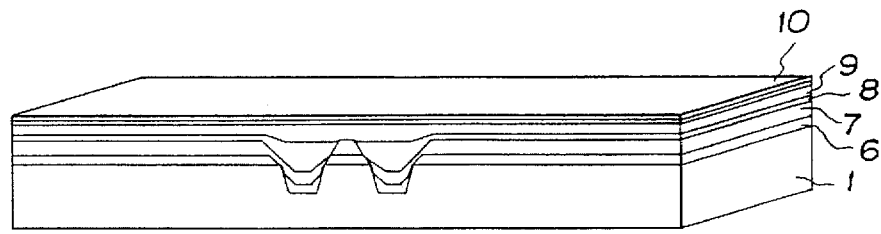
FIG. 28C is a perspective view showing a semiconductor substrate during a process for fabricating an optical device according to a thirteenth embodiment of the present invention, the nonplanar semiconductor substrate being formed thereon with a device structure by MOVPE growth.
Figure 28D:
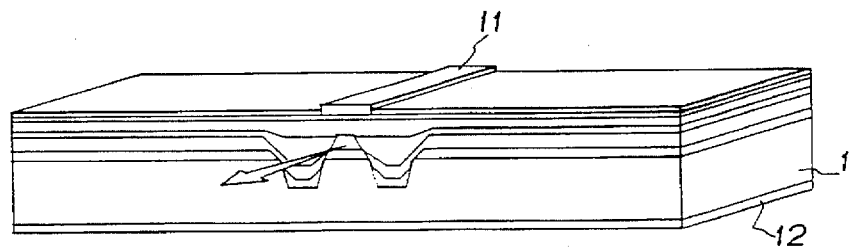
FIG. 28D is a perspective view showing a semiconductor substrate during a process for fabricating an optical device according to a thirteenth embodiment of the present invention, the semiconductor substrate being formed thereon with electrodes.

First, a damage absorbing layer 20 of, for example, 1.3 μm-InGaAsP was grown to a thickness of 0.1 μm to 0.5 μm on a planar semiconductor substrate by MOVPE, and then a pattern of an oxide layer 2 was formed as shown in FIG. 28A. The substrate was dry etched to process the damage absorbing layer 20 and the semiconductor substrate 1, followed by removal of the oxide layer 2 to obtain a nonplanar semiconductor substrate with the damage absorbing layer 20 thereon as shown in FIG. 28B. The substrate was selective etched with a sulfuric acid based solution to remove the damage absorbing layer 20. Thereafter, the same procedures as in Embodiment 11 or 12 were repeated to grow the same layers 6, 7, 8, 5, 9, 10 as shown in FIG. 28C and provide the electrodes 11 and 12 to fabricate a semiconductor emitting device as shown in FIG. 28D. Here, the patterning and etching were performed so that the shape of the grooves, particularly effective depth (ridge height), was not affected by the provision of the damage absorbing layer as described in Embodiment 12 above.

It was confirmed that the provision a damage absorbing layer not only improved the oscillating efficiency of a semiconductor light emitting device but also increased its output due to improvement in quality of the crystal like Embodiments 11 and 12 above.

As described concretely in Embodiments 11 through 13, there can be realized, according to the present invention, a highly efficient light emitting device whose oscillating wavelength can be controlled readily, and the use of a highly integrated optical functional device featured by a wide-band oscillating wavelength characteristics enables one to realize rapid progress in the development of measurement method, evaluation method, etc.

Embodiment 14 Integrated Optical Circuit

Figure 29:
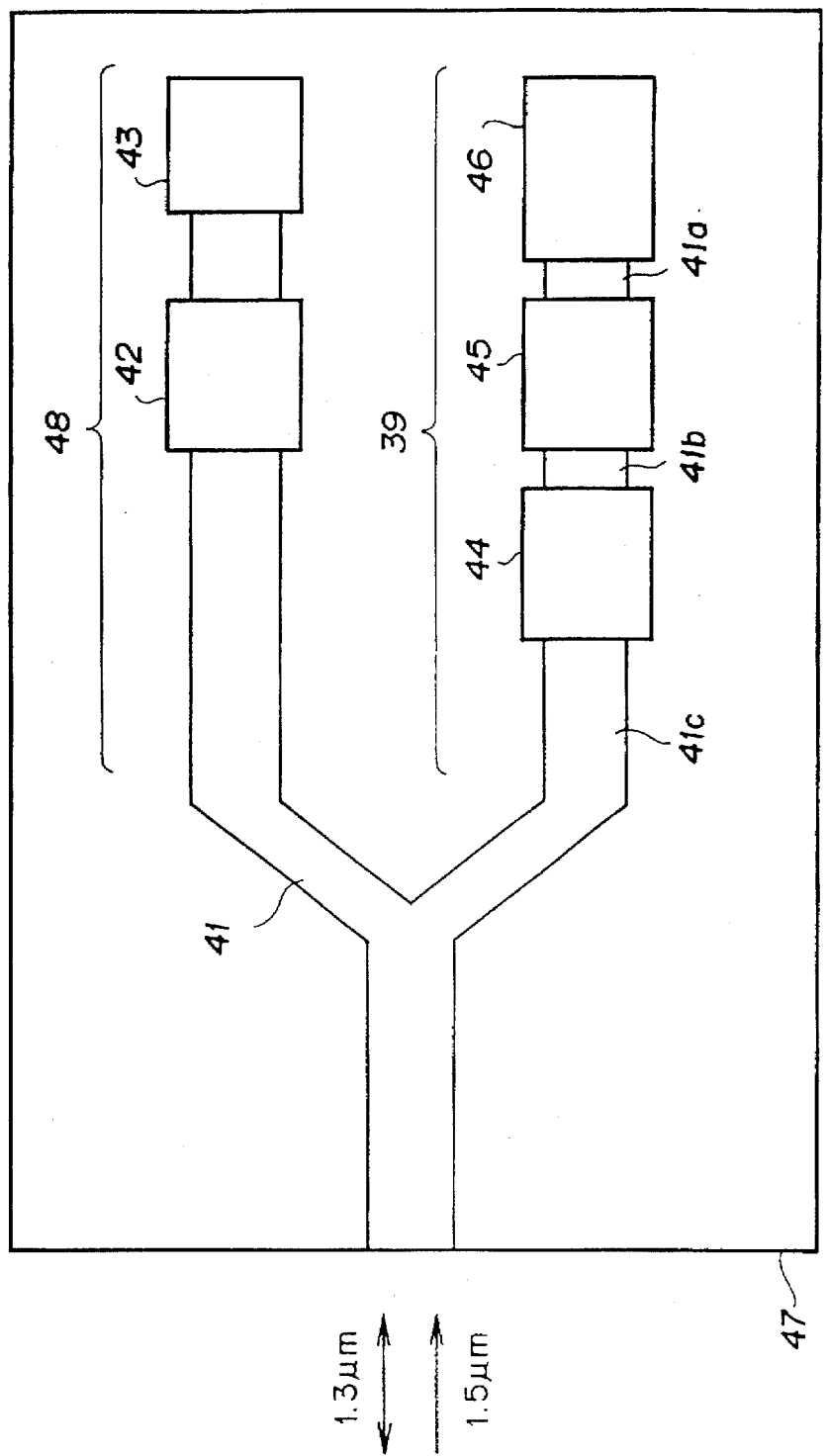
FIG. 29 is a schematic plan view showing an integrated optical circuit according to a fourteenth embodiment of the present invention.

FIG. 29 is a schematic plan view showing an example of an integrated optical circuit according to the present invention. In the instant embodiment, the integrated optical circuit were designed to use two wavelengths: 1.3 μm and 1.5 μm. Explanation will be made hereinafter taking an example of a ping-pong two-way communication system using light having a wavelength in a 1.3 μm band, or broadcasting such as CATV using light having a wavelength in a 1.5 μm band. Herein, by the terms "1.3 μm PD" and "1.5 μm PD", are meant PD for a 1.3 μm band light, and PD for 1.5 μm band light, respectively. Similarly, by the terms "1.3 μm LD" and "1.5 μm LD", are meant LD for a 1.3 μm band light, and LD for 1.5 μm band light, respectively.

In FIG. 29, reference numeral 41 denotes a Y-branched optical waveguide, 41a, 41b and 41c are portions of the waveguide 41, 42 is a 1.3 μm band distributed feedback (DFB) semiconductor laser (LD), 43 is a monitor PD, 44 is a 1.3 μm PD, 45 is a 1.3 μm residual light absorbing region or layer, 46 is a 1.5 μm PD, 47 is a semiconductor substrate, 48 is a LD branch portion, and 49 is a PD branch portion.

First explanation will be made of the operation of the integrated optical circuit. In a 1.3 μm band ping-pong two-way optical communication, transmission and reception are time-shared. They are not performed simultaneously. In a 1.5 μm band, communication is of a broadcasting type, and only reception is performed. For transmission of a 1.3 μm band light, laser beam generated in the DFB laser (1.3 μm LD) is propagated through the Y-branched waveguide 41 and outputted out of the integrated optical circuit. The power of the outputted light is monitored by the monitor PD 43.

For reception of 1.3 μm and 1.5 μm light, a 1.3 μm light inputted in the integrated optical circuit is propagated through a straight portion of the Y-branched waveguide 31 and split at the Y-branch and propagated through two waveguides. The light to the LD branch 48 is inputted to the LD 42. However, no influence is given to the LD 42 since it is not active while a 1.3 μm band light is being received. On the other hand, light to the PD branch 49 is absorbed by the 1.3 μm PD 44 and converted into photocurrent. Residual rays not absorbed are absorbed by the residual light absorbing region 45 and, hence, no 1.3 μm light is inputted in the 1.5 μm PD 46. In other words, the 1.3 μm residual light absorbing region 45 serves as a wavelength filter which cuts 1.3 μm light but allows 1.5 μm light to pass through it. When 1.5 Nm light is inputted, it is propagated through a straight portion of the Y-branched waveguide 41 and split to two at the Y-branch, and then propagated in two waveguides. Light to the LD branch 48 is inputted in 1.3 μm LD 42. In this occasion, 1.5 μm band light is not absorbed by the active layer of the 1.3 μm LD, giving no influence to the 1.3 μm LD 42. Light to the PD branch 49 is not absorbed by the residual light absorbing layer 45 having a 1.3 μm band composition and therefore this light transmits through the 1.3 μm PD 42 and 1.3 μm residual light absorbing region 45 and reaches the 1.5 μm PD 46 where it is absorbed to generate photocurrent.

Next, explanation will be made of a fabrication process for fabricating the integrated optical circuit of the instant embodiment with reference to FIGS. 30 through 36.

Figure 30:
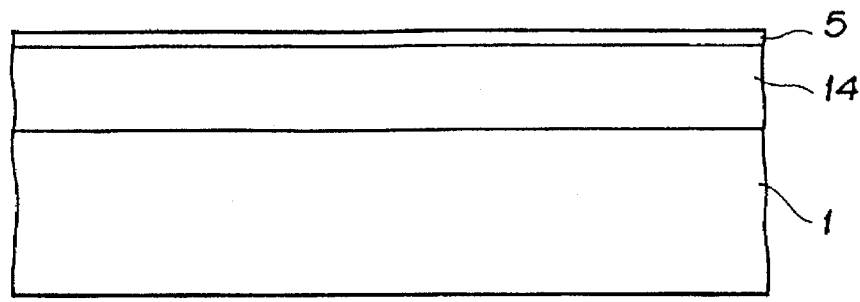
FIG. 30 is a schematic cross sectional view showing a semiconductor substrate during a process for fabricating an integrated optical circuit according to a fourteenth embodiment of the present invention, the semiconductor substrate being formed thereon with a common optical waveguide and an n-InP layer.

1. Crystal growth:

1-1) On an n-InP substrate were grown a waveguide layer 14 consisting of 1.1 μm-composition InGaAsP of 0.3 μm thick and an InP layer 5 of 20 nm thick to obtain a structure shown in FIG. 30.

Figure 31:
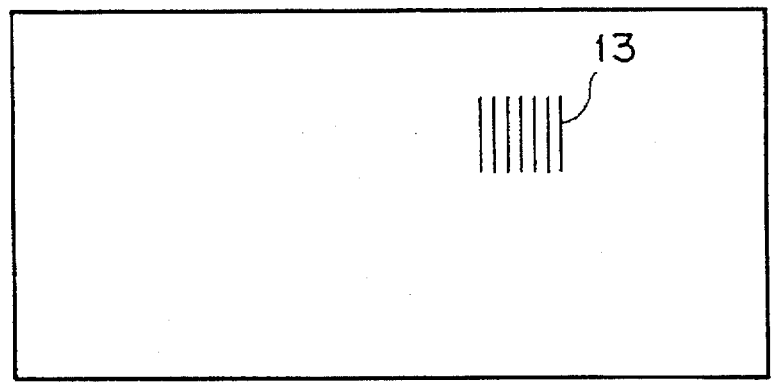
FIG. 31 is a schematic plan view showing a semiconductor substrate during a process for fabricating an integrated optical circuit according to a fourteenth embodiment of the present invention, the semiconductor substrate being formed in a portion of its n-InP layer with diffractive gratings.

1-2) Diffractive grating 13 having a pitch of 200 nm was formed in a region expected to become a 1.3 μm LD (cf. 42 in FIG. 29) as shown in FIG. 31.

Figure 32:
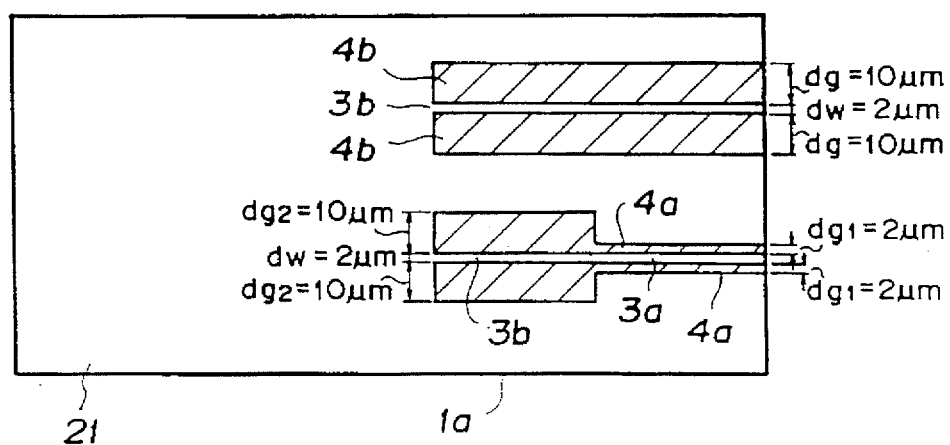
FIG. 32 is a schematic plan view showing a semiconductor substrate during a process for fabricating an integrated optical circuit according to a fourteenth embodiment of the present invention, the semiconductor substrate being formed therein with grooves to form ridges.
Figure 33:
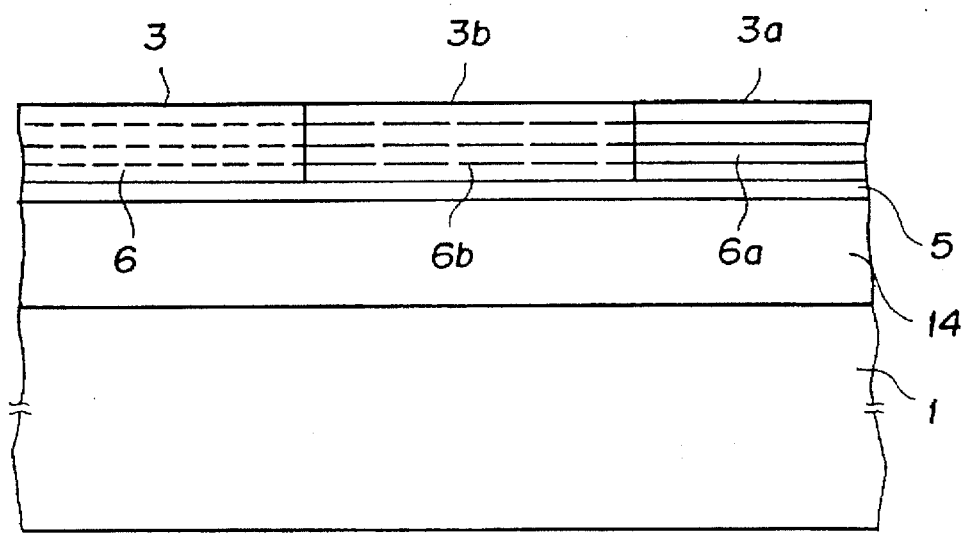
FIG. 33 is a schematic cross sectional view showing a semiconductor substrate during a process for fabricating an integrated optical circuit according to a fourteenth embodiment of the present invention, the semiconductor substrate being formed thereon with a multi-quantum well structure.

1-3) In a region of a flat surface 21 where a 1.5 μm PD (46 in FIG. 29) was to be formed, there was formed a ridge 3a which had a shape defined by a gap distance dg=2 μm, a ridge width dw=2 μm, and a ridge height h=2 μm. On the other hand, in each of regions where 1.3 μm LD and monitor PD, and 1.3 μm PD were to be fabricated, respectively (42, 43 and 44 in FIG. 29), there was formed a ridge 3b which had a shape defined by a gap distance $dg_2$=10 μm, a ridge width dw=2 μm, and a ridge height h=2 μm. Thus, a structure as shown in FIG. 32 was obtained.

1-4) On the resulting nonplanar substrate, there was grown a MQW structure 6 which was able to effectively give a bandgap of 1.25 μm on the flat surface 21. As described above, the oscillating wavelength shifted toward longer wavelength side on the ridges 3a and 3b. There appeared a 1.5 μm bandgap MQW structure 6a on the ridge 3a ($dg_1$=2 μm) while a 1.3 μm bandgap MQW structure 6b was obtained on the ridge 3b ($dg_2$=10 μm).

Figure 34:
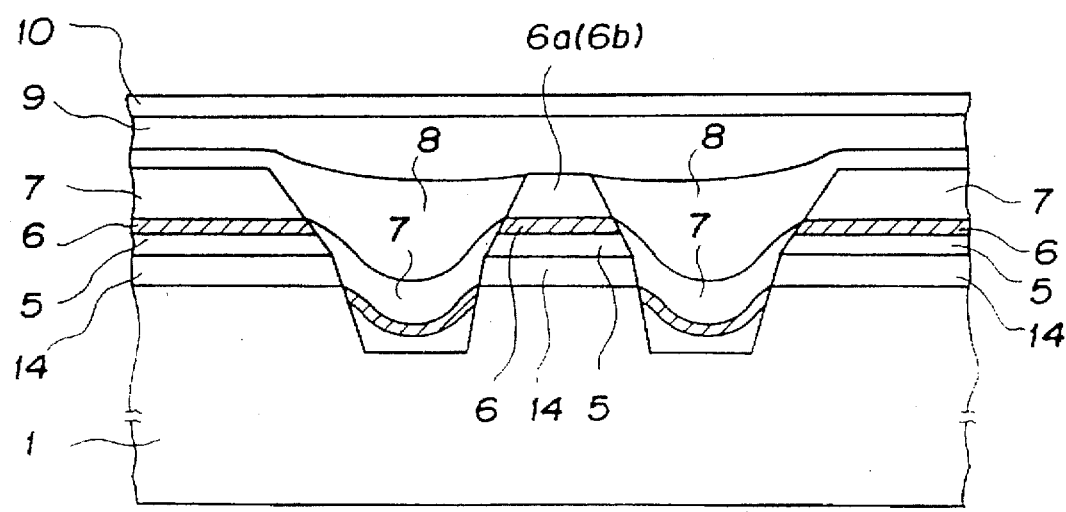
FIG. 34 is a schematic cross sectional view showing a semiconductor substrate during a process for fabricating an integrated optical circuit according to a fourteenth embodiment of the present invention, the semiconductor substrate being buried.

1-5) Embedding regrowth was performed to embed 1.5 μm PD, 1.3 μm LD and 1.3 μm PD portions. This was done by MOVPE, preferably according to the method described in Japanese Patent Application Laying-open No. Hei-5-102607 (1993). More particularly, a Zn-doped p-InP current blocking layer 7, an Se-doped n-InP current confining layer 8 were grown in this order by MOVPE as shown in FIG. 34. The p-InP layer 7 and the n-InP layer 8 served as a current constricting and light confining layer. When the Se was doped in the n-InP layer 8 in an amount of not smaller $5×10^{18}$ $cm^{-3}$, the growth of the n-InP buried layer (current confining layer) 8 was suppressed on the ridge and, hence, a multilayer structure was obtained in which only the p-InP current confining layer grew on the ridges 6a and 6b.

Subsequently, a p-InP overcladding layer 9, and a p-InGaAsP layer 10 were grown continuously by MOVPE.

Figure 35:
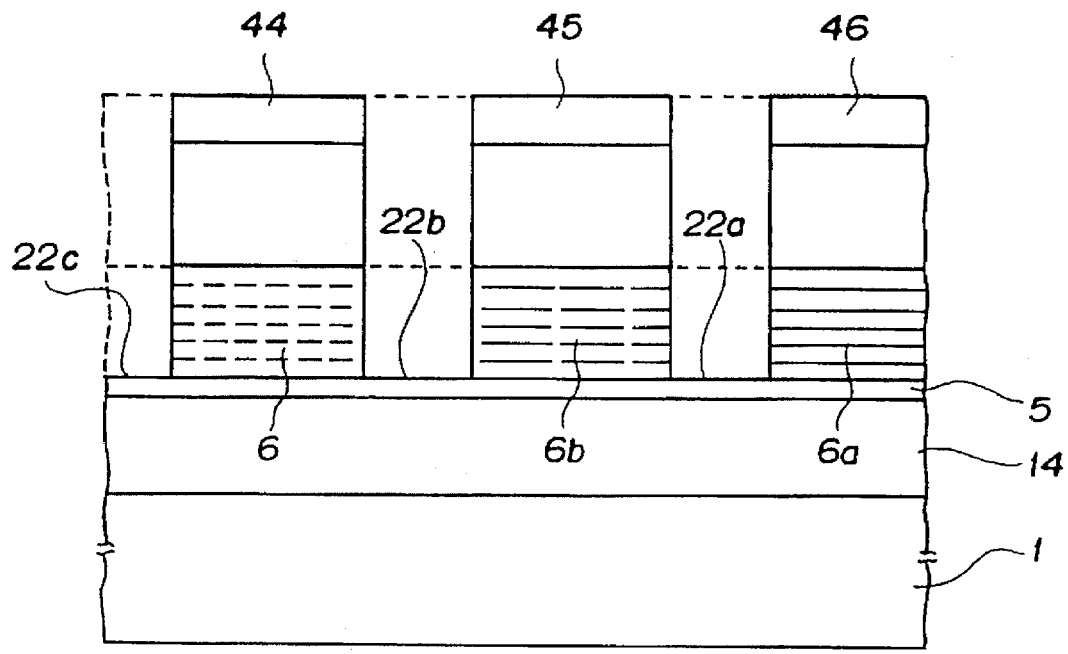
FIG. 35 is a schematic cross sectional view showing a semiconductor substrate during a process for fabricating an integrated optical circuit according to a fourteenth embodiment of the present invention, a doped InP layer and a multi-quantum well structure having a 1.3 μm bandgap being etched off.

1-6) The doped InP and 1.3 µm composition InGaAsP which were deposited on the Y-branched waveguides 41a, 41b and 41c at the time of embedding regrowth were removed together with p-InGaAsP layer to form removed regions 22a, 22b and 22c as shown in FIG. 35.

Figure 36:
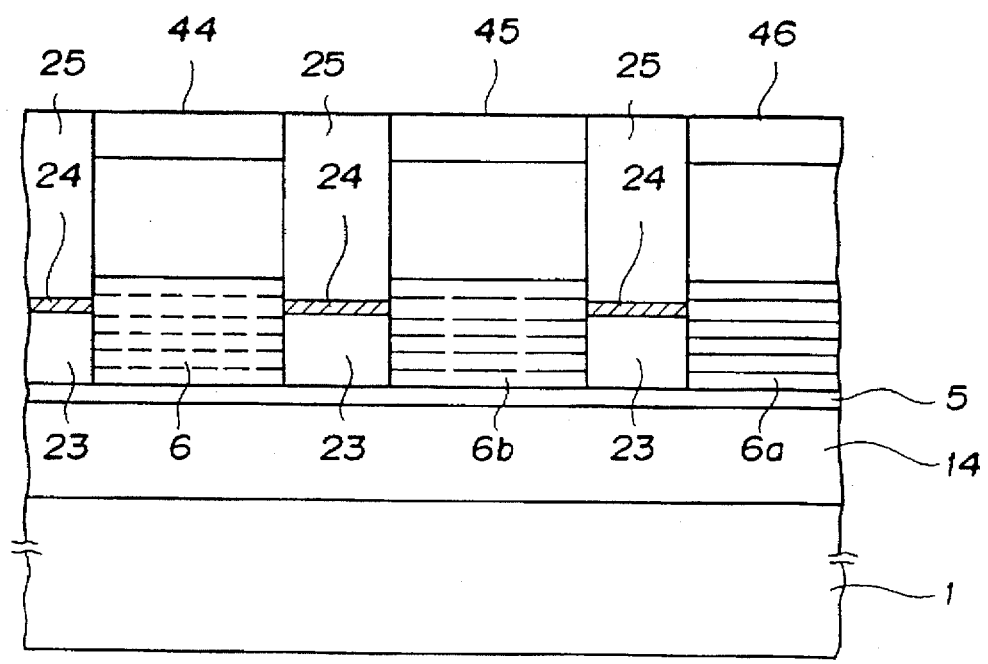
FIG. 36 is a schematic cross sectional view showing a semiconductor substrate during a process for fabricating an integrated optical circuit according to a fourteenth embodiment of the present invention, the etched-off portion being buried.

1-7) As shown in FIG. 36, an undoped InP layer 23 (1,000 Å), an InGaAsP etch-stop layer 24 (200 Å) for selective etching, and an undoped InP layer 25 were grown in this order in the removed regions 22a, 22b, and 22c, respectively. This completed the crystal growth.

2. Electrode Formation:

2-1) p-Electrodes were formed on 1.3 µm LD 42, 1.3 µm PD 43, 44 and 45, and 1.5 µm PD 46, respectively, with AuZnNi/Au.

2-2) Waveguide portion 41 was wet etched in the form of stripes with a selective etching solution until the etch-stop layer was reached to form a ridge waveguide.

2-3) An insulator was deposited everywhere except for electrode portion.

2-4) Electrode pads were formed for attaching wiring.

2-5) The substrate was ground and an n-electrode was formed with AuGeNi/Au on the side of the substrate. This completed fabrication of the device.

Figure 37:
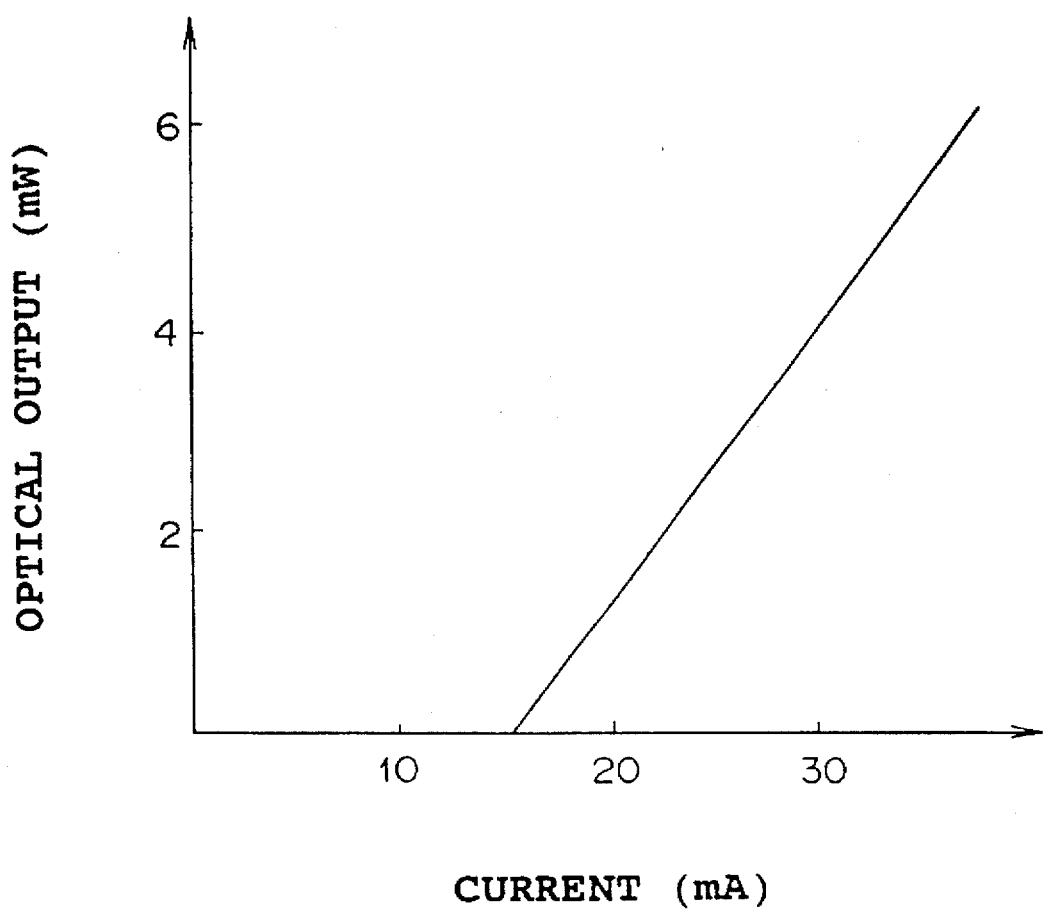
FIG. 37 is a graph illustrating dependence, on current, of optical output of a 1.3 μm LD in an integrated optical device according to a fourteenth embodiment of the present invention.

Next, explanation will be made of the characteristics of the resulting device. FIG. 37 illustrates current vs. optical output characteristics when a 1.3 µm LD was oscillated. Threshold was 15 mA, and an output of 4 mW was obtained at a current of 30 mA. Side mode suppression ratio was 28 dB.

Figure 38B:
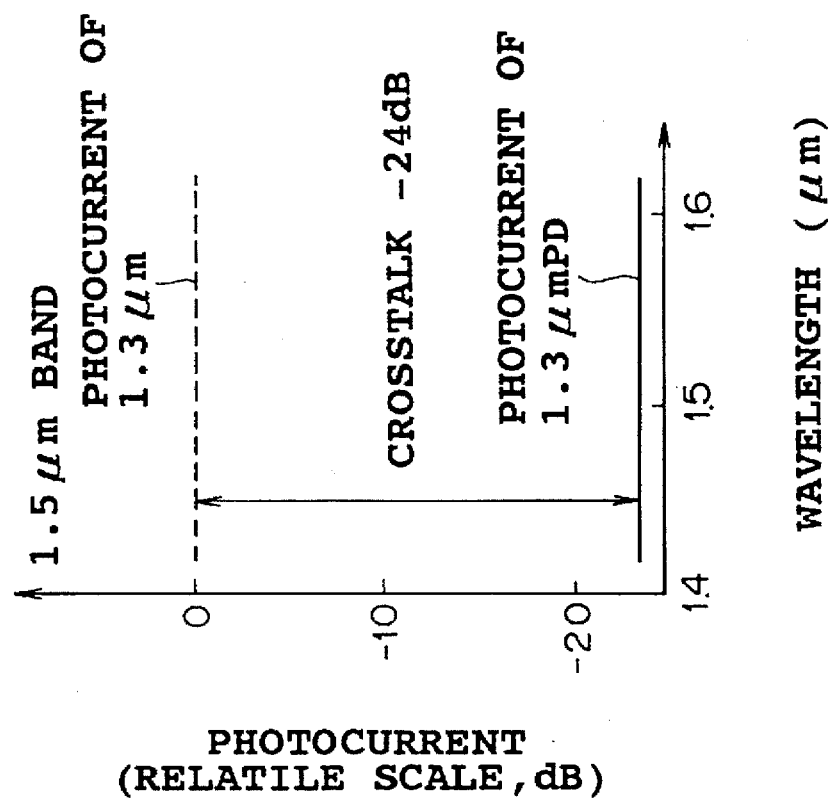
FIG. 38B is a graph illustrating dependence, on wavelength, of crosstalk of a PD in an integrated optical device according to a fourteenth embodiment of the present invention.
Figure 38A:
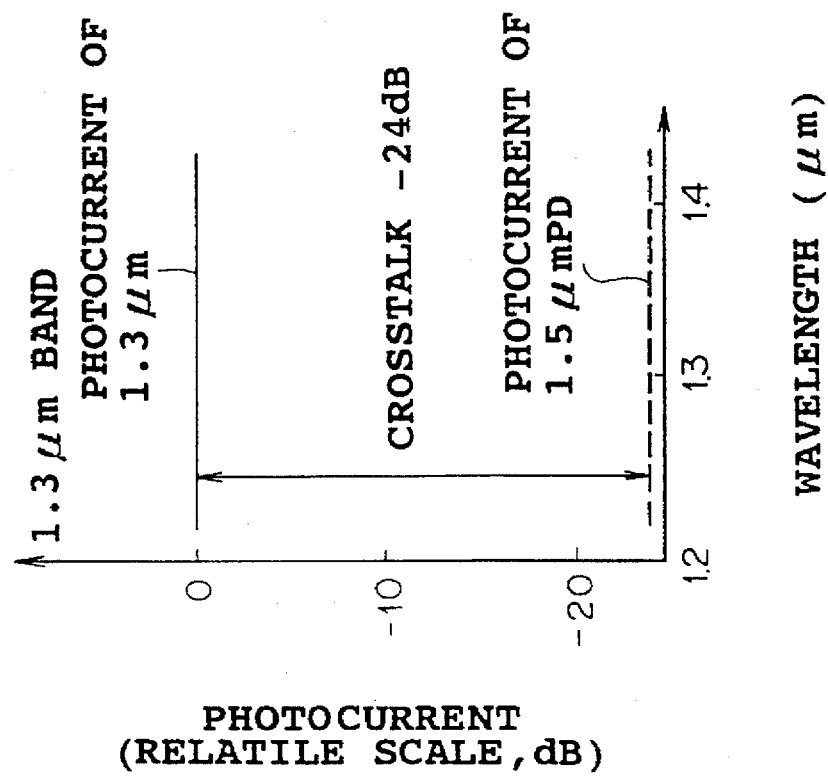
FIG. 38A is a graph illustrating dependence, on wavelength, of photocurrent of a PD in an integrated optical device according to a fourteenth embodiment of the present invention.

Then, explanation will be made of the characteristics of PD. Reverse bias voltage of 1 V was applied to the 1.3 µm PD 44, and the 1.5 µm PD 46, and the 1.3 µm residual light absorbing region 45 was earthed so that photocurrent which was generated by residual rays would not flow into other PD electrodes. In this state, light of 1.3 µm and light of 1.5 µm were inputted from the left end face of the waveguide of the device and on the side of the 1.3 µm PD 44. On this occasion, 1.3 µm PD 44 and 1.5 µm PD 46 absorbed light of 1.3 µm and 1.5 µm in wavelength and photocurrent flowed in the both devices. Light of 1.3 µm, which was not absorbed by the 1.3 µm PD 44, was absorbed by the 1.3 µm residual light absorbing region 45 and converted to photocurrent, which flew to ground. As a result, almost no 1.3 µm light was inputted into the 1.5 µm PD 46. FIGS. 38A and 38B each illustrate dependence of photocurrent and crosstalk for each PD on wavelength. FIG. 38A illustrates dependence of crosstalk of 1.3 µm PD while FIG. 38B illustrates dependence of crosstalk of 1.5 µm PD on wavelength. In measurement, crosstalk c was defined as follows.

For 1.3 µm band:

$$C_{1.3} = 10 \times \log(\text{photocurrent of 1.3 µm PD/photocurrent of 1.5 µm PD})$$

For 1.5 µm band:

$$C_{1.5} = 10 \times \log(\text{photocurrent of 1.5 µm PD/photocurrent of 1.3 µm PD})$$

FIGS. 38A and 38B reveals that good crosstalk characteristics of −24 dB were observed in the both bands.

When 1.3 µm light and 1.5 µm light were inputted, light propagated also in the LD branch. However, influence on the LD was negligible even when 1.3 µm light was being received since LD did not have to be operated. Further, as described above, 1.5 µm light gave no influence to LD the characteristics of the LD did not change while 1.5 µm light was being received.

While a DFB laser was used in the instant embodiment, a DBR laser in which diffractive gratings are arranged on both sides of the active layer may also be used.

Figure 39A:
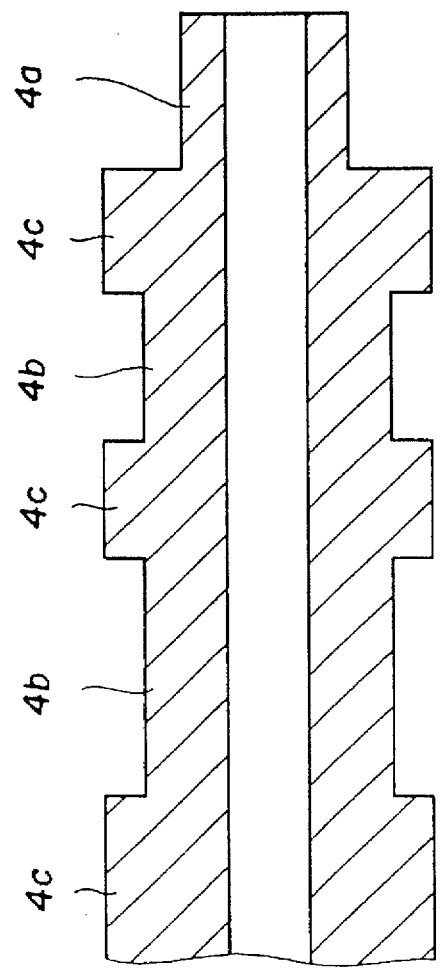
FIG. 39A is a schematic cross sectional view showing a semiconductor substrate during a process for fabricating an integrated optical device according to a variation of a fourteenth embodiment of the present invention, the semiconductor substrate being formed therein two types of grooves with different gap distances.
Figure 39B:
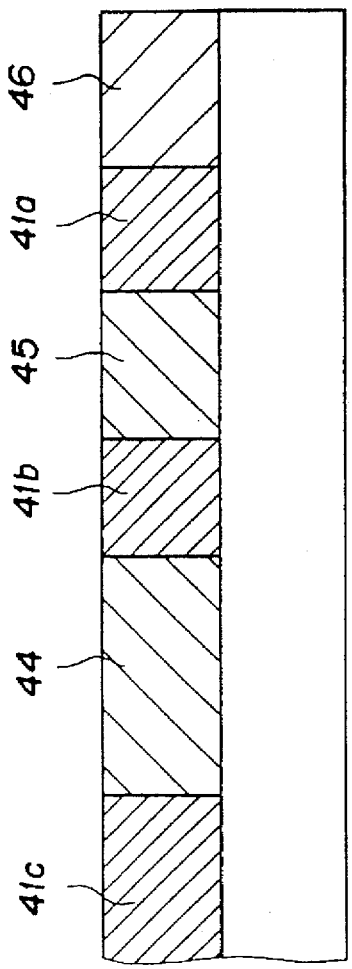
FIG. 39B is a schematic cross sectional view showing a semiconductor substrate during a process for fabricating an integrated optical device according to a variation of a fourteenth embodiment of the present invention, the nonplanar semiconductor substrate being formed thereon with a multi-quantum well structure.

In the instant embodiment, at first a 1.1 µm composition waveguide was grown on the substrate and used as a common waveguide. However, the waveguide 41 (including waveguide portions 41a, 41b and 41c) may be grown simultaneously together with 1.3 µm PD's 44 and 45 and 1.5 µm PD 46 since the composition of a crystal on the ridge can be varied from 1.1 µm composition to 1.5 µm composition by optimizing the structure of the MQW. More particularly, as shown in FIGS. 39A and 39B, an MQW structure can be grown on a ridge which has different ridge portions sandwiched by a groove 4a corresponding to the 1.5 µm PD 46, a groove 4b corresponding to the 1.3 µm PD 44 and the 1.3 µm residual light absorbing region 45 and a grove 4c corresponding to the 1.1 µm waveguide portions 41a, 41b and 41c. For the LD branch, the Y branched waveguide 41 may be grown simultaneously together with the 1.3 µm LD 42 and the monitor PD 43.

Embodiment 15

Figure 40:
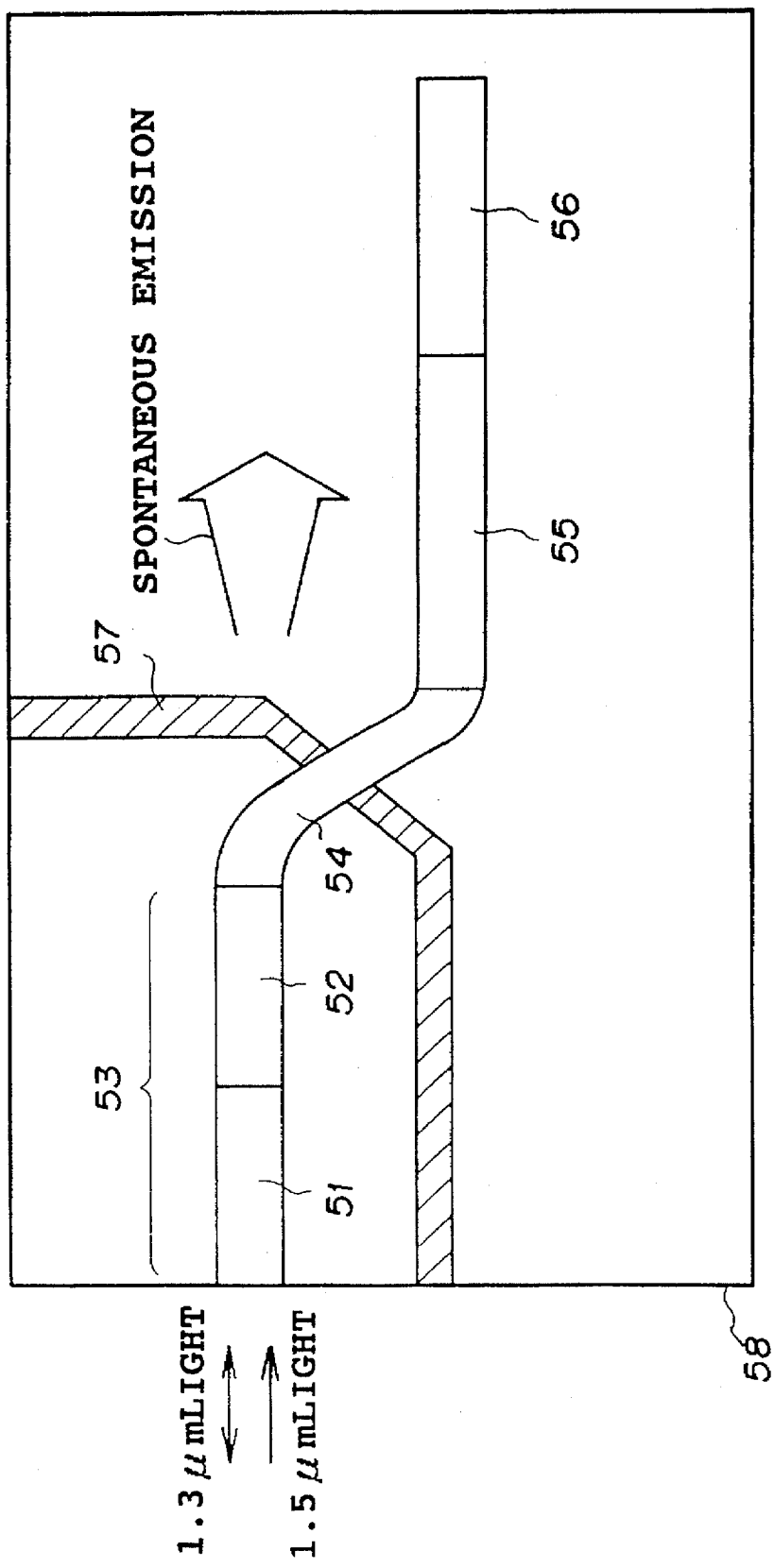
FIG. 40 is a schematic plan view showing an integrated optical circuit according to a fifteenth embodiment of the present invention.

Referring to FIG. 40, explanation will be made of an integrated optical circuit according to the present invention.

In the arrangement shown in FIGS. 39A and 39B, there were used substantially the same component devices as those used in Embodiment 14 but arranged in a manner different from that in Embodiment 14. In FIG. 40, reference numeral 51 is an active layer for LD, which active layer had 1.3 µm effective bandgap, 52 is a diffractive grating for constituting a DBR laser, 53 is a DBR laser portion, 54 is a curved waveguide, 55 is a 1.3 µm residual light absorbing region, 56 is a 1.5 µm PD portion, 57 is a groove for cutting scattered light, 58 is a semiconductor substrate.

Explanation will be made of the operation of the integrated optical circuit of the instant embodiment. Transmission of light in a 1.3 µm band was performed using a DBR laser 53. The resonator of the laser diode comprised a cleaved facet of the semiconductor substrate and a diffractive grating 52. Because of high reflectivity of the diffractive, laser beam was outputted almost exclusively from a left hand side face of the device, but no output light on the side of the PD.

When the laser diode 53 was excited, spontaneous emission occurs as well as lasing. The spontaneous emission light is not a guided light and, hence, it is possible to prevent it from being inputted into the 1.5 µm PD portion 56 by the introduction of a curved waveguide 54 (FIG. 40). While light propagates in a waveguide, there occurs scattered light. Inputting of such scattered light into a 1.5 µm PD portion 56 can be prevented by the provision of a scattered light cutoff groove 57 for cutting scattered light off. With the above-described construction, there can be reduced crosstalk to the 1.5 µm PD portion 56 when a 1.3 µm light is transmitted.

On the other hand, upon reception of a 1.3 µm light, the laser diode 53 serves as a detector. Optical system which uses the device of the instant embodiment is a ping-pong two-way communication as described above, this type of application is possible. 1.3 µm light which has not been absorbed by the laser-and-detector propagates through the curved waveguide to reach the 1.3 µm residual light absorbing region 53 and absorbed thereby, but does not enter the 1.5 µm PD portion 56. Upon reception of 1.5 µm light, the light propagates through the DBR laser (LD) portion 53, the curved waveguide 54 and 1.3 µm residual light absorbing region 55 to reach 1.5 µm PD portion 56 where the light is absorbed and converted into photocurrent.

The integrated optical circuit according to the instant embodiment can be fabricated substantially in the same manner as in Embodiment 14 above. Also, the 1.3 μm LD and 1.3 μm PD as well as 1.5 μm PD had the same characteristics as those used in Embodiment 14 above.

As described concretely with reference to Embodiments 14 and 15 above, an integrated optical circuit of the present invention which includes a semiconductor light emitting diode, a first semiconductor detector, and a second semiconductor detector which detects light having a wavelength longer than that of light which can be detected by the first detector, and a wavelength filter provided between the first and the second detectors, and optical waveguides connecting these components to each other can be operated as a transmission device for transmitting light of first wavelength and as a detector for detecting light of second wavelength.

Embodiment 16 Spot Size Converter

Figure 41:
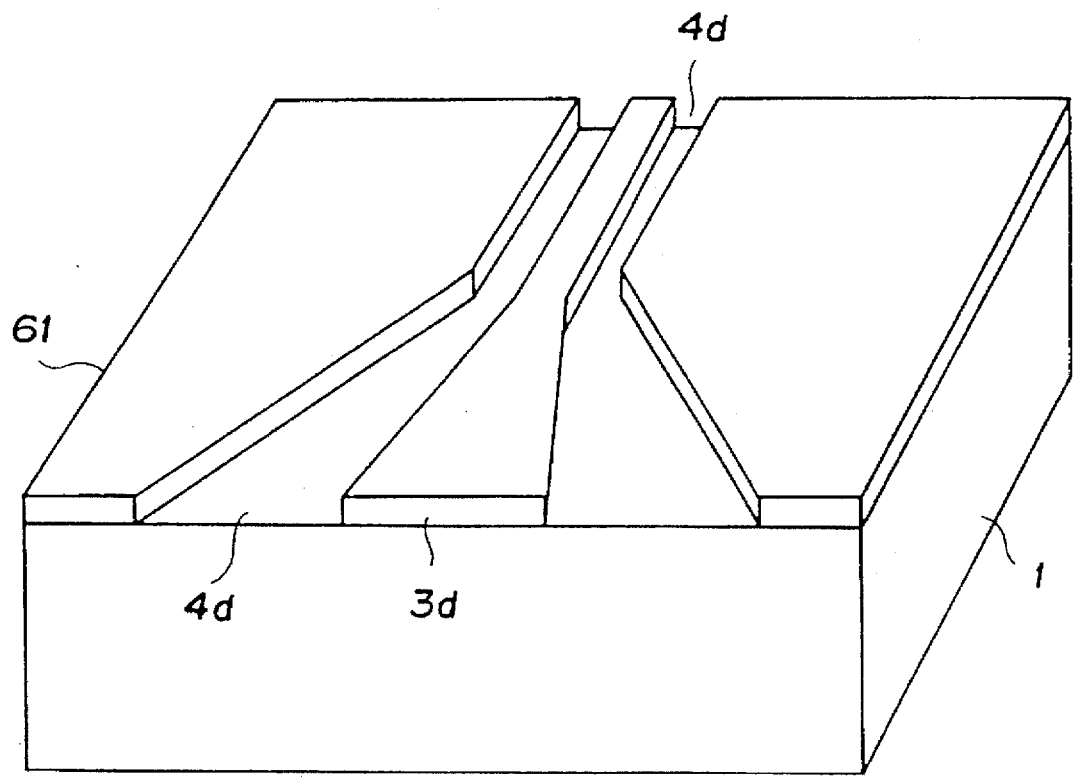
FIG. 41 is a schematic perspective view showing a semiconductor substrate for fabricating a spot size converter according to a sixteenth embodiment of the present invention, the semiconductor substrate being formed with a ridge prior to epitaxial growth.
Figure 42:
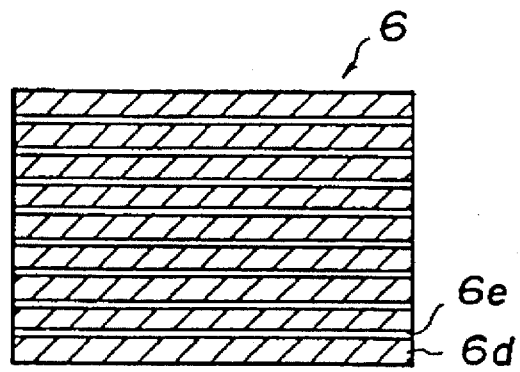
FIGS. 42A and 42B are respectively a schematic cross sectional view showing a front end of a spot size converter according to a sixteenth embodiment of the present invention, and a quantum well layer being shown on an enlarged scale.
Figure 42:
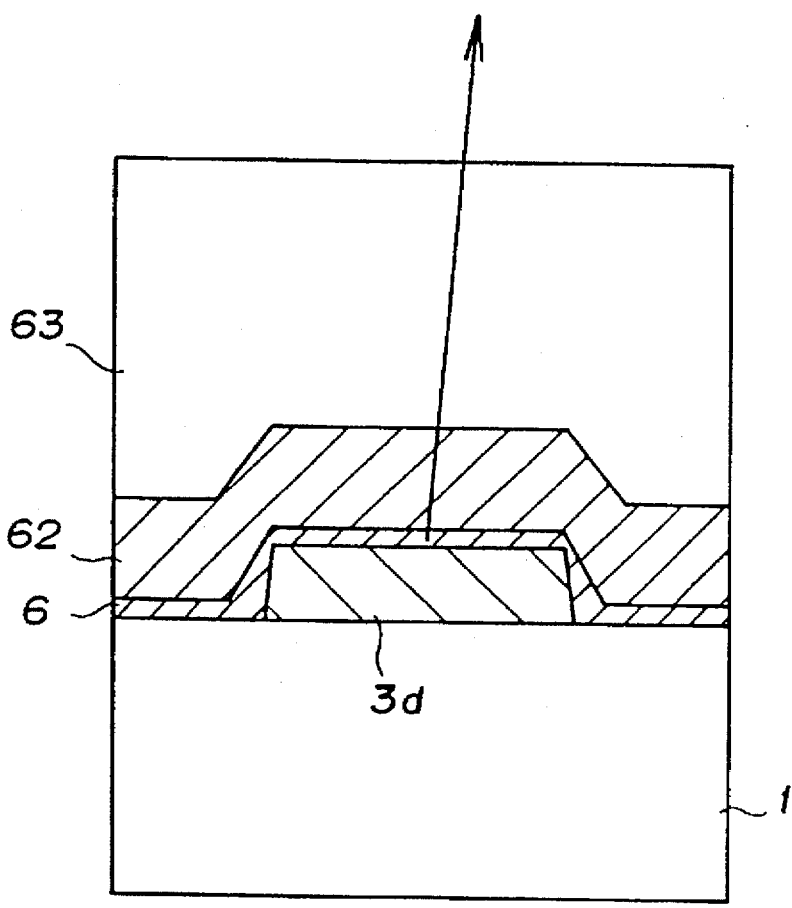
Figure 43B:
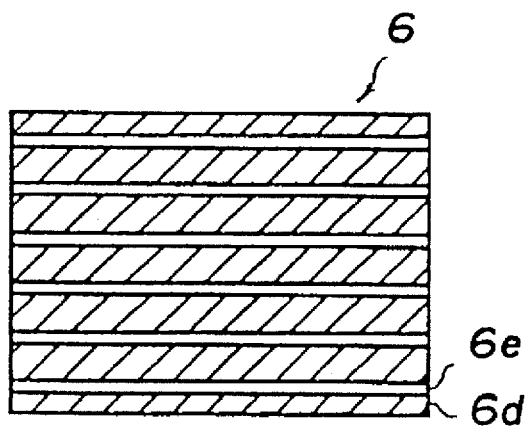
FIGS 43A and 43B are respectively a schematic cross sectional view showing a rear end of a spot size converter according to a sixteenth embodiment of the present invention, and a quantum well layer being shown on an enlarged scale.
Figure 43:
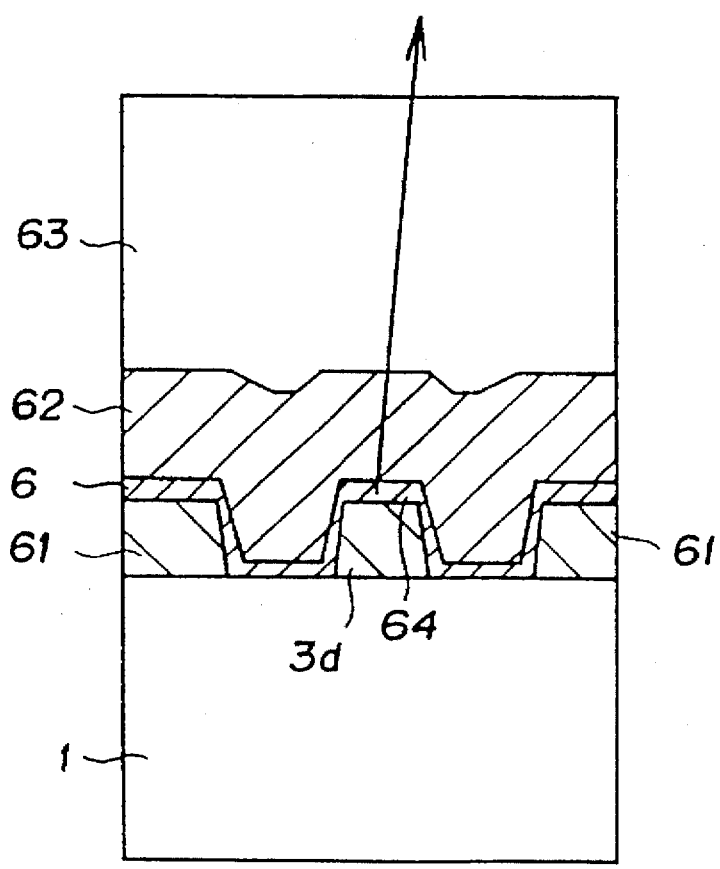

FIGS. 41 through 43 show a spot size converter according to one embodiment of the present invention. The spot size converter of the instant embodiment was fabricated as follows. First, there was formed on an InP substrate 1 a 2 μm thick 5 μm composition InGaAsP layer 61. A part of the InGaAsP layer 61 was removed by RIE etching with chlorine gas so that two tapered grooves 4d and a ridge 3d were formed. Thus, there was obtained a structure as shown in FIG. 41. On the front face of the substrate 1, the width of the ridge 3d was 5 μm, and the width (gap distance) of the groove d was 10 μm. On the rear face of the substrate, the width of the ridge 3d was 1.5 μm and the gap distance of the groove 4d was 3 μm. The ridge had a uniform height overall the substrate, which was 2 μm. Near the rear face of the substrate 1, there was formed a portion where the ridge 3d and the grooves 4d are parallel to each other. However, formation of this parallel portion is not mandatory. On the contrary, such a parallel portion may be provided near the front face of the substrate 1.

Next, the above-described structure having the substrate 1 and the ridge 3d formed thereon was used as a substrate for epitaxial growth. That is, a 150 Å thick InGaAsF layer of 1.1 μm composition was grown on the structure by MOVPE or MOMBE to obtain a barrier layer 3d. Then, on the barrier layer 6d, there was grown a 17 Å thick InGaAs well layer 6e. This procedure was repeated until there was obtained a quantum well structure 6 of a total thickness of about 0.3 μm. Subsequently, a 2 μm thick InGaAsP layer 62 of 1.35 μm composition was grown, and finally an InP layer 63 was grown to a thickness of 2 μm. FIGS. 42 and 43 show front end face and rear end face, respectively, of the spot size converter, with schematic enlarged views of the resulting MQW structure at its frond end face and rear end face, respectively.

The width of the ridge 3d on the rear end face of the device was 1.5 μm as described above, and the width of the grooves 4d was 3 μm. From this, it follows that the bandgap of the MQW structure 6 became 1.0 μm as will be apparent from FIG. 7 illustrating dependence of photoluminescence peak wavelength on the ridge shape factors. Further, since the MQW layer 6 on the side surface of the ridge 3d was thinner than on the upper surface of the ridge 3d as shown in FIG. 43, the guided light was confined in the MQW layer 64 on the ridge as a core, or a cavity, having a thickness of about 0.3 μm and a width of about 1.5 μm. The spot size was within the range of about 1.5 μm to about 2 μm, which corresponded to the spot size of the semiconductor device.

Similarly, the width of the ridge 3d on the front end face of the device was 5 μm as described above while the width of the grooves was 10 μm. Hence, the bandgap of the MQW structure 6 was 1.35 μm on the front end face of the device as will be apparent from the dependence of photoluminescence peak wavelength on the ridge shape factors as illustrated in FIG. 7. As a result, the refractive index of the MQW structure 6 became substantially the same as or smaller than the layer 61 constituting the ridge 3d. Therefore, on the front end face of the device, there was formed a buried ridge structure of about 4.5 μm thick and about 5 μm wide including the layers 61, 6 and 62 as a core and the layers 1 and 63 as upper and lower cladding layers, respectively. In this case, the center of the core layer was in the layer 6, resulting in that guided light was able to be transmitted from a state in which it is confined by the MQW structure 64 on the rear end face of the device to another state in which it is confined by the layers 61, 6 and 62 on the front end face of the device without causing any misalignment. As a result, on the front end face of the device, there was formed a waveguide having a spot size enlarged to 4 to 5 μm, which was of a similar dimension as optical fibers.

A flat end fiber was connected to the front end face of the resulting device and connection loss was measured. As a result, it was confirmed that the loss was not higher than 0.5 dB, and allowance of connection was ±2.4 μm for a tolerance of 1 dB.

In the instant embodiment, wile the width of the ridge was enlarged to 5 μm on the front end face of the device, the effect of spot size enlargement can be obtained even when the ridge width was kept at a constant value if the groove width (gap distance) was varied as confirmed from the results illustrated in FIG. 7. This is believed to be attributable to the fact that difference in refractive index between the core and cladding is small in a direction horizontal to the surface of the substrate on the front end face of the device and, hence, guided light evanesces to the region of cladding so that the effective spot size can be enlarged.

Embodiment 17

Figure 44:
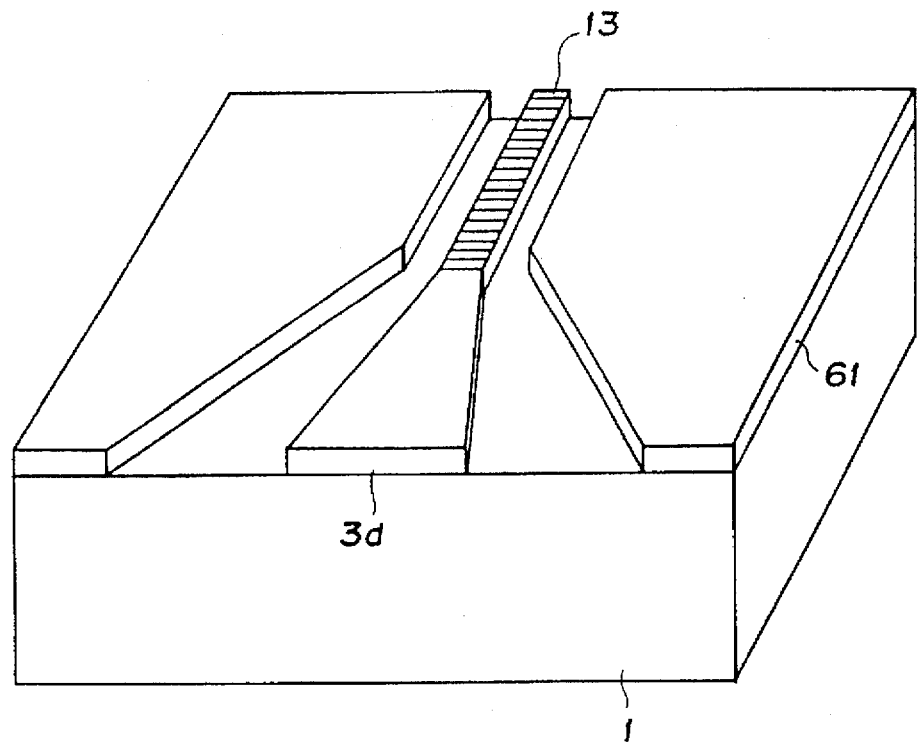
FIG. 44 is a schematic perspective view showing a semiconductor substrate for fabricating a spot size converter according to a seventeenth embodiment of the present invention, the semiconductor substrate being formed with a ridge prior to epitaxial growth.
Figure 45:
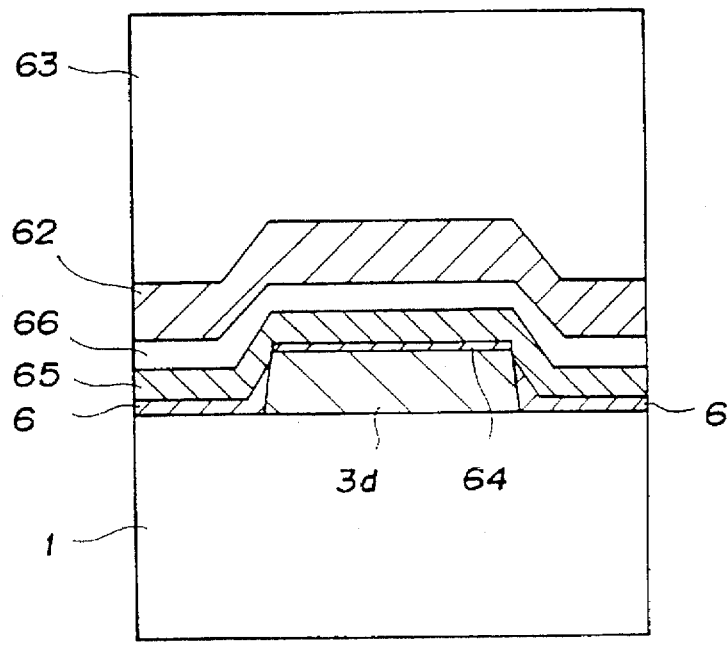
FIG. 45 is a schematic cross sectional view showing a front end of a spot size converter according to a seventeenth embodiment of the present invention, with a quantum well layer being shown on an enlarged scale.
Figure 46:
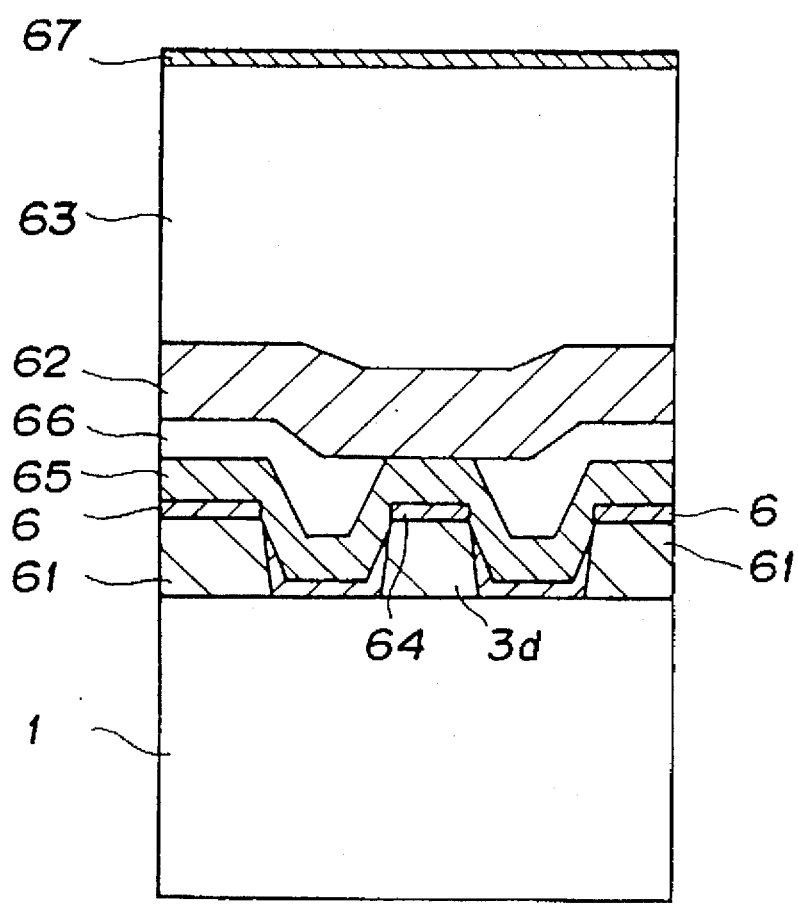
FIG. 46 is a schematic cross sectional view showing a rear end of a spot size converter according to a seventeenth embodiment of the present invention, with a quantum well layer being shown on an enlarged scale.

FIGS. 44 through 46 illustrate a spot size converter according to another embodiment of the present invention. As a substrate for growing a MQW layer, a nonplanar structure similar to that used in Embodiment 16 was used. In the instant embodiment, a diffractive grating 13 was formed on a portion of the upper surface of the ridge 3d, as shown in FIG. 44. The layers 1 and 61 were doped with impurities so that they were converted to n-type in conductivity. After a MQW layer 6 was grown in the same manner as in Embodiment 16, a p-InGaAsP layer 65 was grown as proposed by Kondo, et al. (Japanese Patent Application Laying-open No. Hei-5-102607 (1991)). That is, after the MQW layer 6 was grown, a stripe mask (not shown) was formed only above a MQW layer 64 that was positioned on the ridge 3d. the MQW layer 6 around the layer 64 was etched off using a RIE apparatus to render the layer 64 mesa-structure. Thereafter, the mask was removed.

Subsequently, on the thus processed surface, an n-InP or InGaAsP layer 66 was grown, followed by growing a p-InGaAsP layer 62 and an InP layer 63 as well as by forming an electrode 67 on a part of the uppermost layer. As a result, the structure as shown in FIG. 44 was formed on the rear end face of the device. This was a laser diode structure including the n-InP layers 1 and 63 as current blocking layers, which operated as a DFB laser diode when electrodes were formed on both upper and lower faces of the device.

On the other hand, the refractive index distribution on the front end face of the device was substantially the same as that of the device obtained in Embodiment 16 and, hence, the device of the instant embodiment also had a waveguide structure with an enlarged spot size.

Therefore, in the instant embodiment, monolithically integrated optical device having a spot size-enlarged waveguide and a DFB laser can be fabricated by a single epitaxial growth.

In the instant embodiment, there may be fabricated a device using a substrate in which the thickness of the layer 61 is 4 μm of which 2 μm has been processed to form a ridge, as well as p-InP layers as the layers 62 and 65 and an n-InP layer as the layer 66. In this case, the centers of the spots of the guided light does not align on the front and rear end faces. However, this structure is advantageous in that the structure of the p-cladding layer is simplified and confinement of current by pnpn structure can be performed effectively.

In the instant embodiment, when no diffractive grating 13 is fabricated, the device can be used as is as a photodetector diode so that there can be realized a waveguide type photodiode having high coupling efficiency with optical fibers.

Embodiment 18

Figure 47:
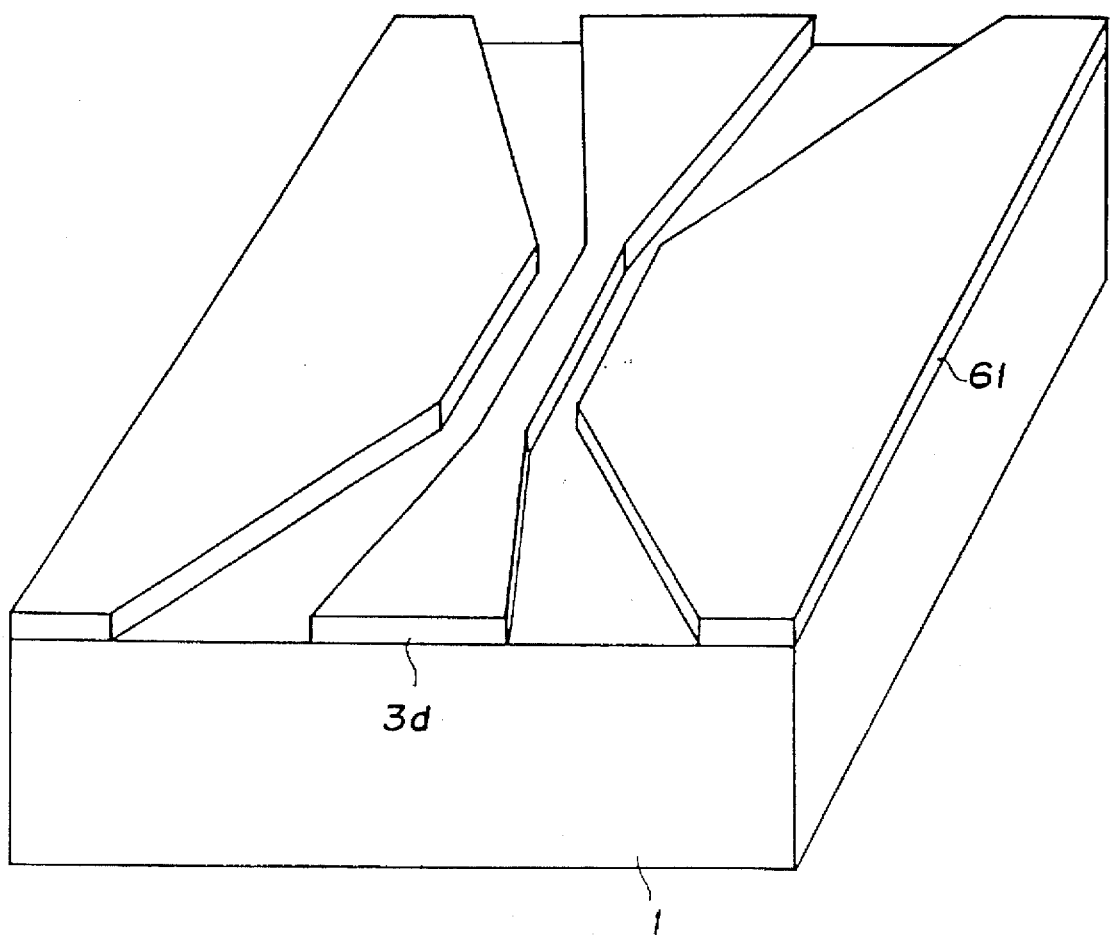
FIG. 47 is a schematic perspective view showing a semiconductor substrate for fabricating a spot size converter according to an eighteenth embodiment of the present invention, the semiconductor substrate being formed with a ridge prior to epitaxial growth.
Figure 48:
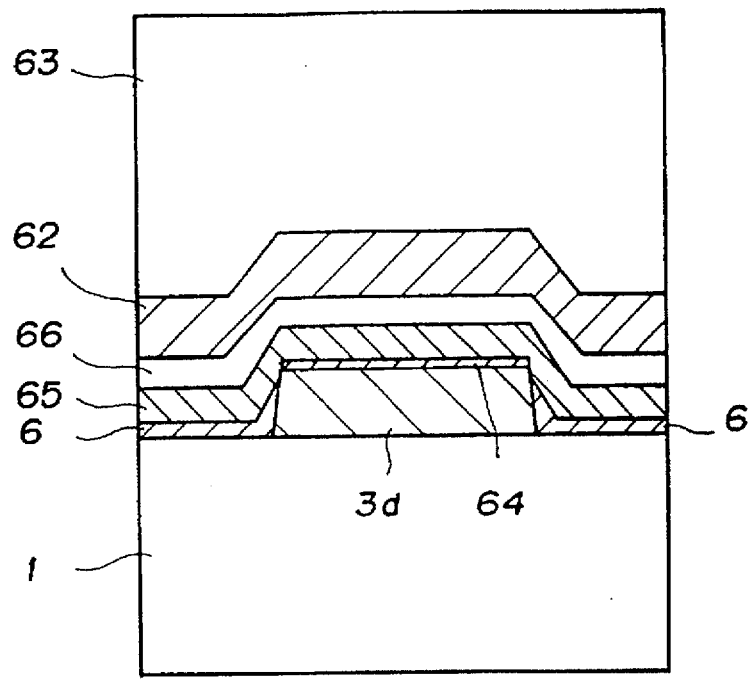
FIG. 48 is a schematic cross sectional view showing a front end of a spot size converter according to an eighteenth embodiment of the present invention, with a quantum well layer being shown on an enlarged scale.
Figure 49:
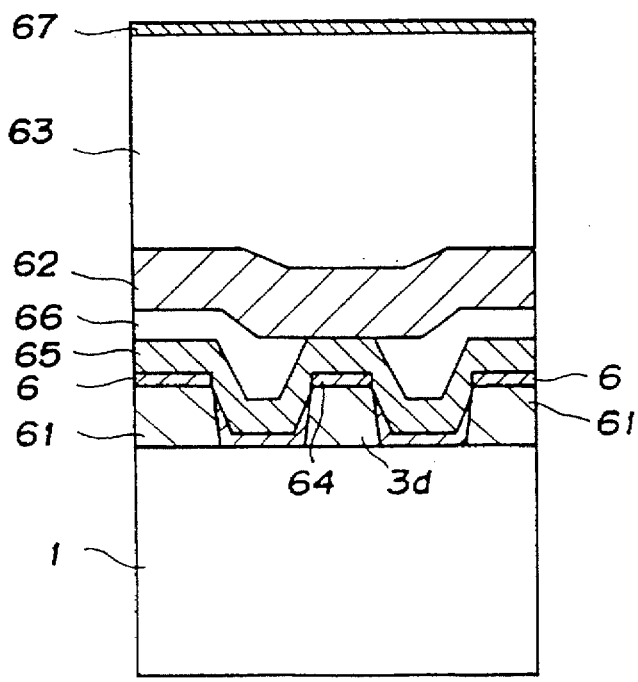
FIG. 49 is a schematic cross sectional view showing a rear end of a spot size converter according to an eighteenth embodiment of the present invention, with a quantum well layer being shown on an enlarged scale.

FIGS. 47 through 49 illustrate a spot size converter according to still another embodiment of the present invention. The device of the instant embodiment has a structure similar to that shown in FIGS. 44 through 46 except that in the instant embodiment, a ridge shape (ridge width and gap distance)-modulated structure was provided also on the rear end face of the device in addition to that on the front end face of the device, with the former being arranged in a direction opposite to the former (FIG. 47). FIG. 48 shows structures of the device on its front and rear end faces after epitaxial growth performed in the same manner as in the preceding embodiments. FIG. 49 is a cross sectional view showing a central region of the device where the ridge width and gap distance are relatively small. In FIG. 49, same or like structures are indicated by same references, and detailed description are omitted here.

Anti-reflection coating was provided on both end faces of the device having the above-described construction and p- and n-electrodes (not shown) were provide on both faces of the substrate. Upon injection of current to the electrode, a semiconductor amplifier having high coupling efficiency with optical fibers can be obtained.

Further, in the instant embodiment, when polarity of applied voltage is reversed, an optical modulator utilizing confined Stark effect can be realized.

In the instant embodiment, while the propagation of 1.5 μm light was explained taking an example of InGaAsP based materials, there may be used also other materials, for example, InAlGaAs based materials, or both of the InGaAsP based materials and InAlGaAs based materials. Further, in other wavelength regions such as 1.3 μm, similar effects can be obtained by selecting types of material and composition.

As described concretely in Embodiments 16 through 18, the present invention enables enlargement of spot size of the waveguide in an optical device by a simple fabrication process. As a result, there can be realized integration of semiconductor devices with high performance and high reliability.

The present invention has been described in detail with respect to an embodiment, and it will now be apparent from the foregoing to those skilled in the art that changes and modifications may be made without departing from the invention in its broader aspects, and it is the intention, therefore, in the appended claims to cover all such changes and modifications as fall within the true spirit of the invention.

What is claimed is:

1. An optical functional device comprising:
   a semiconductor substrate;
   an optical functional layer provided on said semiconductor substrate and selected from the group consisting of a light emitting layer, a light absorbing layer, and an optical waveguide layer;
   said optical functional layer comprising a multi-quantum well layer; and
   said semiconductor substrate being a nonplanar semiconductor substrate having a ridge and two grooves adjacent said ridge, said ridge having a ridge width of from 1 to 10 μm, a ridge height of from 1 μm to 5 μm, and a gap distance of from 1 μm to 10 μm.

2. The optical functional device as claimed in claim 1, wherein said ridge has an upper face and a side face; and
   wherein said ridge has a diffractive grating on at least one of said upper and side surfaces.

3. An optical functional device comprising:
   a nonplanar semiconductor substrate;
   a ridge provided on said nonplanar semiconductor substrate, said ridge having an upper face and a side face;
   an optical functional layer provided on said nonplanar semiconductor substrate and selected from the group consisting of a light emitting layer, a light absorbing layer, and an optical waveguide layer;
   an active layer formed in said optical functional layer and having a multi-quantum well structure, said active layer having a first portion and a second portion, said first portion being provided above said ridge and said second portion being provided above a portion of said semiconductor substrate other than said ridge;
   said first portion of said active layer having a composition different from a composition of said second portion of said active layer; and
   a diffractive grating provided on at least one of said upper face and said side face of said ridge.

4. The optical functional device as claimed in claim 1, wherein said ridge width is from 1 μm to 5 μm; and
   wherein said multi-quantum well structure comprises a monolithic crystal having different compositions in a direction of a cavity;
   said optical functional device having oscillating or detecting characteristics varying in a direction of said cavity.

5. The optical functional device as claimed in claim 4, wherein said upper face of said ridge has a diffractive grating whose pitch is varied in accordance with said composition of said crystal above said ridge;
   said optical functional device having a facet through which light transmits, and emitting a plurality of light beams at single longitudinal mode out of said facet or receiving a light beam or beams having a wavelength or wavelengths shorter than a predetermined wavelength through said facet.

6. The optical functional device as claimed in claim 4, wherein said ridge has provided therein an optical guide layer.

7. The optical functional device as claimed in claim 1, wherein said ridge width is from 1 μm to 5 μm;
   said ridge having a shape whose ridge width, ridge height or gap distance being varied in a transverse direction;
   said optical functional device having oscillating or detecting characteristics which vary in said transverse direction.

8. The optical functional device as claimed in claim 7, wherein said upper face of said ridge has a diffractive grating whose pitch is varied in accordance with said composition of said crystal above said ridge;
   said optical functional device emitting a light beam at single longitudinal mode or receiving a light beam or beams having a wavelength or wavelengths shorter than a predetermined wavelength in a direction parallel to said direction of cavity.

9. The optical functional device as claimed in claim 1, wherein said optical functional layer is a semiconductor light emitting layer; and wherein said grooves are formed thereon with a semiconductor thin film layer having a conductivity type different from that of said semiconductor substrate.

10. The optical functional device as claimed in claim 1, wherein said optical functional layer is a semiconductor light emitting layer; and wherein said ridge on said nonplanar semiconductor substrate has a ridge shape of anti-mesa structure.

11. The optical functional device as claimed in claim 1, wherein said optical functional layer is a semiconductor light emitting layer; and wherein said nonplanar semiconductor substrate has formed thereon a semiconductor buffer layer.

12. An integrated optical device comprising:

a nonplanar semiconductor substrate having a ridge shape;

a plurality of optical functional devices arranged on said nonplanar semiconductor substrate and selected from the group consisting of a light emitting device and a detecting device;

said plurality of optical functional devices being connected to each other operationally so that characteristics of said plurality of optical functional devices can be combined functionally;

said plurality of optical functional devices each comprising a part of a strained multi-quantum well layer formed on said monolithically;

at least a part of said plurality of optical functional devices having a composition or respective compositions different in composition from each other.

13. The integrated optical device as claimed in claim 12, wherein said nonplanar semiconductor substrate is provided with a ridge having a ridge width of from 1 to 10 μm, a ridge height of from 1 μm to 5 μm, and a gap distance of from 1 μm to 10 μm.

14. The integrated optical device as claimed in claim 12, wherein said ridge has an upper face and a side face; and wherein said ridge has a diffractive grating on at least one of said upper and side surfaces.

15. The integrated optical device as claimed in claim 14, wherein said diffractive grating has a period varying in accordance with a position at which said diffractive grating is arranged.

16. An integrated optical device comprising:

a nonplanar semiconductor substrate;

a ridge provided on said nonplanar semiconductor substrate, said ridge having an upper face and a side face;

a light emitting portion provided on said nonplanar semiconductor substrate and including an optical functional device;

a detecting portion provided on said nonplanar semiconductor substrate and including an optical device;

said light emitting portion and said detecting portion being arranged in parallel to and optically connected each other;

a semiconductor optical waveguide optically connected to said light emitting portion and said detecting portion, said optical waveguide including an optical functional device and having a common inputting and outputting portion connected to said optical functional device;

said optical functional devices being connected to each other operationally so that characteristics of said optical functional devices can be combined functionally;

said optical functional device in said light emitting portion having a light emitting device which emits light having a first wavelength and a detecting device which detects an output of said light emitting device;

said optical functional device in said detecting portion having a detecting device which detects said light having said first wavelength, a wavelength filter which absorbs said light having said first wavelength, and a detecting device which detects light having a second wavelength; and said integrated optical device having a function of emitting and detecting two light beams which have different wavelengths and which propagate in said common inputting and outputting portion.

17. An integrated optical device comprising:

a nonplanar semiconductor substrate;

a ridge provided on said nonplanar semiconductor substrate;

a light emitting portion which is provided on said nonplanar semiconductor substrate which exhibits a light emitting function and a detecting function;

a detecting portion which is provided on said nonplanar semiconductor substrate and which exhibits a detecting function;

a semiconductor optical waveguide which is optically connected to said light emitting portion and said detecting portion;

said light emitting portion having a light emitting device which emits light having a first wavelength and a reflector having a diffractive grating, said light emitting portion exhibiting a light emitting function and a function of detecting said light having said first wavelength;

said detecting portion having a wavelength filter which absorbs light having said first wavelength, and a detecting device which detects light having a second wavelength, said detecting portion exhibiting a function of detecting a wavelength filter which absorbs said light haven;

said integrated optical device exhibiting a function of emitting and detecting two light beams which have wavelengths differing from each other and which propagate in said common inputting and outputting portion.

18. An optical device comprising:

a nonplanar semiconductor substrate;

a ridge provided on said nonplanar semiconductor substrate;

an optical waveguide provided on said nonplanar semiconductor substrate;

a quantum well layer formed on said optical waveguide and having a multi-quantum well structure;

said ridge having a dimension varied from one end thereof toward another end thereof so that said quantum well layer has a composition or thickness which is varied form one end toward another end of said optical waveguide and a light wave propagating in said waveguide is converted of its spot size.

* * * * *